(12) United States Patent
Amaki et al.

(10) Patent No.: US 11,348,934 B2
(45) Date of Patent: *May 31, 2022

(54) MEMORY SYSTEM

(71) Applicant: Toshiba Memory Corporation, Tokyo (JP)

(72) Inventors: Takehiko Amaki, Yokohama (JP); Yoshihisa Kojima, Kawasaki (JP); Toshikatsu Hida, Yokohama (JP); Marie Grace Izabelle Angeles Sia, Yokohama (JP); Riki Suzuki, Yokohama (JP); Shohei Asami, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/182,879

(22) Filed: Feb. 23, 2021

(65) Prior Publication Data

US 2021/0183877 A1    Jun. 17, 2021

Related U.S. Application Data

(63) Continuation of application No. 16/684,123, filed on Nov. 14, 2019, now Pat. No. 10,964,712, which is a (Continued)

(30) Foreign Application Priority Data

Sep. 7, 2017  (JP) .............................. JP2017-172150

(51) Int. Cl.
*H01L 27/11556* (2017.01)
*G11C 16/08* (2006.01)
(Continued)

(52) U.S. Cl.
CPC .......... *H01L 27/11556* (2013.01); *G11C 7/04* (2013.01); *G11C 16/0483* (2013.01); (Continued)

(58) Field of Classification Search
CPC .......... H01L 27/1157; H01L 27/11582; H01L 27/11556; G11C 16/0483; G11C 16/16; (Continued)

(56) References Cited

U.S. PATENT DOCUMENTS 7,227,983 B1    10/2007  Om
8,060,797 B2    11/2011  Hida et al.
(Continued)

FOREIGN PATENT DOCUMENTS

JP    4489127    6/2010
JP    4606455    1/2011
(Continued)

*Primary Examiner* — Fernando Hidalgo
(74) *Attorney, Agent, or Firm* — Oblon, McClelland, Maier & Neustadt, L.L.P.

(57) ABSTRACT

According to one embodiment, a memory system includes a semiconductor memory and a controller. The semiconductor memory includes blocks each containing memory cells. The controller is configured to instruct the semiconductor memory to execute a first operation and a second operation. In the first operation and the second operation, the semiconductor memory selects at least one of the blocks, and applies at least one voltage to all memory cells contained in said selected blocks. A number of blocks to which said voltage is applied per unit time in the second operation is larger than that in the first operation.

18 Claims, 34 Drawing Sheets

Related U.S. Application Data continuation of application No. 16/052,238, filed on Aug. 1, 2018, now Pat. No. 10,529,730.

(51) Int. Cl.

| | | |
|---|---|---|
| *G11C 16/10* | (2006.01) | |
| *G11C 16/04* | (2006.01) | |
| *G11C 16/16* | (2006.01) | |
| *G11C 7/04* | (2006.01) | |
| *G11C 16/26* | (2006.01) | |
| *H01L 27/1157* | (2017.01) | |
| *H01L 27/11582* | (2017.01) | |

(52) U.S. Cl.
CPC ............ *G11C 16/08* (2013.01); *G11C 16/107* (2013.01); *G11C 16/16* (2013.01); *G11C 16/26* (2013.01); *H01L 27/1157* (2013.01); *H01L 27/11582* (2013.01)

(58) Field of Classification Search
CPC ........... G11C 7/04; G11C 16/26; G11C 16/08; G11C 16/107
USPC ...................................... 365/185.11
See application file for complete search history.

(56) References Cited

U.S. PATENT DOCUMENTS

| | | | |
|---|---|---|---|
| 8,156,381 B2 | 4/2012 | Tamura et al. | |
| 8,788,752 B2 | 7/2014 | Okamoto | |
| 9,773,553 B1 | 9/2017 | Tanzawa | |
| 10,026,483 B1* | 7/2018 | Shah | ............... G11C 29/028 |
| 10,665,278 B2 | 5/2020 | Park | |
| 10,734,396 B2 | 8/2020 | Kang | |
| 2006/0136769 A1 | 6/2006 | Kizer | |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2010/0214838 A1 | 8/2010 | Hishida et al. | |
| 2011/0284946 A1 | 11/2011 | Kiyotoshi | |
| 2012/0069663 A1 | 3/2012 | Itagaki et al. | |
| 2014/0006730 A1* | 1/2014 | Zain | ............... G06F 13/1694 |
| | | | 711/155 |
| 2014/0040680 A1 | 2/2014 | Takaku et al. | |
| 2015/0058550 A1 | 2/2015 | Mikami | |
| 2015/0357018 A1 | 12/2015 | Best | |
| 2016/0104533 A1 | 4/2016 | Tanzawa | |
| 2017/0255550 A1 | 9/2017 | Kim | |
| 2018/0114580 A1 | 4/2018 | Alrod | |
| 2018/0203642 A1 | 7/2018 | Sharma | |
| 2019/0018597 A1* | 1/2019 | Zhang | ............... G06F 3/0611 |
| 2019/0066771 A1* | 2/2019 | Binfet | ............... G11C 7/20 |
| 2019/0115080 A1 | 4/2019 | Watanabe | |
| 2019/0206457 A1 | 7/2019 | Park | |

FOREIGN PATENT DOCUMENTS

| | | |
|---|---|---|
| JP | 2011-128751 | 6/2011 |
| JP | 5531656 | 6/2014 |
| JP | 5605507 | 10/2014 |
| JP | 2015-41262 | 3/2015 |

* cited by examiner

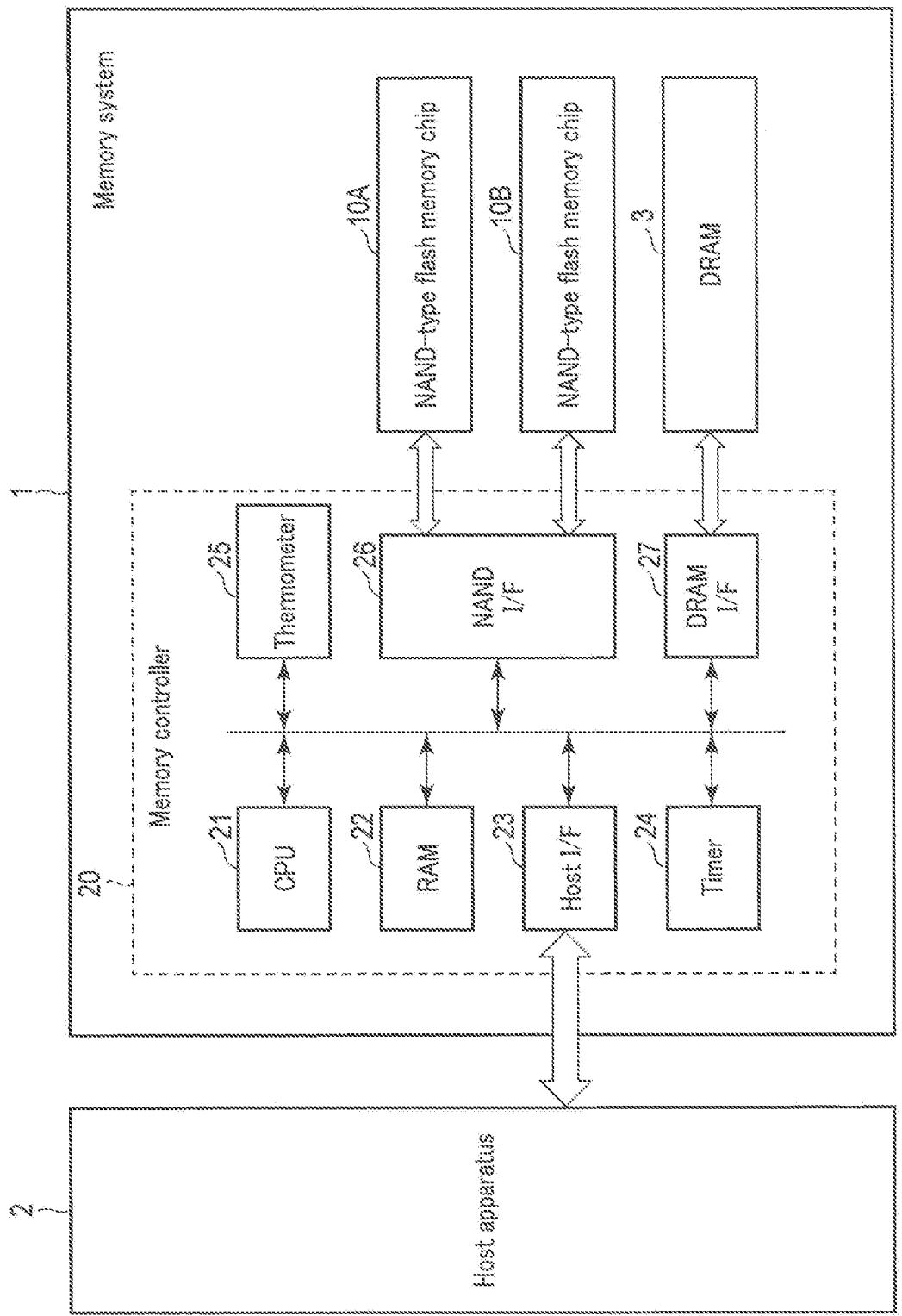
F I G. 1

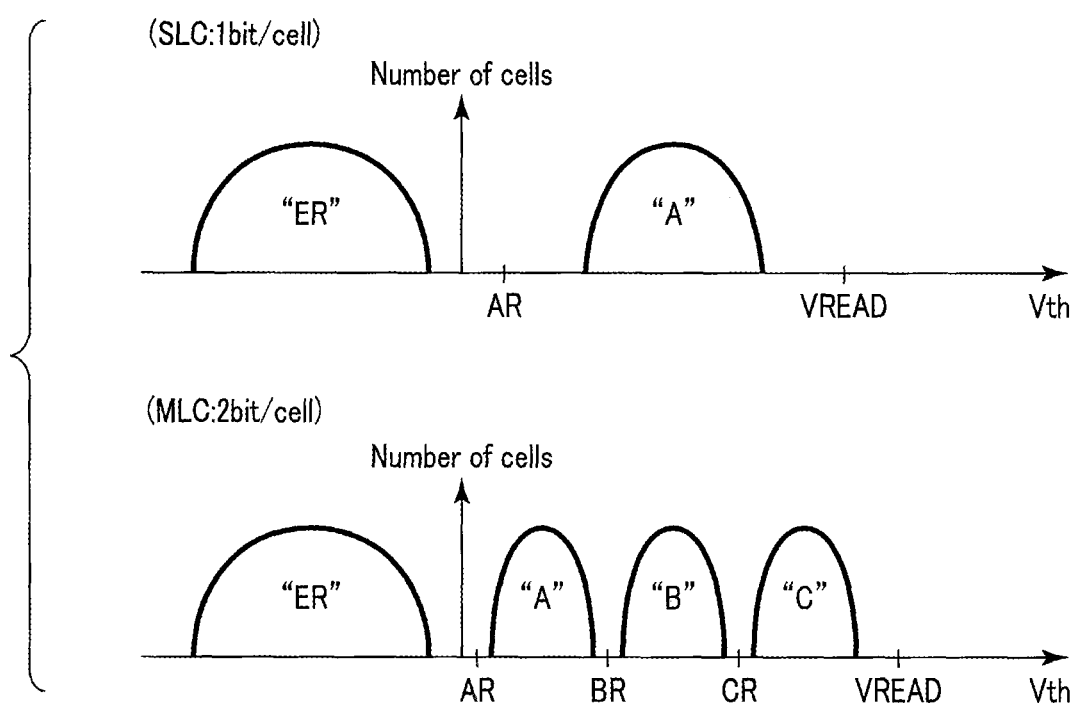
F I G. 4

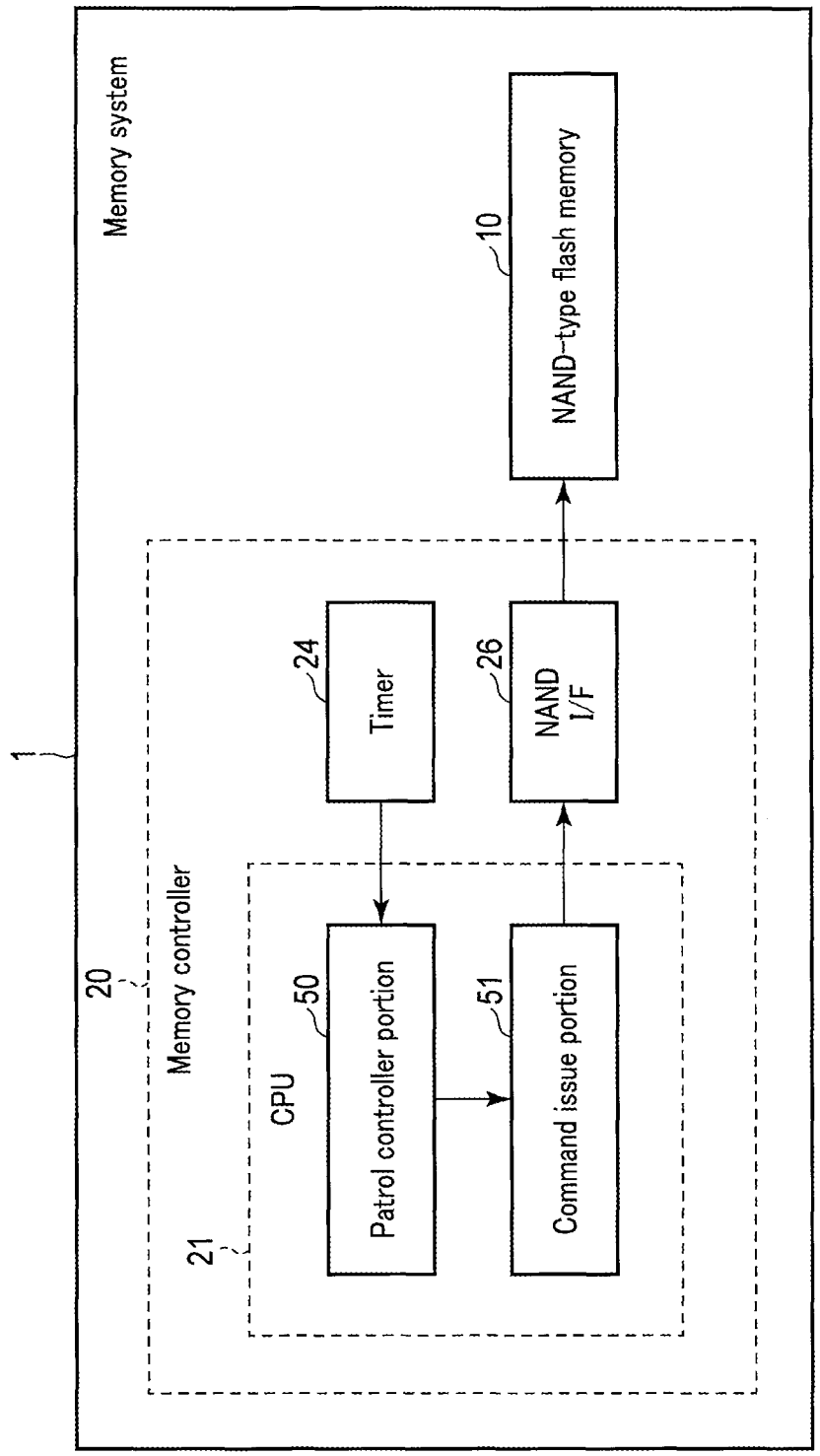
F I G. 6

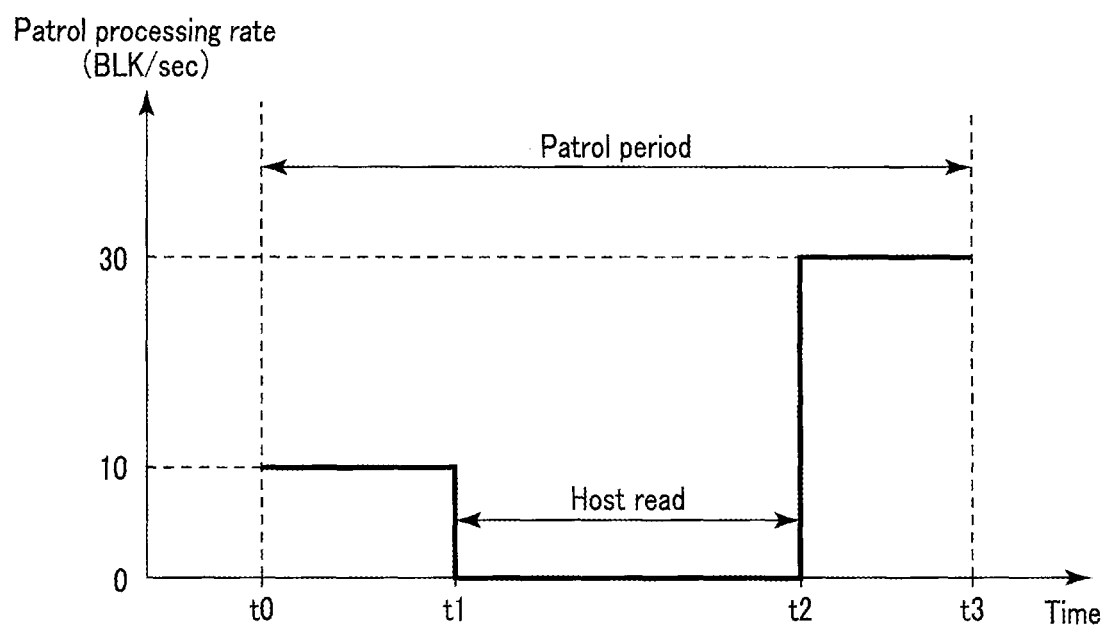
F I G. 8

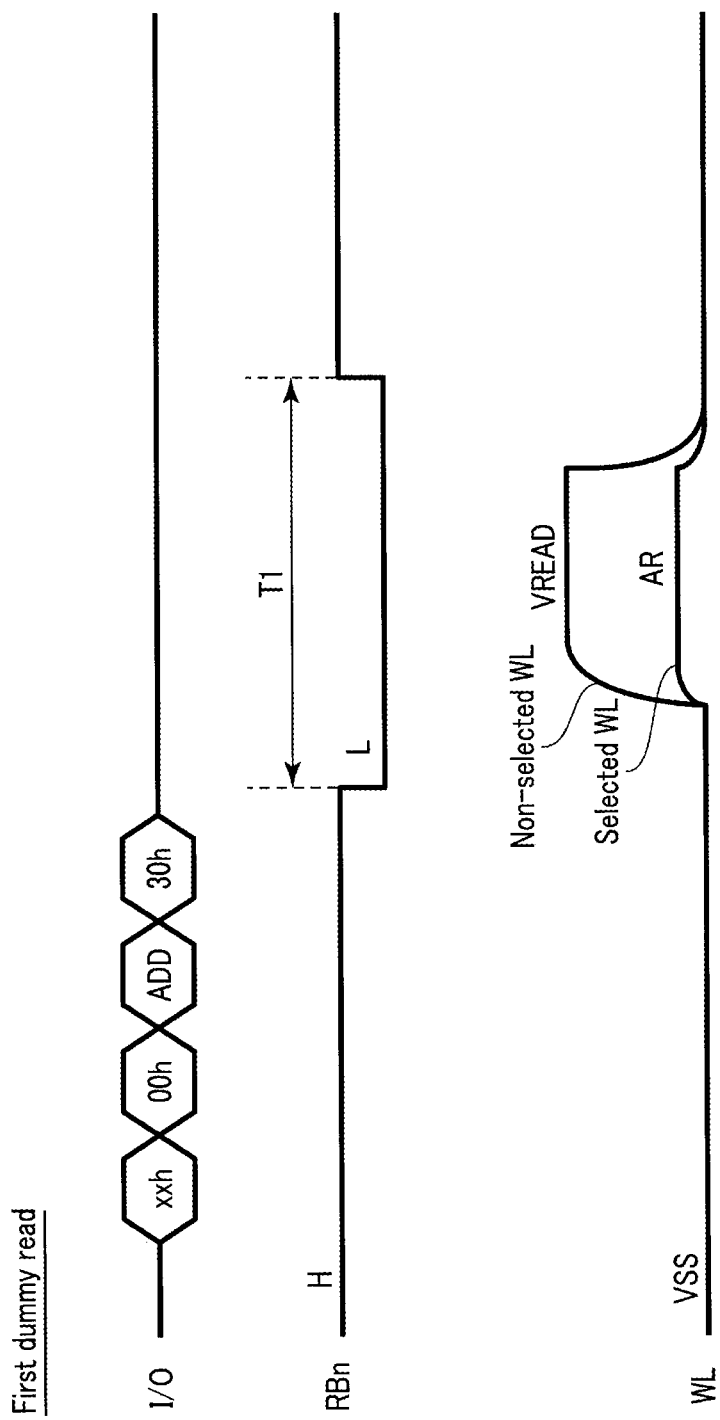
F I G. 9

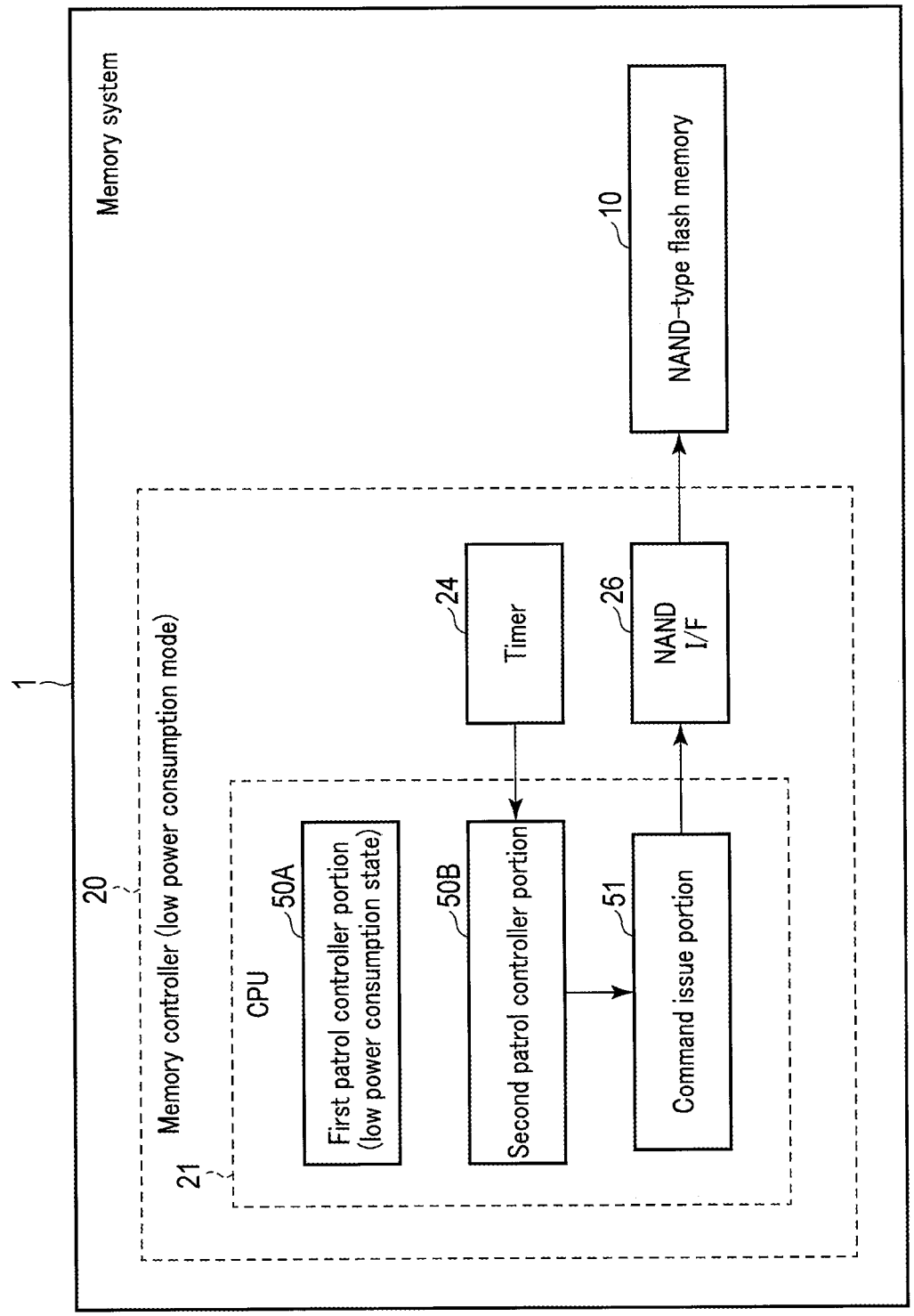
F I G. 13

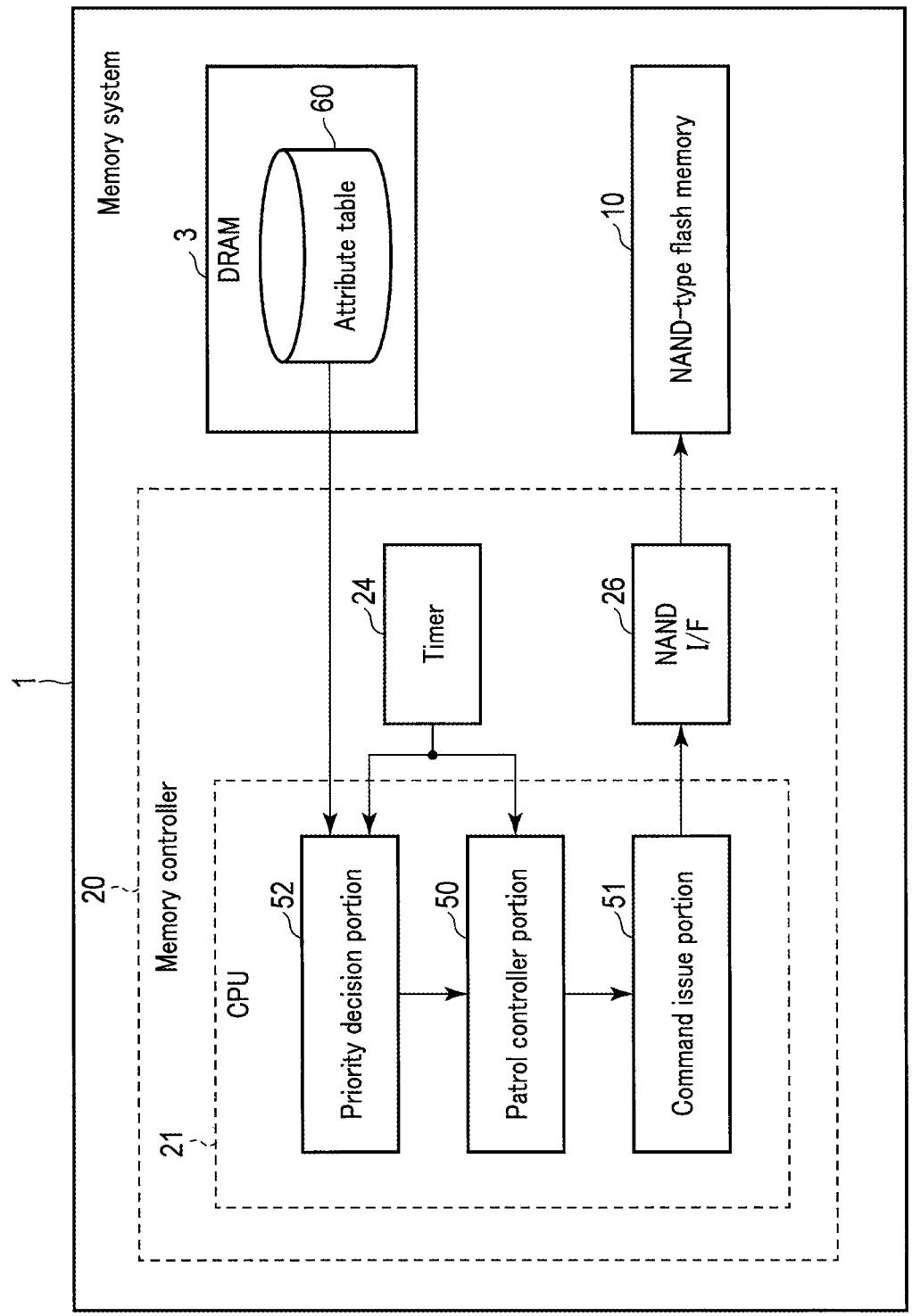
F I G. 20

| Block ID | Block state | Write method | Write/erase cycles | Read count | Last write time | Last access time | Read error count |
|---|---|---|---|---|---|---|---|
| 1 | Free | MLC | 305 | 250 | 01:00:00 | 11:00:00 | 10 |
| 2 | Active (with user data) | MLC | 310 | 115 | 10:00:00 | 20:00:00 | 5 |
| 3 | Active (with debug information) | SLC | 295 | 0 | 05:00:00 | 14:00:00 | 0 |
| ... | ... | ... | ... | ... | ... | ... | ... |

F I G. 21

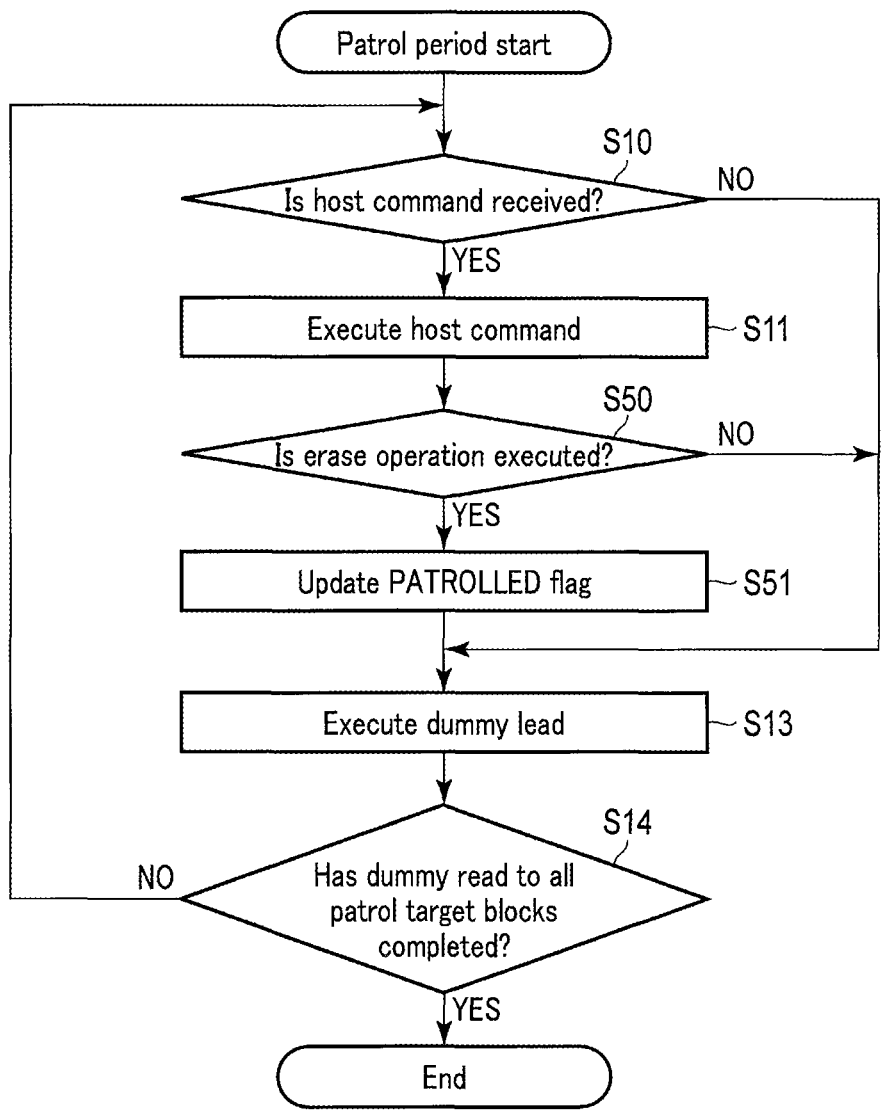
F I G. 25

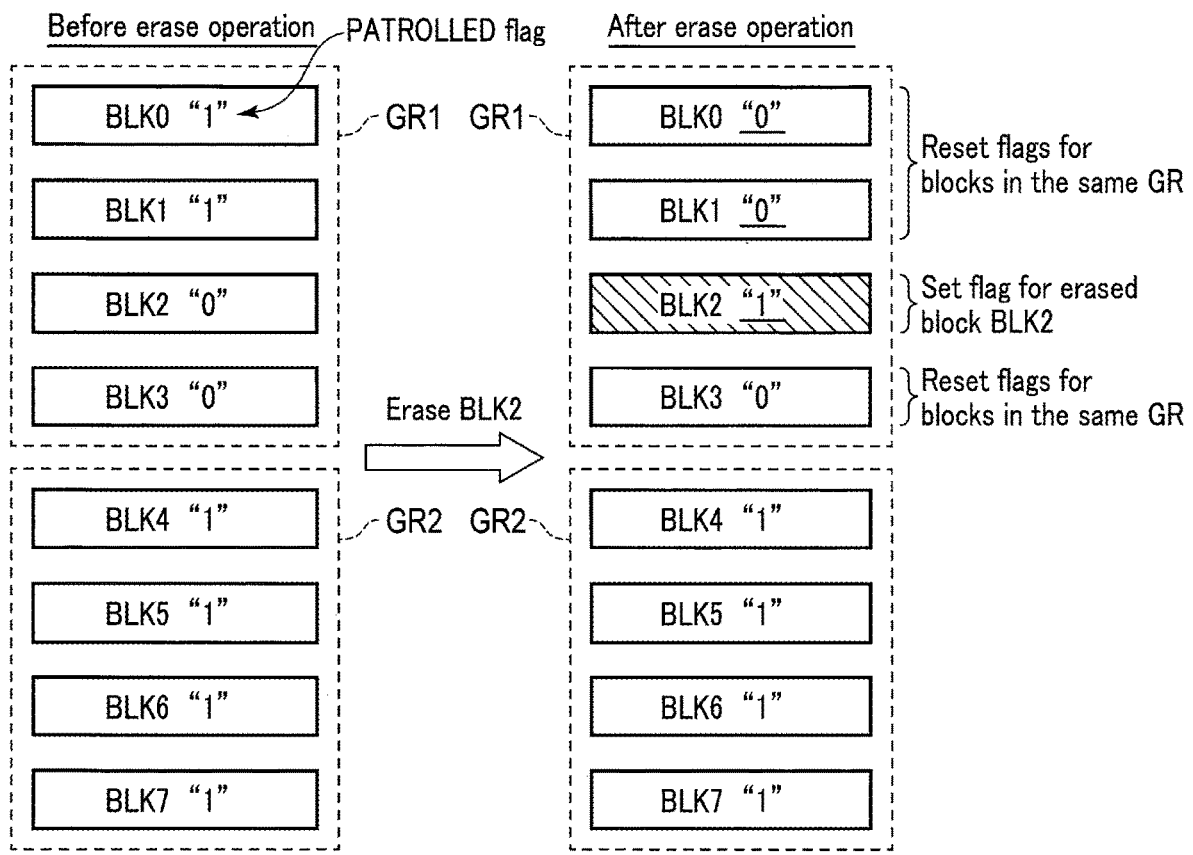
F I G. 26

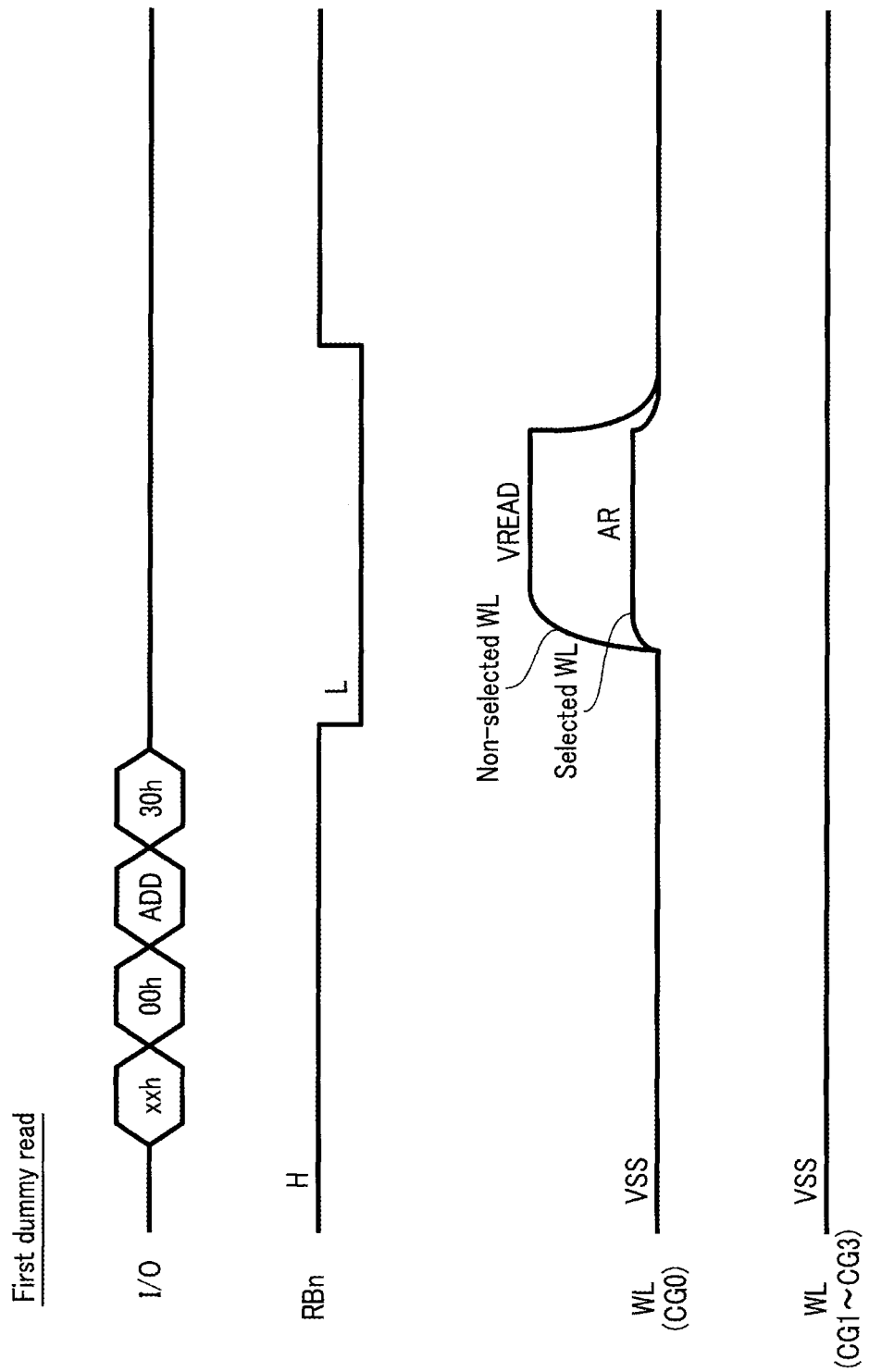
F I G. 27

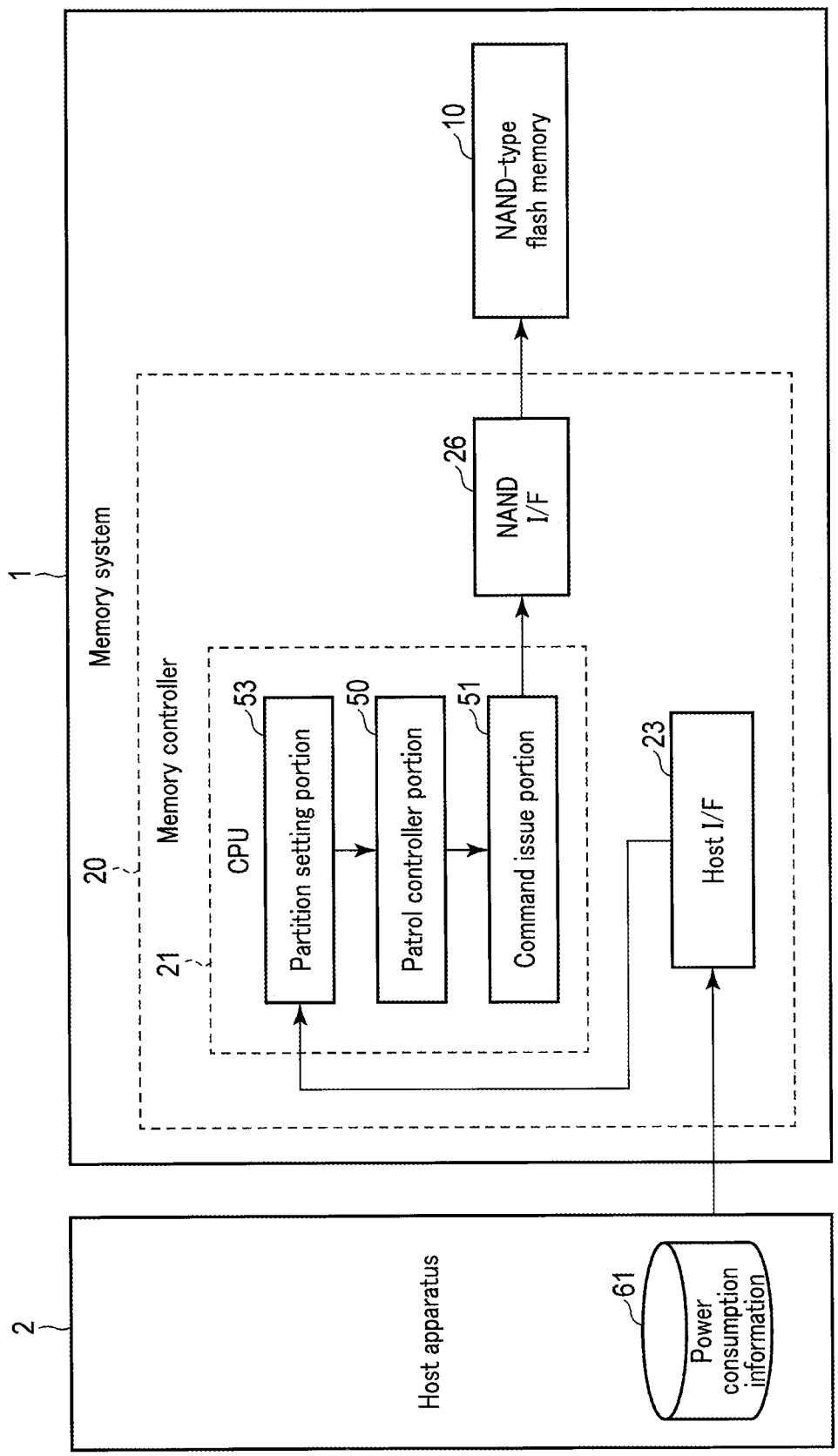
F I G. 30

| Partition ID | Physical block address |
|---|---|
| 1 | 0 |
| 1 | 1 |
| 1 | 2 |
| - | - |
| 1 | 63 |
| 2 | 64 |
| - | - |
| 2 | 127 |
| ⋮ | ⋮ |
| 16 | 960 |
| ⋮ | ⋮ |
| 16 | 1023 |

F I G. 31

Partition setting example (1024 blocks)

| Partition ID | Number of blocks selected at once | Power consumption during second dummy read |
|---|---|---|
| 128 | 8 | Low |
| 64 | 16 | ↓ |
| 32 | 32 | ↓ |
| 16 | 64 | High |

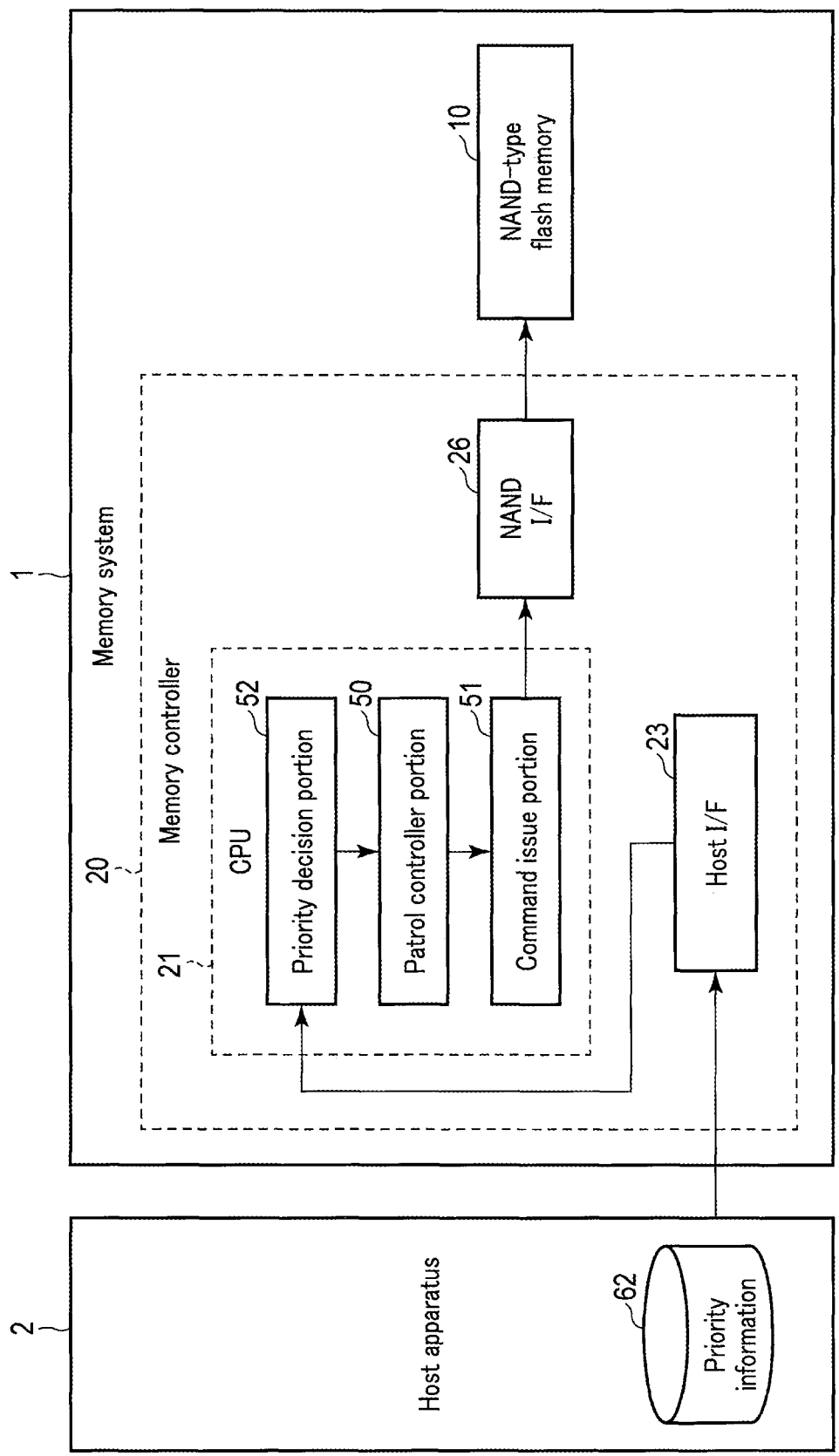
F I G. 34

Table in accordane with first priority information

| Logical block address (LBA) | Physical block address (PBA) | Partition ID |
|---|---|---|
| 11 | 1012 | 16 |
| 12 | 1013 | 16 |
| 13 | 64 | 2 |
| 14 | 65 | 2 |
| 15 | 66 | 2 |
| 16 | 990 | 16 |
| 17 | 256 | 5 |
| 18 | 70 | 2 |
| 19 | 16 | 1 |
| 20 | 17 | 1 |

Table in accordance with second priority information

| Logical block address (LBA) | Physical block address (PBA) | Partition ID |
|---|---|---|
| 100 | 200 | 4 |
| 101 | 201 | 4 |
| 102 | 202 | 4 |
| 103 | 203 | 4 |
| 104 | 204 | 4 |
| 105 | 71 | 2 |
| 106 | 72 | 2 |
| 107 | 73 | 2 |
| 108 | 900 | 15 |
| 109 | 901 | 15 |

FIG. 37

Priority setting in accordance with first priority information

| Partition ID | Corresponding PBA | Patrol priority | PATROLLED flag |
|---|---|---|---|
| 1 | 0-63 | 2 | 0⇒1 |
| 2 | 64-127 | 4 | 0⇒1 |
| 3 | 128-191 | 0 | 0 |
| 4 | 192-255 | 0 | 0 |
| 5 | 256-319 | 1 | 0⇒1 |
| ⋮ | ⋮ | ⋮ | - |
| 14 | 832-895 | 0 | 0 |
| 15 | 896-959 | 0 | 0 |
| 16 | 960-1023 | 3 | 0⇒1 |

FIG. 38

Priority setting in accordance with second priority information

| Partition ID | Corresponding PBA | Patrol priority | PATROLLED flag |
|---|---|---|---|
| 1 | 0-63 | 0 | 1 |
| 2 | 64-127 | 3 | 1 |
| 3 | 128-191 | 0 | 0 |
| 4 | 192-255 | 5 | 0⇒1 |
| 5 | 256-319 | 0 | 1 |
| ⋮ | - | ⋮ | - |
| 14 | 832-895 | 0 | 0 |
| 15 | 896-959 | 2 | 0⇒1 |
| 16 | 960-1023 | 0 | 1 |

FIG. 39

Dummy read setting in accordance with first priority information

| Partition ID | Corresponding PBA | Patrol priority | Dummy read method |
|---|---|---|---|
| 1 | 0-63 | 2 | First dummy read |
| 2 | 64-127 | 4 | Second dummy read |
| 3 | 128-191 | 0 | - |
| 4 | 192-255 | 0 | - |
| 5 | 256-319 | 1 | First dummy read |
| - | ⋮ | ⋮ | ⋮ |
| 14 | 832-895 | 0 | - |
| 15 | 896-959 | 0 | - |
| 16 | 960-1023 | 3 | Second dummy read |

FIG. 40

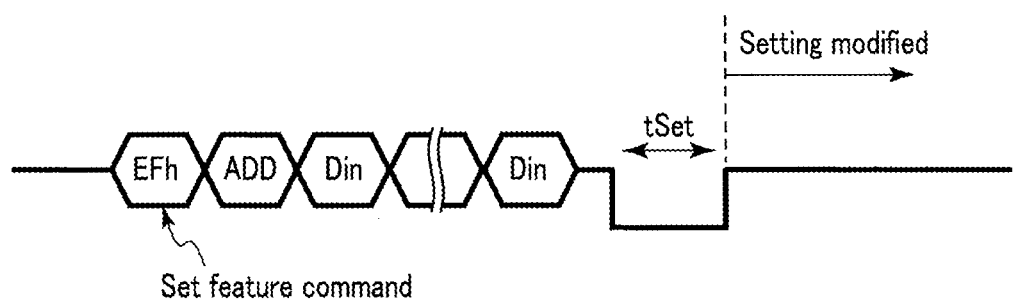
F I G. 41

MEMORY SYSTEM

CROSS-REFERENCE TO RELATED APPLICATIONS

This application is a continuation of U.S. application Ser. No. 16/684,123 filed Nov. 14, 2019. U.S. application Ser. No. 16/684,123 is a continuation of U.S. Ser. No. 16/052,238, filed on Aug. 1, 2018, which is based upon and claims the benefit of priority from Japanese Patent Application No. 2017-172150, filed Sep. 7, 2017, the entire contents of which are incorporated herein by reference.

FIELD

Embodiments described herein relate generally to a memory system.

BACKGROUND

A NAND-type flash memory is known in which memory cells are stacked in three dimensions.

BRIEF DESCRIPTION OF THE DRAWINGS

FIG. 1 is a block diagram showing an example constitution of a memory system according to a first embodiment;

FIG. 4 is a diagram showing an example of threshold voltage distribution of memory cell transistors contained in the NAND-type flash memory and read voltages for each state according to the first embodiment;

FIG. 6 is a block diagram showing a detailed example constitution of a processor contained in a memory controller according to the first embodiment;

FIG. 8 is a diagram showing an example of transition of a patrol processing rate in a patrol period of the memory system according to the first embodiment;

FIG. 9 is a diagram showing an example of each of a command sequence and a waveform of a first dummy read in the memory system according to the first embodiment;

FIG. 13 is a block diagram showing a detailed example constitution of a processor contained in a memory controller according to a second embodiment;

FIG. 20 is a block diagram showing a detailed example constitution of a memory system according to a fourth embodiment;

FIG. 21 is a table showing an example of attribute information of each of blocks in a memory system according to the fourth embodiment;

FIG. 25 is a flow chart showing an example of a patrol operation in a memory system according to the fifth embodiment;

FIG. 26 is a diagram showing an example of a managing method of a PATROLLED flag in the patrol operation of the memory system according to the fifth embodiment;

FIG. 27 is a diagram showing an example of each of a command sequence and a waveform of a first dummy read in the memory system according to the fifth embodiment;

FIG. 30 is a block diagram showing detailed example constitution of a memory system and a host apparatus in a sixth embodiment;

FIG. 31 is a table showing an example of a relation between partition IDs and physical block addresses in a memory system according to the sixth embodiment;

FIG. 34 is a block diagram showing detailed example constitution of a memory system and a host apparatus in a seventh embodiment;

FIG. 37 is a table showing an example of second priority information in the memory system according to the seventh embodiment;

FIG. 38 is a table showing an example of priority setting based on priority information shown in FIG. 34;

FIG. 39 is a table showing an example of priority setting based on priority information shown in FIG. 35;

FIG. 40 is a table showing an example of dummy read setting based on priority information in the memory system according to the seventh embodiment; and FIG. 41 is a diagram showing an example of a command sequence which is used for setting modification of a NAND-type flash memory in each of the first through seventh embodiments.

DETAILED DESCRIPTION

Figure 2:
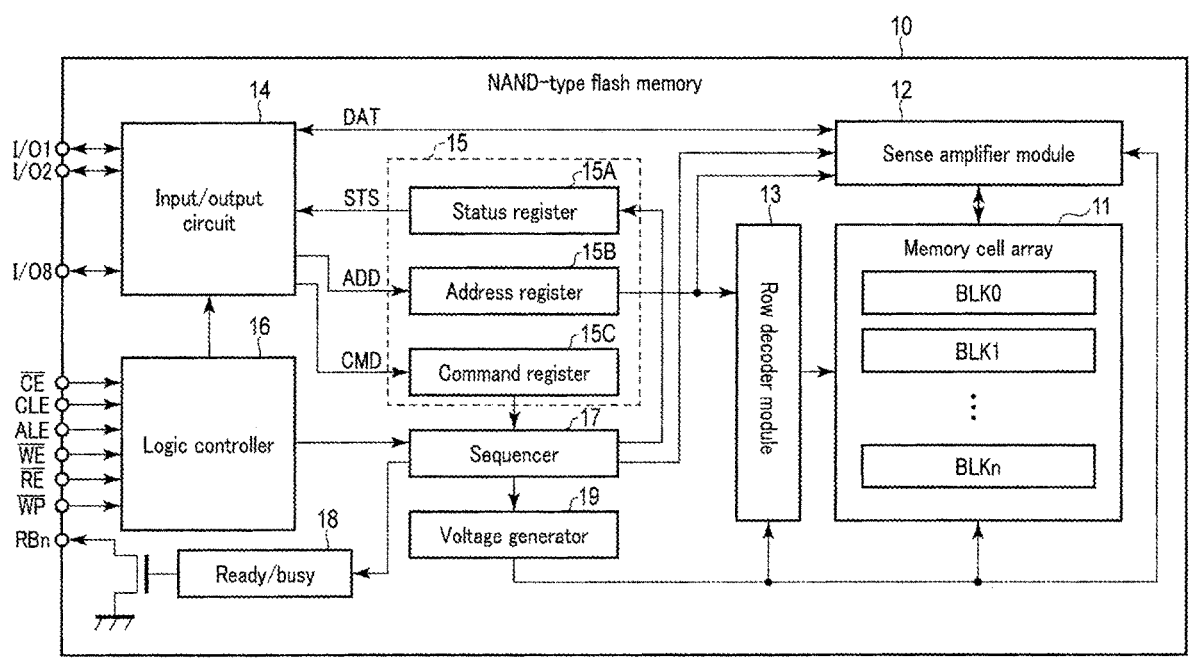
FIG. 2 is a block diagram showing an example constitution of a NAND-type flash memory according to the first embodiment.

A memory system of an embodiment includes a semiconductor memory and a controller. The semiconductor memory includes blocks each containing memory cells. The controller is configured to instruct the semiconductor memory to execute a first operation and a second operation. In the first operation and the second operation, the semiconductor memory selects at least one of the blocks, and applies at least one voltage to all memory cells contained in said selected blocks. A number of blocks to which said voltage is applied per unit time in the second operation is larger than that in the first operation.

Hereinafter, description will be made as to embodiments with reference to the drawings. The drawings are schematic, and the relationship between a thickness and a planar dimension, the ratio between thicknesses of the respective layers, or the like are different from those in actual cases. It is to be noted that in the following description, constitutional elements having about the same function and constitution are denoted with the same reference sign, and redundant description is avoided. A numeral after a character constituting the reference sign and a character after a numeral constituting the reference sign are referred to with the reference sign including the same character and numeral, and are used in distinguishing elements having similar constitutions from each other. When the elements denoted with the reference signs including the same character or numeral do not have to be distinguished from each other, these elements are referred to with the reference sign only including the same character or the same numeral.

[1] First Embodiment

Hereinafter, description will be made as to a memory system according to a first embodiment.

[1-1] Constitution

[1-1-1] Constitution of Memory System 1

FIG. 1 is a block diagram showing an example constitution of a memory system 1 according to the first embodiment. As shown in FIG. 1, the memory system 1 comprises NAND-type flash memory chips 10A and 10B, a DRAM (dynamic random access memory) 3, and a memory controller 20.

The NAND-type flash memory chips 10A and 10B are nonvolatile memory which are capable of storing data in non-volatile manner. The NAND-type flash memory chips 10A and 10B may operate independently of each other. It is to be noted that the number of NAND-type flash memory chips 10 of the memory system 1 is not limited to that in this example, and any number may be applied.

The DRAM 3 is a volatile memory which is capable of temporarily storing the data. It is to be noted that the number of the volatile memory chips of the memory system 1 is not limited to that in this example, and any number may be applied. Furthermore, a type of an volatile memory of the memory system 1 is not limited to the DRAM. For example, the memory system 1 may comprise an SRAM (static random access memory) or the like as the volatile memory.

The memory controller 20 is an IC (integrated circuit) such as SoC (System-on-a-chip), FPGA (Field programmable gate array) or ASIC (Application specific integrated circuit), and may instruct the NAND-type flash memory 10 and the DRAM 3 to execute various operations. Furthermore, the memory controller 20 may execute an operation based on a command from an external host apparatus 2 and an operation irrespective of the command from the host apparatus 2. Description will be made later as to a constitution of the memory controller 20.

[1-1-2] Constitution of NAND-Type Flash Memory 10

FIG. 2 is a block diagram showing an example constitution of the NAND-type flash memory 10 according to the first embodiment. As shown in FIG. 2, the NAND-type flash memory 10 comprises a memory cell array 11, a sense amplifier module 12, a row decoder module 13, an input/output circuit 14, a register 15, a logic controller 16, a sequencer 17, a ready/busy controller 18, and a voltage generator 19.

The memory cell array 11 includes blocks BLK0 through BLKn (n is an integer of 0 or more). A block BLK is a set of nonvolatile memory cells associated with bit lines and word lines, and is, for example, an erase unit of data. For example, a multi-level cell (MLC) mode is applied to the NAND-type flash memory 10, whereby data of 2 bit or more may be stored in each memory cell.

The sense amplifier module 12 may output data DAT read from the memory cell array 11 to the memory controller 20 via the input/output circuit 14. Furthermore, the sense amplifier module 12 may transfer, to the memory cell array 11, the data to be written DAT received from the memory controller 20 via the input/output circuit 14.

The row decoder module 13 may select a block BLK of a target of various operations, on the basis of a block address held in an address register 15B. In addition, the row decoder module 13 may transfer, to the selected block BLK, a voltage supplied from the voltage generator 19.

For example, input/output signals I/O with 8-bit width (I/O1 through I/O8) may be transmitted and received between the input/output circuit 14 and the memory controller 20. For example, the input/output circuit 14 transfers, to the sense amplifier module 12, the data to be written DAT included in the input/output signal I/O received from the memory controller 20, and transmits the read data DAT transferred from the sense amplifier module 12, as the input/output signal I/O to the memory controller 20.

The register 15 includes a status register 15A, the address register 15B, and a command register 15C. The status register 15A holds, for example, status information STS of the sequencer 17 and transfers this status information STS to the input/output circuit 14 on the basis of an instruction of the sequencer 17. The address register 15B holds address information ADD transferred from the input/output circuit 14. For example, column addresses and block addresses included in the address information ADD are used in the sense amplifier module 12 and the row decoder module 13, respectively. The command register 15C holds a command CMD transferred from the input/output circuit 14.

The logic controller 16 may control the input/output circuit 14 and the sequencer 17 on the basis of various control signals received from the memory controller 20. As the various control signals, there are used, for example, a chip enable signal /CE, a command latch enable signal CLE, an address latch enable signal ALE, a write enable signal /WE, a read enable signal /RE, and a write protect signal /WP. The signal /CE is a signal to enable the NAND-type flash memory 10 to operate. The signal CLE is a signal to notify the input/output circuit 14 that a signal to be input into the NAND-type flash memory 10 is a command CMD. The signal ALE is a signal to notify the input/output circuit 14 that a signal to be input into the NAND-type flash memory 10 is the address information ADD. Each of the signals/WE and/RE is, for example, a signal to instruct the input/output circuit 14 to execute input and output of the input/output signal I/O. The signal /WP is, for example, a signal to adjust the NAND-type flash memory 10 in a protective state when a power source turns on or off.

The sequencer 17 may control an operation of the whole NAND-type flash memory 10 on the basis of the command CMD held in the command register 15C. For example, the sequencer 17 controls the sense amplifier module 12, the row decoder module 13, the voltage generator 19 and the like to execute various operations such as a write operation and a read operation.

The ready/busy controller 18 may generate a ready/busy signal RBn on the basis of an operation state of the sequencer 17. The signal RBn is a signal to notify the memory controller 20 whether the NAND-type flash memory 10 is in a ready state to receive the command from the memory controller 20 or in a busy state where the memory does not receive the command.

The voltage generator 19 may generate an appropriate voltage on the basis of control of the sequencer 17, and may supply the generated voltage to a selected portion of the memory cell array 11, the sense amplifier module 12, the row decoder module 13 or the like. For example, the voltage generator 19 applies the appropriate voltage to each of a signal line corresponding to the selected word line and a signal line corresponding to a non-selected word line on the basis of a page address held in the address register 15B.

[1-1-3] Constitution of Memory Cell Array 11

Figure 3:
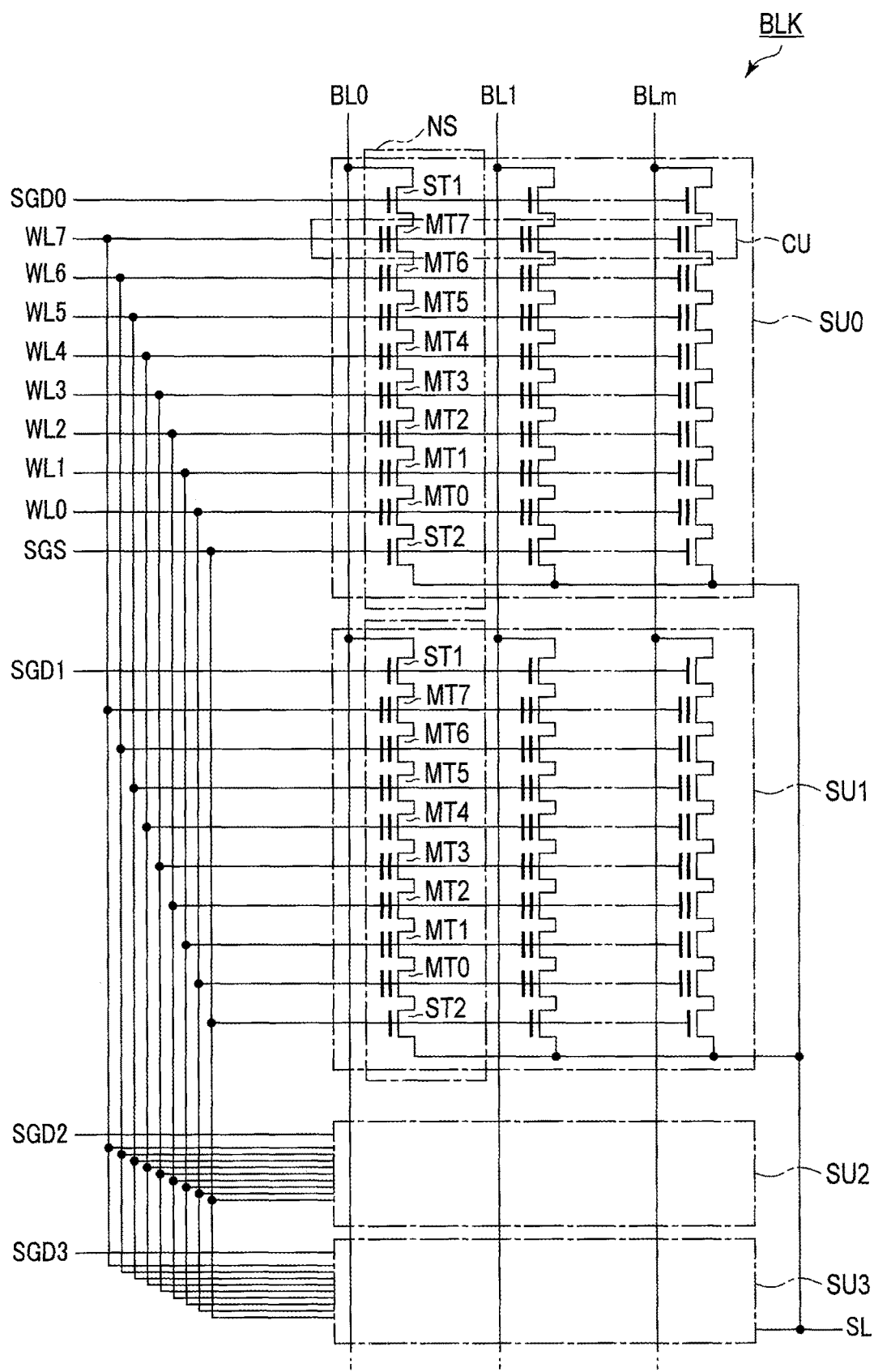
FIG. 3 is a circuit diagram showing an example constitution of a memory cell array contained in the NAND-type flash memory according to the first embodiment.

FIG. 3 is a circuit diagram showing an example constitution of the memory cell array 11 contained in the NAND-type flash memory 10 according to the first embodiment, and shows a detailed circuit constitution of a block BLK in the memory cell array 11. As shown in FIG. 3, the block BLK includes, for example, four string units SU0 through SU3.

Each string unit SU includes NAND strings NSs which are associated with bit lines BL0 through BLm (m is an integer of 0 or more), respectively. Each NAND string NS includes, for example, memory cell transistors MT0 through MT7 and selection transistors ST1 and ST2.

A memory cell transistor MT comprises a control gate and a charge storage layer, and may store data in non-volatile manner. The memory cell transistors MT0 through MT7 contained in each NAND string NS are connected in series between a source of the selection transistor ST1 and a drain of the selection transistor ST2. Control gates of memory cell transistors MT (MT0 through MT7) aligned in a same word line WL with different bit lines are connected to common word line WL (WL0 through WL7, respectively). It is to be noted that in the following description, a group of memory cell transistors MTs connected to the common word line WL in each string unit SU in a block BLK is referred to as a "cell unit CU". In a case where 1-bit data is stored in each memory cell transistor MT, a set of 1-bit data to be or being stored in a cell unit CU is referred to as a "page". In a case where 2-bit data is stored in a memory cell transistor MT, a cell unit CU stores 2-page data.

The selection transistors ST1 and ST2 are used to select a string unit SU during various operations. A drain of the selection transistor ST1 contained in the NAND string NS corresponding to the same column address is connected to its corresponding common bit line BL. Gates of the selection transistors ST1 contained in the string units SU0 through SU3 are connected to common selection gate lines SGD0 through SGD3, respectively. In the same block BLK, a source of the selection transistor ST2 is connected to a common source line SL, and a gate of the selection transistor ST2 is connected to a common selection gate line SGS.

In the above-mentioned circuit constitution of the memory cell array 11, the word lines WL0 through WL7 are disposed every block BLK. The bit lines BL0 through BLm are shared among the blocks BLKs. The source line SL is shared among the blocks BLKs. It is to be noted that the number of the string units SUs contained in each block BLK and the numbers of the memory cell transistors MTs and the selection transistors ST1 and ST2 contained in each NAND string NS are merely examples, and any number may be applied. The numbers of the word lines WLs and the selection gate lines SGD and SGS are altered on the basis of the numbers of the memory cell transistors MTs and the selection transistors ST1 and ST2.

Furthermore, in the above-mentioned circuit constitution of the memory cell array 11, a threshold voltage distribution is formed by threshold voltages of a cell unit CU, for example, as shown in FIG. 4. FIG. 4 shows threshold voltage distribution of the memory cell transistors MTs and read voltages for each state, in a case where each memory cell transistor MT stores 1-bit data or 2-bit data, each ordinate indicates the number of the memory cell transistors MTs, and each abscissa indicates a threshold voltage Vth of the memory cell transistor MT. As shown in FIG. 4, the memory cell transistors MTs form threshold voltage distribution on the basis of a number of bits of data stored in a memory cell transistor MT. Hereinafter, description will be made as to each of a single-level cell (SLC) mode in which the 1-bit data is stored in one memory cell transistor MT and a multi-level cell (MLC) mode in which the 2-bit or more data is stored in one memory cell transistor MT, as an example of a write mode.

In the SLC mode, the memory cell transistors MTs form two lobes of threshold voltage distribution. These two lobes of threshold voltage distribution are referred to as an "ER"-state and an "A"-state in order of threshold voltage from lower to higher. In the SLC mode, for example, "1" data and "0" data are assigned to the "ER"-state and the "A"-state, respectively.

In the MLC mode, the memory cell transistors MTs form four lobes of threshold voltage distribution. These four lobes are referred to as an "ER"-state, an "A"-state, a "B"-state and a "C"-state in order of threshold voltage from lower to higher.

In the MLC mode, for example, "11 (upper/lower)" data, "01" data, "00" data and "10" data are assigned to the "ER"-state, the "A"-state, the "B"-state and the "C"-state, respectively.

Then, in the above-mentioned threshold voltage distribution, each read voltage is set between the lobes of threshold voltage distribution adjacent to each other. For example, a read voltage AR is set between a highest threshold voltage in the "ER"-state and a lowest threshold voltage in the "A"-state, and this read voltage is for use in an operation of judging whether the threshold voltage of the memory cell transistor MT is included in the lobe of threshold voltage distribution of the "ER"-state or in the lobe of threshold voltage distribution of the "A"-state or states with higher threshold voltage. When the read voltage AR is applied to the memory cell transistors MTs, the memory cell transistors corresponding to the "ER"-state are turned on, and the memory cell transistors corresponding to the "A"-state, the "B"-state and the "C"-state are turned off. The other read voltages are also similarly set, a read voltage BR is set between the lobe of threshold voltage distribution of the "A"-state and the lobe of threshold voltage distribution of the "B"-state, and a read voltage CR is set between the lobe of threshold voltage distribution of the "B"-state and the lobe of threshold voltage distribution of the "C"-state. When the read voltage BR is applied to the memory cell transistors MTs, the memory cell transistors corresponding to the "ER"-state and the "A"-state are turned on, and the memory cell transistors corresponding to the "B"-state and the "C"-state are turned off. When the read voltage CR is applied to the memory cell transistors MTs, the memory cell transistors corresponding to the "ER"-state, the "A"-state and the "B"-state are turned on, and the memory cell transistors corresponding to the "C"-state are turned off. In each write mode, a read pass voltage VREAD is set to a voltage higher than the highest threshold voltage in the lobe with highest threshold voltage. Specifically, when the read pass voltage VREAD is applied to the gate of the memory cell transistor MT, the memory cell transistor turns on irrespective of the data being stored.

It is to be noted that the number of bits of data being or to be stored in one memory cell transistor MT and the assignment of the data (i.e., encoding) to the states of threshold voltage in the memory cell transistor MT described above are merely examples, and the present invention is not limited to this example. For example, the data of 3 bits or more may be stored in a memory cell transistor MT, and other various assignments of the data may be applied to the lobes of threshold voltage distribution. Furthermore, each of the read voltages and the read pass voltage may be changed or not changed, depending on the write modes.

For example, as shown in FIG. 4, the read pass voltage VREAD in the MLC mode may be set to be higher than the read pass voltage VREAD in the SLC mode. Similarly, for example, a read pass voltage VREAD in a triple-level cell (TLC) mode in which 3-bit data is stored in one memory cell transistor MT may be set to be higher than the read pass voltage VREAD in the MLC mode, and a read pass voltage VREAD in a quadruple-level cell (QLC) mode in which 4-bit data is stored in one memory cell transistor MT may be set to be higher than the read pass voltage VREAD in the TLC mode.

Figure 5:
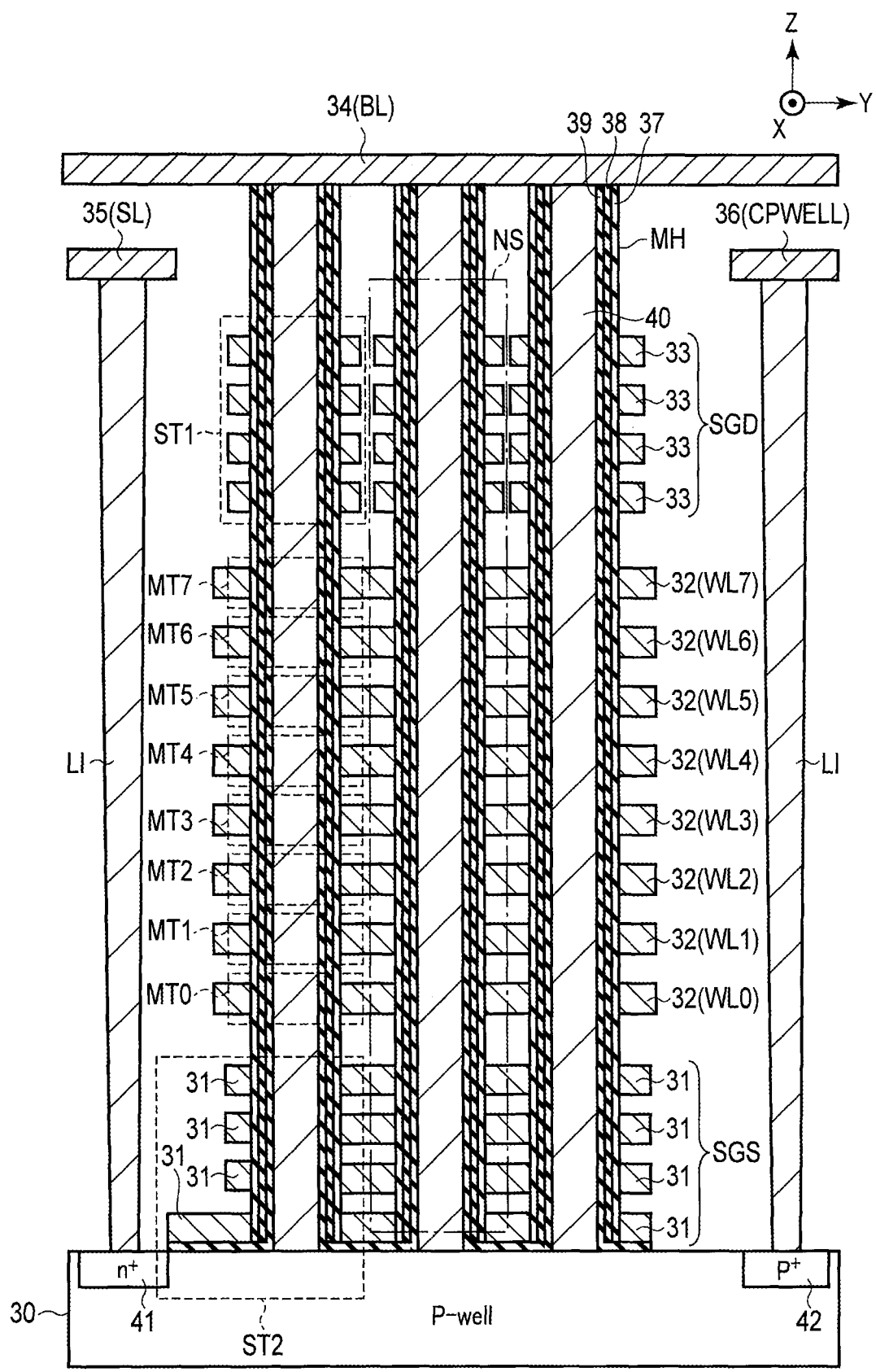
FIG. 5 is a sectional view showing an example of a structure of the memory cell array contained in the NAND-type flash memory according to the first embodiment.

Next, description will be made as to a sectional structure of the memory cell array 11 with reference to FIG. 5. FIG. 5 is a sectional view showing an example of the structure of the memory cell array 11 contained in the NAND-type flash memory 10 according to the first embodiment, and shows a cross section of the memory cell array 11 in which showing an interlayer insulator film is omitted, and an X-axis, a Y-axis and a Z-axis. As shown in FIG. 5, the NAND-type flash memory 10 comprises a p-type well region 30, conductors 31 through 36, semiconductor pillars MHs, and contact plugs LIs.

The p-type well region 30 is formed in the surface area of a semiconductor substrate. On the p-type well region 30, for example, the conductors 31 of four layers, the conductors 32 of eight layers and the conductors 33 of four layers are stacked in order with the interlayer insulator films. Each of the conductors 31 through 33 is disposed, for example, in the form of a plate which spreads in the X-direction and the Y-direction. The conductors 31 and 33 function as the selection gate lines SGS and SGD, respectively, and the conductor 32 functions as the word line WL. Each of stacked conductors 32 is assigned to one word line WL. For each of the selection gate lines SGS and SGD, either of the conductor disposed in one layer or the conductors stacked in multiple layers as shown in FIG. 5 may be assigned.

The semiconductor pillars MHs are formed to extend from an upper surface of the conductor 33 to an upper surface of the p-type well region 30. That is, the semiconductor pillars MHs are disposed to pass the conductors 31 through 33 along the Z-direction. Each semiconductor pillar MH includes a block insulator film 37, an insulator film (a charge storage layer) 38, a tunnel oxide film 39, and a semiconductor material 40. The semiconductor material 40 includes a conductive material and is formed in a pillar shape. Then, the tunnel oxide film 39, the insulator film 38 and the block insulator film 37 are formed in order, to cover a side surface of the semiconductor material 40.

The conductor 34 is formed in a layer above the conductor 33 and the semiconductor pillar MH. The conductor 34 functions as the bit line BL and is connected to the corresponding semiconductor pillar MH. It is to be noted that a contact plug made of a conductive material may be formed between the conductor 34 and the semiconductor pillar MH.

The conductors 35 and 36 are formed in a wire layer between the conductor 33 and the conductor 34. The conductor 35 functions as the source line SL, and is connected to an n+-type impurity diffusion region 41 formed in the surface of the well region 30 via the contact plug LI. The conductor 36 functions as a well line CPWELL, and is connected to a p+-type impurity diffusion region 42 formed in the surface of the well region 30 via the contact plug LI. Each contact plug LI is disposed in the form of a plate which spreads, for example, in the X-direction and the Z-direction.

In the above-mentioned structure of the memory cell array 11, one semiconductor pillar MH corresponds to one NAND string NS. Specifically, an intersection point of the conductor 31 and the semiconductor pillar MH corresponds to the selection transistor ST2, an intersection point of the conductor 32 and the semiconductor pillar MH corresponds to the word line WL, and an intersection point of the conductor 33 and the semiconductor pillar MH corresponds to the selection transistor ST1. The conductor 31 of the lowermost layer and the tunnel oxide film 39 are disposed in the vicinity of the n+-type impurity diffusion region 41, and hence, when the selection transistor ST2 is turned on, a current path is formed between the NAND string NS and the n+-type impurity diffusion region 41.

Furthermore, the above-mentioned structures of the memory cell arrays 11 are arranged in the X-direction. For example, one string unit SU is constituted of a set of NAND strings NSs arranged in the X-direction. Additionally, in a case where the string units SUs are arranged in the same block BLK, the conductor 33 corresponding to the selection gate line SGD is separated between the string units SUs.

It is to be noted that a way to constitute the memory cell allay 11 may be employed other than the above-mentioned constitution. Other constitutions of the memory cell array 11 are described in U.S. patent application Ser. No. 12/407,403 entitled "Three Dimensional Stacked Nonvolatile Semiconductor Memory" filed on Mar. 19, 2009, U.S. patent application Ser. No. 12/406,524 entitled "Three Dimensional Stacked Nonvolatile Semiconductor Memory" filed on Mar. 18, 2009, U.S. patent application Ser. No. 12/679,991 entitled "Nonvolatile Semiconductor Storage Device and Manufacturing Method of the Same" filed on Mar. 25, 2010, and U.S. patent application Ser. No. 12/532,030 entitled "Semiconductor Memory and Manufacturing Method of the Same" filed on Mar. 23, 2009. These patent applications are incorporated by reference herein in their entireties.

[1-1-4] Constitution of Memory Controller 20

Here, turning back to FIG. 1, description is made as to a constitution of the memory controller 20. As shown in FIG. 1, the memory controller 20 comprises a processor (CPU: central processing unit) 21, an internal memory (RAM: random access memory) 22, a host interface circuit 23, a timer 24, a thermometer 25, a NAND interface circuit 26, and a DRAM interface circuit 27.

The processor 21 may control operations of the whole memory controller 20. For example, the processor 21 issues a read command in response to a read command received from the host apparatus 2, and transmits the issued command to the NAND interface circuit 26. Furthermore, the processor 21 may execute a patrol operation on the basis of count of the timer 24. For example, the patrol operation is executed irrespective of the command from the host apparatus 2, and this operation contributes to decrease of read errors in the memory system 1. Description will be made as to the patrol operation later in detail. It is to be noted that the processor 21 may execute various types of processing to manage a memory space of the NAND-type flash memory 10, for example, wear leveling and the like. The processor 21 may instruct the NAND-type flash memory 10 to execute an erase operation on the basis of an instruction for garbage collection from the host apparatus 2. Alternatively, for example, when the number of free blocks is smaller than a predetermined number, the processor 21 may execute the garbage collection irrespective of the instruction from the host apparatus 2, and may instruct the NAND-type flash memory 10 to execute the erase operation.

The internal memory 22 is a memory area for use as a work area of the processor 21. For example, in the internal memory 22, there stored parameters to manage the NAND-type flash memory 10, various management tables, and the like. For example, the internal memory 22 holds a queue (command queue) of the commands received from the host apparatus 2. Furthermore, the internal memory 22 holds an address conversion table to convert, to a physical address of the block BLK, a logical address associated with the data stored in the block BLK. This address conversion table is stored, for example, in the semiconductor memory 10, and is loaded into the internal memory 22 when the memory system 1 starts up. As the internal memory 22, for example, a volatile memory such as the SRAM (static random access memory) is used.

The host interface circuit 23 is connected to the host apparatus 2, to manage communication between the memory system 1 and the host apparatus 2. For example, the host interface circuit 23 controls the transfer of the data, command and address between the memory system 1 and the host apparatus 2. The host interface circuit 23 supports a communication interface standard such as SATA (serial advanced technology attachment), SAS (serial attached SCSI), or PCIe (PCI express) (registered trademark). That is, an example of the host apparatus 2 connected to the memory system 1 is a computer or the like including the interface of SATA, SAS, PCIe or the like.

The timer 24 may measure a time associated with any operation of the memory system 1. For example, the timer 24 measures a period in which the patrol operation of one cycle is executed. "The patrol operation of one cycle" corresponds to execution of a dummy read (described later) once for each block BLK targeted for the patrol operation. In the following description, the period in which this patrol operation of one cycle is executed will be referred to as a patrol period.

The thermometer 25 may measure a system temperature of the memory system 1. Specifically, the thermometer 25 measures the temperature of a region where the thermometer 25 is disposed, thereby indirectly measuring a temperature of the whole memory controller 20 or a temperature of the NAND-type flash memory 10. The measured temperature is referred to by the processor 21, for example, during the patrol operation.

The NAND interface circuit 26 is connected to the NAND-type flash memory chips 10A and 10B, and manages communication between the memory controller 20 and the NAND-type flash memory 10. The NAND interface circuit 26 is constituted on the basis of a NAND interface standard.

The DRAM interface circuit 27 is connected to the DRAM 11, and manages communication between the memory controller 20 and the DRAM 3. The DRAM interface circuit 27 is constituted on the basis of a DRAM interface standard. It is to be noted that the constitution of the DRAM interface circuit 27 is not limited to this example, and may be changed on the basis of a type of volatile memory of the memory system 1.

It is to be noted that the above-mentioned constitution of the memory controller 20 is merely an example, and is not limited to this example. For example, the timer 24 and the thermometer 25 do not have to be contained in the memory controller 20, and may externally be connected to the memory controller 20. Furthermore, the thermometer 25 may be contained in the NAND-type flash memory 10.

In the above-mentioned memory controller 20, the processor 21 loads a program associated with the patrol operation into the internal memory 22, and executes the program. FIG. 6 shows a detailed example constitution of the processor 21 during the patrol operation. As shown in FIG. 6, the processor 21 functions as a patrol controller portion 50 and a command issue portion 51 during the patrol operation.

The patrol controller portion 50 sets the patrol period during which the patrol target block contained in the memory cell array 11 is visited at least once. Patrol periods are set repeatedly one after another, and, for example, a patrol period and its subsequent patrol period may be successive or continuous. Then, the patrol controller portion 50 instructs the command issue portion 51 to execute a dummy read to a block BLK targeted for the patrol operation every patrol period. In the following description, the block BLK of the target for the patrol operation will be referred to as a patrol target block. It is to be noted that the patrol target blocks may be all the blocks BLKs in the memory cell array 11, or some blocks out of all the blocks BLKs. Furthermore, in the present description, the dummy read operation is, for example, an operation in which the read voltage or the read pass voltage is applied to a word line WL described with reference to FIG. 4, or the like. Specifically, in the dummy read operation of the present description, data output operation (i.e., data transfer) from the NAND-type flash memory 10 via the NAND interface circuit 26 may not be performed. In a normal read operation, in contrast, the data output operation is required for ECC (error correcting code) decoding.

The command issue portion 51 issues a command and an address concerning the dummy read on the basis of the command from the patrol controller portion 50. The issued command and address are transferred to the NAND-type flash memory 10 via the NAND interface circuit 26.

It is to be noted that there has been described above the example where the command issue portion 51 issues the command and address concerning the dummy read, but the present invention is not limited to this example. For example, commands and addresses associated with various operations may be issued by the NAND interface circuit 26 on the basis of the control of the processor 21.

[1-2] Operation

In the memory system 1 according to the first embodiment, the memory controller 20 spontaneously executes (i.e., not driven by the host) the patrol operation. Hereinafter, description will be made as to an example where the memory controller 20 executes the patrol operation to one NAND-type flash memory 10.

In the patrol operation, the dummy read is executed to the patrol target block every patrol period. Specifically, while the processor 21 executes the operation based on the command from the host apparatus 2 in each patrol period, the patrol controller portion 50 instructs the NAND-type flash memory 10 to execute the dummy read via the command issue portion 51. Then, in the first embodiment, the patrol controller portion 50 changes a patrol processing rate on the basis of remaining time of the patrol period. The patrol processing rate indicates the number of the blocks BLKs being patrolled per unit time.

Figure 7:
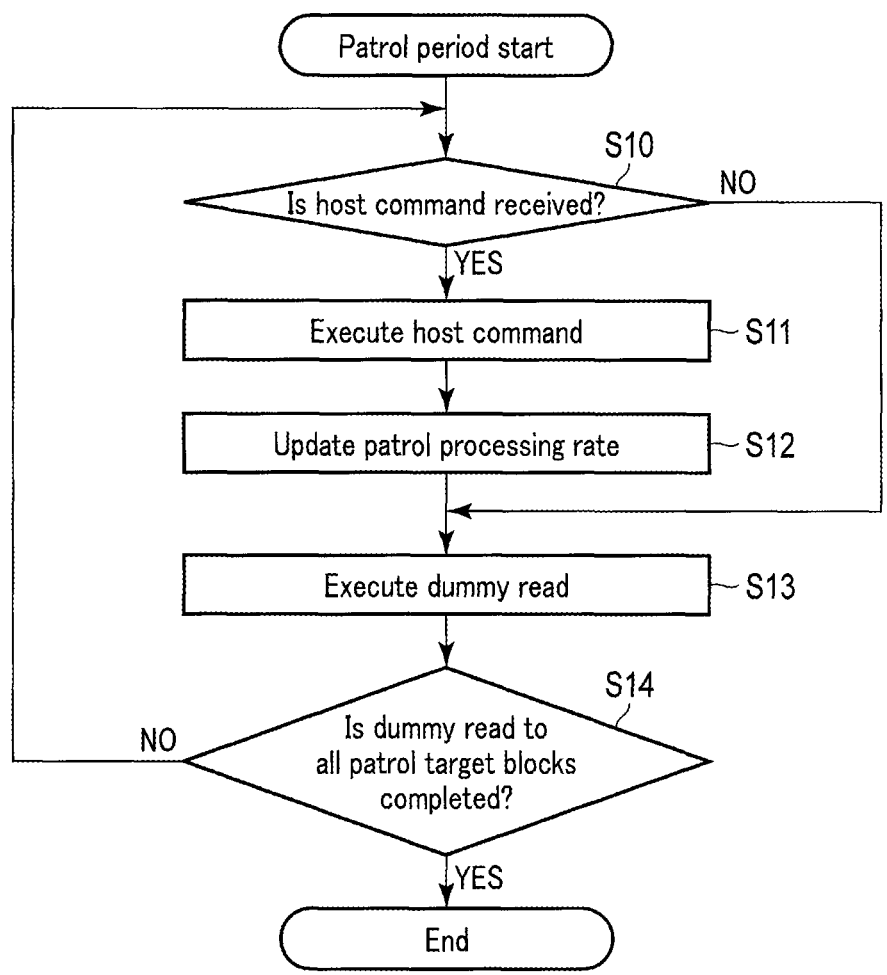
FIG. 7 is a flow chart showing an example of a patrol operation in a memory system according to the first embodiment.

Hereinafter, description will be made as to the patrol period in detail with reference to FIG. 7. FIG. 7 is a flow chart showing an example of the patrol operation in the memory system according to the first embodiment, and shows an operation example of the memory system 1 in the patrol period.

As shown in FIG. 7, when the patrol period starts, the processor 21 initially determines whether or not the memory controller 20 has received a command from the host apparatus 2 (step S10).

When the memory controller 20 has received a command from the host apparatus 2 (YES in the step S10), the processor 21 executes an operation based on the command from the host apparatus 2 (step S11). Examples of the operation based on the command from the host apparatus 2 include the read operation and the write operation.

When the operation based on the command from the host apparatus 2 ends, the patrol controller portion 50 updates the patrol processing rate (step S12). Specifically, the patrol controller portion 50 updates the patrol processing rate so that the dummy read to the patrol target block is completed in the patrol period on the basis of the remaining time of the patrol period.

Then, the patrol controller portion 50 executes the dummy read on the basis of the updated patrol processing rate (step S13). Specifically, the patrol controller portion 50 transmits a command for the dummy read to the command issue portion 51, and on the basis of the command, the command issue portion 51 issues the command and the address. Then, the command issue portion 51 transmits the issued command and address to the NAND-type flash memory 10 via the NAND interface circuit 26, and the NAND-type flash memory 10 executes the dummy read on the basis of its received command and address.

When the memory controller 20 has not received a command from the host apparatus 2 (NO in the step S10), the patrol controller portion 50 executes the dummy read in the step S13 on the basis of a predetermined patrol processing rate. When this patrol processing rate is updated in the step S12, the updated patrol processing rate is applied, and when the operation in the step S12 is not executed, a patrol processing rate calculated on the basis of the length of the patrol period is applied.

When the dummy read in the step S13 ends, the patrol controller portion 50 determines whether or not the dummy read to all the patrol target blocks is completed (step S14).

When the dummy read to all the patrol target blocks is not completed (NO in the step S14), the processor 21 goes back to the operation of the step S10, and repeatedly executes the operations of the steps S10 through S14.

When the dummy read to all the patrol target blocks is completed (YES in the step S14), the processor 21 ends the patrol operation in the patrol period. When the patrol period ends and the next patrol period begins, the patrol controller portion 50 executes the above operations of the steps S10 through S14 again.

FIG. 8 shows an example of the transition of the patrol processing rate in the above-mentioned patrol period. FIG. 8 shows the example in a case where host read is executed in the middle of the patrol period in the patrol operation described with reference to FIG. 7. In FIG. 8, the ordinate indicates the patrol processing rate, and the abscissa indicates time.

As shown in FIG. 8, the patrol period starts at time t0, and the patrol controller portion 50 sets the patrol processing rate to, e.g., 10 (BLKs/sec). This patrol processing rate is set to a value at which the dummy read to all the patrol target blocks can be completed, when the operation based on the command of the host apparatus 2 is not executed in the patrol period. When the host read is executed at time t1, the dummy read based on the patrol operation does not progress due to the operation based on the command of the host apparatus 2, and hence, the patrol processing rate is 0 (BLKs/sec). When the host read ends at time t2, the patrol controller portion 50 sets the patrol processing rate to, e.g., 30 (BLKs/sec). Then, the dummy read to all the patrol target blocks is completed by time t3, and the patrol period ends. In this way, the patrol processing rate at the time t2 through t3 after the host read is executed is set to be higher than the patrol processing rate at the time t0 through t1 before the host read is executed.

To change the patrol processing rate, a method changing the priority to execute the dummy read over the host read, or a method changing the number of blocks BLKs being selected (i.e., activated) in one execution of the dummy read may be employed. Hereinafter, description will be made as to a first dummy read in which one block BLK is selected (i.e., activated) and a second dummy read in which a plurality of blocks BLKs are selected (i.e., activated).

Initially, description will be made in detail as to the first dummy read with reference to FIG. 9. FIG. 9 shows examples of a command sequence and a waveform of the first dummy read, and shows commands in the input/output signal I/O, a waveform of the ready/busy signal RBn and a waveform of the word line WL.

As shown in FIG. 9, the memory controller 20 initially issues a command "xxh" to transmit the command to the NAND-type flash memory 10, and the NAND-type flash memory 10 holds the received command "xxh" in the command register 15C. The command "xxh" is a command to execute the operation of the SLC mode. Next, the memory controller 20 issues a command "00h" to transmit the command to the NAND-type flash memory 10, and the NAND-type flash memory 10 holds the received command "00h" in the command register 15C. The command "00h" corresponds to an address input reception command for reading, and also to instruct the NAND-type flash memory 10 to execute the reading of the data. Next, the memory controller 20 transmits the address information ADD to the NAND-type flash memory 10, and the NAND-type flash memory 10 holds the received address information ADD in the address register 15B. This address information ADD designates an address of the target for the first dummy read and, for example, the word line WL (e.g., the word line WL7 shown in FIG. 5) disposed in an uppermost layer of the block BLK is selected. The word line WL to be selected in the first dummy read is not limited to this example, and another word line WL may be selected. Next, the memory controller 20 transmits a command "30h" to the NAND-type flash memory 10, and the NAND-type flash memory 10 holds the received command "30h" in the command register 15C. The command "30h" is a command for the sequencer 17 to execute the first dummy read on the basis of the preceding command CMD and address information ADD. When the command "30h" is held in the command register 15C, the sequencer 17 changes the ready/busy signal RBn from an "H"-level to an "L"-level and holds, while executing the first dummy read.

In the first dummy read, the row decoder module 13 applies the read voltage AR to the selected word line WL, and applies the read pass voltage VREAD to the non-selected word line WL. Then, the voltage of the selected word line WL rises, for example, from a ground voltage VSS up to the read voltage AR, and the voltage of the non-selected word line WL rises, for example, from the ground voltage VSS to the read pass voltage VREAD. Then, the row decoder module 13 applies the voltages for a predetermined time, and lowers the voltages of the selected and non-selected word lines WLs down to the ground voltage VSS. Then, the sequencer 17 changes the ready/busy signal RBn from the "L"-level to the "H"-level, to notify the memory controller 20 of the end of the first dummy read. It is to be noted that in the following description, a period in which the ready/busy signal RBn has the "L"-level during the first dummy read will be referred to as a period T1.

A command set to execute the above-mentioned first dummy read is similar to, for example, a command set to execute the read operation of the SLC mode. That is, the operation of the NAND-type flash memory 10 in the first dummy read is similar to the read operation of the SLC mode. It is to be noted that the data read by the NAND-type flash memory 10 in the first dummy read may be or does not have to be transferred to the memory controller 20.

Figure 10:
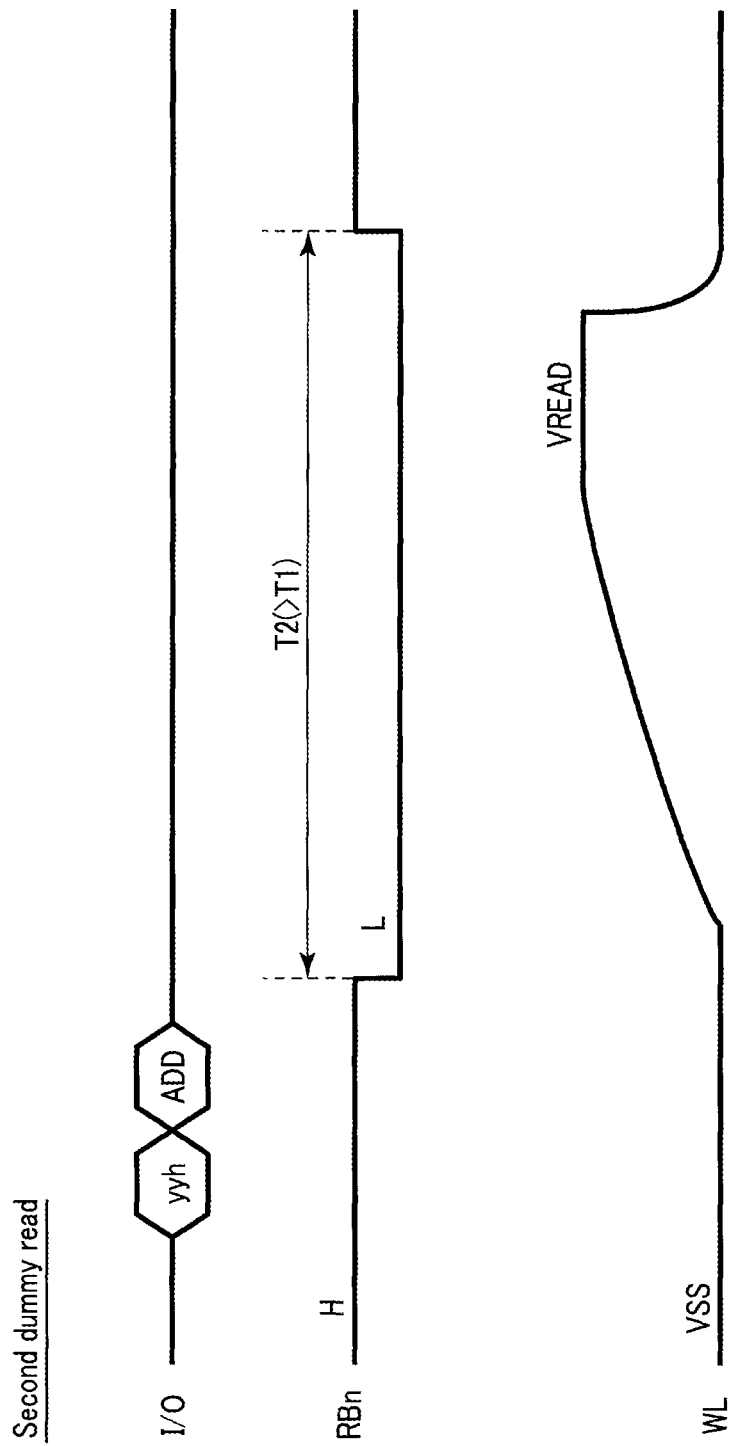
FIG. 10 is a diagram showing an example of each of a command sequence and a waveform of a second dummy read in the memory system according to the first embodiment.

Next, description will be made as to the second dummy read in detail with reference to FIG. 10. FIG. 10 shows examples of a command sequence and a waveform in the second dummy read, and shows a command in the input/output signal I/O, a waveform of the ready/busy signal RBn and a waveform of the word line WL.

As shown in FIG. 10, the memory controller 20 initially issues a command "yyh" to transmit the command to the NAND-type flash memory 10, and the NAND-type flash memory 10 holds the received command "yyh" in the command register 15C. The command "yyh" is a command to execute the dummy read for selected blocks BLKs. Next, the memory controller 20 transmits the address information ADD to the NAND-type flash memory 10, and the NAND-type flash memory 10 holds the received address information ADD in the address register 15B. This address information ADD designates the blocks BLKs targeted for the second dummy read, and the information may include address information to designate multiple blocks BLKs. When the address information ADD is held in the address register 15B, the sequencer 17 changes the ready/busy signal RBn from the "H"-level to the "L"-level, to execute the second dummy read.

In the second dummy read, the row decoder module 13 applies, for example, the read pass voltage VREAD to all the word lines WLs corresponding to the selected blocks BLKs. Then, voltages of the selected (i.e., all) word lines WLs in the selected blocks BLKs rise from the ground voltage VSS up to the read pass voltage VREAD. At this time, a time necessary for the voltage of the word line WL to rise from the ground voltage VSS up to the read pass voltage VREAD is longer than that in the first dummy read. Then, the row decoder module 13 applies the read pass voltage VREAD to the word line WL for a predetermined time, and then lowers the voltage of the word line WL down to the ground voltage VSS. Then, the sequencer 17 changes the ready/busy signal RBn from the "L"-level to the "H"-level, to notify the memory controller 20 of the end of the second dummy read. A period T2 in which the ready/busy signal RBn has the "L"-level during the second dummy read is longer than the period T1. That is, the time necessary to execute the second dummy read is longer than the time necessary to execute the first dummy read. Furthermore, even in the same second dummy read, the time necessary to execute the second dummy read tends to be long, as the number of the selected blocks BLKs increases.

As described above, the first dummy read is different from the second dummy read in the number of the blocks BLKs being patrolled on the basis of one command of the memory controller 20. In the second dummy read, the number of the blocks BLKs being patrolled at a time is large, and hence, the patrol processing rate in the case of employing the second dummy read is generally higher than the patrol processing rate in the case of employing the first dummy read. Therefore, for example, the memory controller 20 employs the first dummy read when the patrol processing rate is to be lowered, and the memory controller employs the second dummy read when the patrol processing rate is to be raised.

For example, when the command of the host apparatus 2 collides with the command for the dummy read and when an access frequency from the host apparatus 2 to the memory system 1 is low, decreasing throughput of the dummy read generally improves latency for commands from the host apparatus 2. On the other hand, when the access frequency from the host apparatus 2 to the memory system 1 is high, increase of the throughput of the dummy read generally improves the latency. Therefore, the patrol controller portion 50 properly selects and uses the first dummy read and the second dummy read, for example, on the basis of the access frequency from the host apparatus 2.

Figure 11:
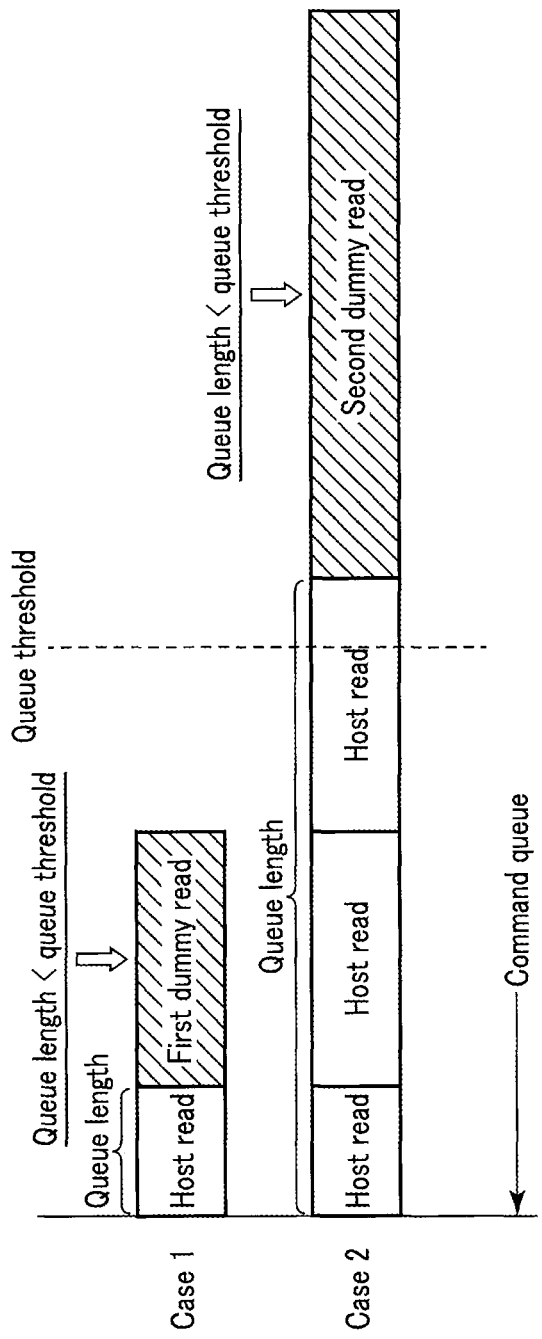
FIG. 11 is a diagram showing an example of a selection criterion of a dummy read process in the patrol period of the memory system according to the first embodiment.

Hereinafter, description will be made as to the present example with reference to FIG. 11. FIG. 11 shows an example of a selection criterion of a dummy read process in the patrol period, and shows a state of the command queue held in the internal memory 22. In the present example, the patrol controller portion 50 provides a threshold with respect to a queue length, thereby properly using the first dummy read and the second dummy read. The queue length indicates a number of commands queued in the internal memory 22. Specifically, a current number of commands held in the queue is denoted by a current queue length, or simply a queue length. A (current) queue length may be denoted by a (current) queue depth. Note that a queue length may be measured with respect to a sum of data amounts corresponding to the commands, instead of the number (i.e., the count) of commands. Hereinafter, the threshold provided in the queue length will be referred to as a queue threshold. The queue threshold may be set to any value.

As shown in FIG. 11, in Case 1, the queue length corresponding to a read command by the host apparatus 2 is not more than the queue threshold. This state indicates, for example, that the access frequency from the host apparatus 2 to the memory system 1 is low. In this case, the patrol controller portion 50 selects, for example, the first dummy read as a subsequent dummy read process, and appends, to the command queue, a command to execute the first dummy read.

In Case 2, the queue length corresponding to the read command by the host apparatus 2 is in excess of the queue threshold. This state indicates, for example, that the access frequency from the host apparatus 2 to the memory system 1 is high. In this case, the patrol controller portion 50 selects, for example, the second dummy read for the subsequent dummy read process, and adds, to the command queue, a command to execute the second dummy read.

As described above, the patrol controller portion 50 executes the first dummy read in which a processing time is comparatively short, when the access frequency from the host apparatus 2 is low, and the patrol controller portion executes the second dummy read in which a processing time is long, when the access frequency is high. Consequently, the memory system 1 can inhibit deterioration of the latency that occurs when the command of the host apparatus 2 collides with the command to execute the dummy read. It is to be noted that the patrol controller portion 50 may properly select and use the first dummy read and the second dummy read on the basis of a maximal number of commands that can be held in the queue at a time by the memory controller 20 (i.e., a maximal queue length, or a maximal queue depth).

A method for selecting a dummy read method from among the first dummy read and the second dummy read is not limited to this example. For example, the patrol controller portion 50 may select on the basis of a required patrol processing rate.

It is to be noted that there has been described above the example where the dummy read to all the patrol target blocks is completed in the patrol period, but the present invention is not limited to this example. For example, when the commands from the host apparatus 2 are frequent and successive, the dummy read to all the patrol target blocks is not be completed in the patrol period in some cases. In this case, the patrol controller portion 50 may interrupt the command from the host apparatus 2 to execute the dummy read, thereby performing the operation to complete the dummy read to all the patrol target blocks in the patrol period.

[1-3] Effect of First Embodiment

According to the memory system 1 of the above-mentioned first embodiment, it is possible to inhibit occurring of retry read during the read operation. Hereinafter, description will be made as to a detailed effect of the memory system 1 according to the first embodiment.

Figure 12:
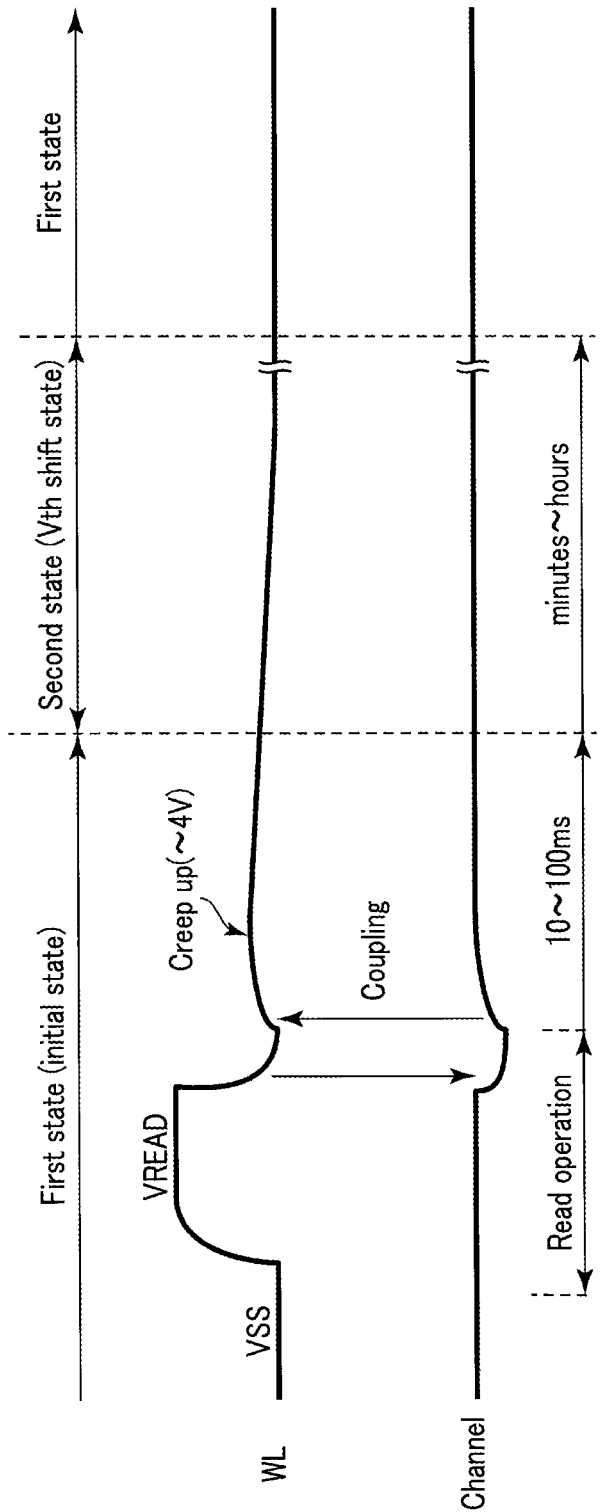
FIG. 12 is a waveform chart showing an example of a creep up phenomenon which occurs after a read operation of the NAND-type flash memory.

For example, as shown in FIG. 5, in the NAND-type flash memory 10 in which the memory cells are stacked in three dimensions, channels of the memory cell transistors MTs constituting the NAND string NS have a structure where the conductive semiconductor material 40 is shared. In the NAND-type flash memory 10 of such a structure, a phenomenon occasionally occurs, a phenomenon as shown in FIG. 12, for example, occasionally occurs. FIG. 12 shows examples of the word line WL during the read operation and a waveform in the channel of the NAND string NS.

As shown in FIG. 12, when the read operation is executed, the row decoder module 13 applies the read pass voltage VREAD to the non-selected word line WL of the selected block BLK. Then, when the read data is determined, the row decoder module 13 lowers the voltage of the non-selected word line WL down to the ground voltage VSS. At this time, when the voltage of the word line WL is not more than the threshold voltage of the memory cell transistor MT, the memory cell transistor MT is turned off. Then, when the voltage of the word line WL further lowers, a channel potential of the NAND string NS lowers from the ground voltage to a negative voltage due to coupling with the word line WL. The block BLK is not selected after the read operation, and as a result, the word line WL comes into a floating state. In this state, when the negative channel potential returns to the ground voltage on the basis of elapse of time, the voltage of the word line WL rises up to, e.g., about 4 V due to the coupling with the channel of the NAND string NS. FIG. 12 shows this phenomenon as "creep up".

In the block BLK in which the voltage of the word line WL creeps up to rise, a potential difference is made between the control gate of the memory cell transistor MT and the channel in the block BLK, and the threshold voltage occasionally changes on the basis of the elapse of time (e.g., from 10 through 100 ms) after the read operation.

Then, the voltage of the word line WL which has creeped up returns to the ground voltage on the basis of the elapse of time as shown in FIG. 12. With further elapse of the time (e.g., from about several minutes to several hours) after fluctuations of the voltage of the word line WL due to the creep up phenomenon are settled, the threshold voltage of the memory cell transistor MT which has risen returns to its original state. In this way, the memory cell transistor MT may take two states, i.e., a first state where the threshold voltage has an initial state and a second state where the threshold voltage changes due to an influence of the creep up phenomenon. On the other hand, the read voltage is optimized to be set to the second state, and hence, in the NAND-type flash memory 10 in which the creep up phenomenon might occur, it is preferable to maintain the memory cell transistor MT in the second state.

Therefore, in the memory system 1 according to the first embodiment, the memory controller 20 periodically executes the dummy read to the NAND-type flash memory 10. Specifically, the patrol controller portion 50 sets the patrol period to be shorter than a time necessary for the memory cell transistor MT to transition from the second state to the first state, and the patrol controller portion 50 instructs the NAND-type flash memory 10 to execute the dummy read to the patrol target block every patrol period.

More specifically, for example, the patrol controller portion 50 executes the dummy read to the block BLK including the memory cell transistor MT of the first state. Then, the creep up phenomenon occurs in the block BLK subjected to the dummy read, and the memory cell transistor MT transitions from the first state to the second state. Then, the patrol controller portion 50 executes the dummy read to the block BLK including the memory cell transistor MT of the second state again, before the memory cell transistor MT transitions from the second state to the first state on the basis of the elapse of time. Then, the creep up phenomenon occurs again in the block including the memory cell transistor MT of the second state, and the voltage of the word line WL rises. When a creep up voltage is applied to a gate electrode of the memory cell transistor MT of the second state, the memory cell transistor MT comes in a state similar to the state where the transistor transitions from the first state to the second state. Afterward, the patrol controller portion 50 executes the dummy read to each block BLK before the memory cell transistor MT transitions from the second state to the first state, whereby the memory cell transistor MT of the second state is maintained in the second state.

Consequently, the memory system 1 of the first embodiment can execute the read operation to the memory cell transistor MT maintained in the second state. Therefore, in the memory system 1 according to the first embodiment, it is possible to inhibit increase of error bits which is caused due to the influence of the fluctuation in threshold voltage of the memory cell transistor MT, and occurrence of the retry read which is caused due to the increase of the error bits. That is, in the memory system 1 according to the first embodiment, it is possible to inhibit drop of an operation speed which is caused by read errors.

[2] Second Embodiment

A memory system 1 according to a second embodiment can operate in, for example, a normal operation mode and a low power consumption mode. The memory system 1 in the normal operation mode can execute a command from a host apparatus 2. In the memory system 1 of the low power consumption mode, some of the modules of the memory system 1 that are active in the normal operation mode are inactive. Power consumption of the memory system 1 in the low power consumption mode is lower than that in the normal operation mode. Furthermore, the memory system 1 of the second embodiment spontaneously executes a patrol operation in the low power consumption mode. Hereinafter, description will be made as to differences of the memory system 1 according to the second embodiment from the memory system according to the first embodiment.

[2-1] Constitution

When the memory system 1 according to the second embodiment receives, for example, a predetermined command from a host apparatus 2 or when there are no commands from the host apparatus 2 over a predetermined period, the system spontaneously transitions to the low power consumption mode. In the memory system 1 in the low power consumption mode, only limited modules are supplied with power (i.e., active) to suppress power consumption, whereas the power supply to a part of a processor 21 and a timer 24 in a memory controller 20 is maintained.

FIG. 13 shows a detailed example constitution of the processor 21 in the low power consumption mode. As shown in FIG. 13, the processor 21 according to the second embodiment functions as a first patrol controller portion 50A, a second patrol controller portion 50B, and a command issue portion 51.

The first patrol controller portion 50A and the second patrol controller portion 50B are similar to, for example, the patrol controller portion 50 described in the first embodiment with reference to FIG. 6. In the low power consumption mode, the power supply to the first patrol controller portion 50A is stopped, and the first patrol controller portion 50A comes in a low power consumption (i.e., inactive) state where power consumption is lower than that in a normal operation. In the low power consumption mode, for example, the second patrol controller portion 50B is maintained active and monitors progress of dummy read in each patrol period on the basis of count of the timer 24. Then, for example, when the progress of the dummy read is behind predetermined progress in the patrol period, the second patrol controller portion 50B resumes power supply to the command issue portion 51, a NAND interface circuit 26 and a NAND-type flash memory 10 to activate them thereby instructing the command issue portion 51 to execute the dummy read to a patrol target block. Furthermore, the second patrol controller portion 50B manages a number Ncompleted of the patrolled blocks BLKs in the patrol period. The number Ncompleted of the patrolled blocks BLKs is held in an internal memory 22, and is updated by the second patrol controller portion 50B as the dummy read proceeds.

The command issue portion 51 is similar to the command issue portion 51 described in the first embodiment with reference to FIG. 6. In the low power consumption mode, the command issue portion 51 resumes from the inactive state to the active state on the basis of a command from the second patrol controller portion 50B, and on the basis of the command of the second patrol controller portion 50B, the command issue portion issues a command and an address concerning the dummy read. The issued command and address are transferred to the NAND-type flash memory 10 via the NAND interface circuit 26, and the NAND-type flash memory 10 executes the dummy read on the basis of the command and the address. The rest of constitution of the memory system 1 according to the second embodiment is similar to the constitution of the memory system 1 according to the first embodiment, and hence, description is omitted.

[2-2] Operation

Figure 14:
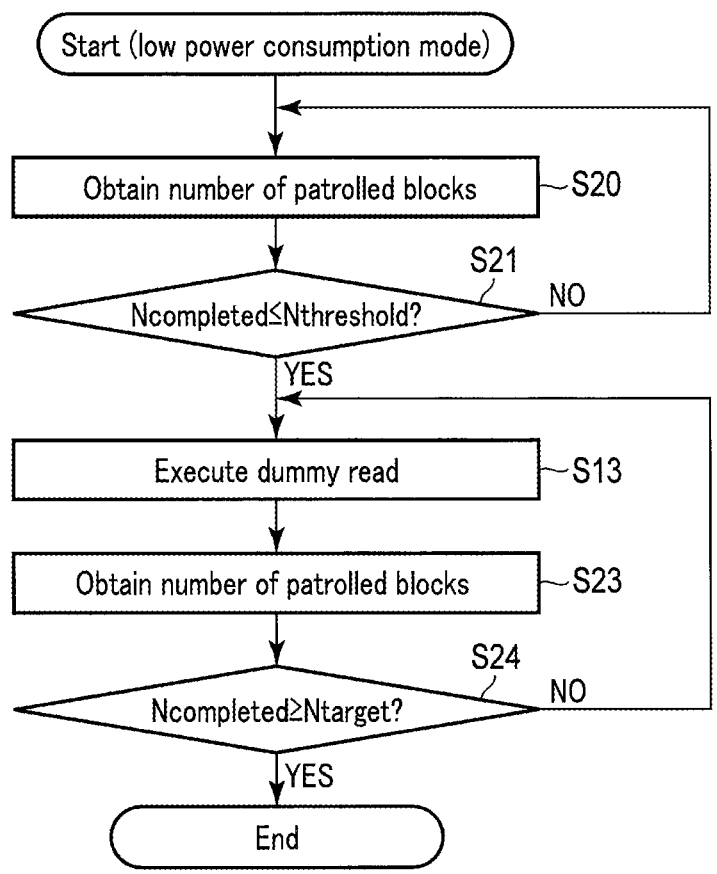
FIG. 14 is a flow chart showing an example of the patrol operation in the memory system according to the second embodiment.

FIG. 14 is a flow chart showing an example of the patrol operation in the memory system 1 according to the second embodiment, and shows an operation example of the memory system 1 in the low power consumption mode.

As shown in FIG. 14, when the low power consumption mode starts, the second patrol controller portion 50B initially obtains the number of the patrolled blocks BLKs (step S20), and determines whether the number Ncompleted of the patrolled blocks BLKs is not more than a predetermined threshold Nthreshold (step S21). The predetermined threshold Nthreshold may be set on the basis of remaining time of the patrol period.

When Ncompleted is in excess of Nthreshold (Ncompleted>Nthreshold) (NO in the step S21), the second patrol controller portion 50B goes back to the step S20, and repeats comparison between the number Ncompleted of the patrolled blocks BLKs and the threshold Nthreshold which varies on the basis of elapse of time.

When Ncompleted is less than or equal to Nthreshold (Ncompleted≤Nthreshold) (YES in the step S21), the second patrol controller portion 50B activates the command issue portion 51, the NAND interface circuit 26 and the NAND-type flash memory 10 from the inactive (e.g., low power) state to the active (e.g., normal) state to execute the dummy read to which a predetermined patrol processing rate is applied. The mode in which the memory system 1 is able to perform the patrol operation is referred to as a partially-active low power mode. For example, this dummy read is similar to the dummy read in the step S13 described in the first embodiment with reference to FIG. 7.

Then, the second patrol controller portion 50B again obtains the number Ncompleted of the patrolled blocks BLKs (step S23), and determines whether the number Ncompleted of the patrolled blocks BLKs is not less than a target value Ntarget (step S24). The target value Ntarget is a value higher than the threshold Nthreshold, and is set so that the dummy read to all the patrol target blocks is completed in the patrol period.

When Ncompleted is less than Ntarget (Ncompleted<Ntarget) (NO in the step S24), the second patrol controller portion 50B goes back to the step S13, and repeats the dummy read to which the predetermined patrol processing rate is applied and the monitoring of the number Ncompleted of the patrolled blocks BLKs.

When Ncompleted is not less than Ntarget (Ncompleted≥Ntarget) (YES in the step S24), the second patrol controller portion 50B causes the command issue portion 51, the NAND interface circuit 26 and the NAND-type flash memory 10 to transition to the inactive state, and the memory system 1 returns from the partially-active low power mode to the original low power consumption mode (referred to as an inactive low power consumption mode). That is, the second patrol controller portion 50B goes back to the step S20, and repeatedly executes the above-mentioned operation.

Figure 15:
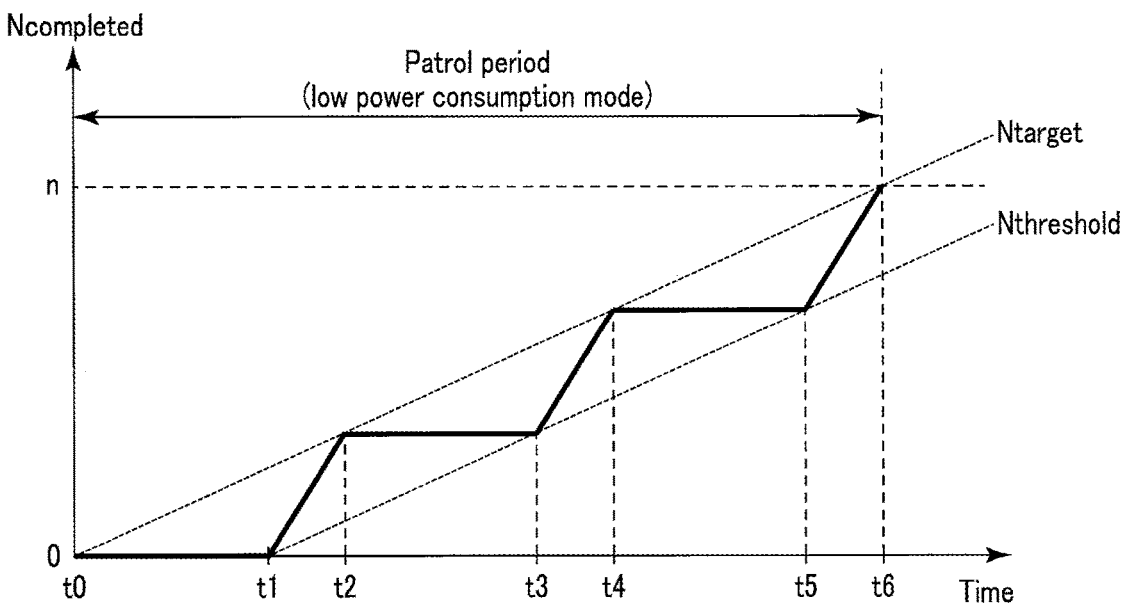
FIG. 15 is a diagram showing an example of transition of the number of patrolled blocks in a patrol period of the memory system according to the second embodiment.

FIG. 15 shows an example of the patrol operation in the above-mentioned low power consumption mode. FIG. 15 shows an example of transition of the number of the patrolled blocks BLKs in the patrol period of the low power consumption mode, the ordinate indicates the number Ncompleted of the patrolled blocks BLKs, and the abscissa indicates time. Furthermore, FIG. 15 shows transition of the predetermined threshold Nthreshold with respect to time and transition of the target threshold Ntarget with time by broken lines, and n blocks BLKs are designated as the patrol target blocks.

As shown in FIG. 15, Ncompleted is "0" (there are no patrolled blocks BLKs) at time t0. Then, Ncompleted is not more than Nthreshold at time t1. In this case, the second patrol controller portion 50B activates associated modules from the inactive state to the active state, and executes the dummy read at a predetermined patrol processing rate. When Ncompleted is not less than Ntarget at time t2, the second patrol controller portion 50B deactivates the associated modules to transition to the inactive state, and the memory system 1 returns from the partially-active low power consumption mode to the inactive low power consumption mode (i.e., the original low power consumption mode). Afterward, such an operation is repeatedly executed. Briefly, the second patrol controller portion changes conditions of the associated modules on the basis of a progress situation of the dummy read, to execute the dummy read at time t3, stop the dummy read at time t4, and execute the dummy read at time t5. Then, at time t6, when Ncompleted reaches the number of the patrol target blocks, the second patrol controller portion 50B ends the patrol operation in the patrol period.

Figure 16:
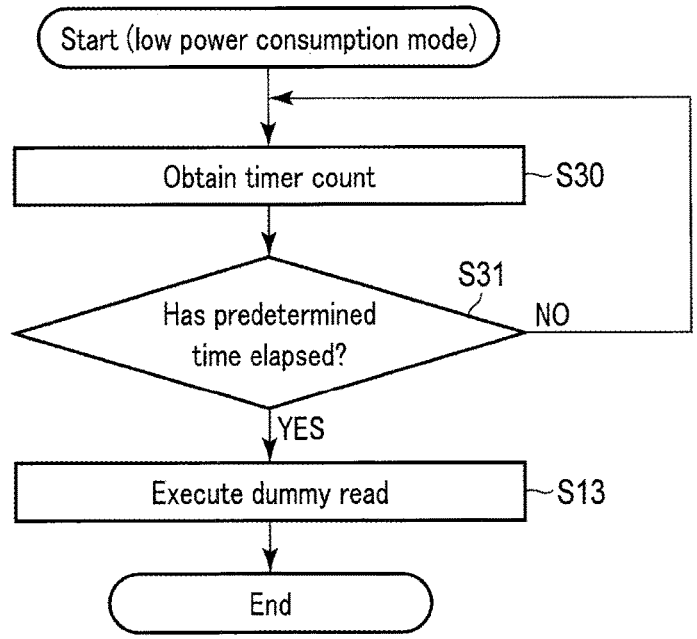
FIG. 16 is a flow chart showing a modified example of the patrol operation in the memory system according to the second embodiment.

Additionally, there has been described above the example where the second patrol controller portion 50B instructs the execution of the dummy read in the low power consumption mode on the basis of results of the comparison between the number Ncompleted of the patrolled blocks BLKs and the predetermined threshold Nthreshold, but the present invention is not limited to this example. For example, in the low power consumption mode, the second patrol controller portion 50B may periodically instruct the execution of the dummy read on the basis of the count of the timer 24 as shown in FIG. 16. FIG. 16 is a flow chart showing a modified example of the patrol operation in the memory system 1 according to the second embodiment, and shows an operation example of the memory system 1 in the low power consumption mode.

When the low power consumption mode starts as shown in FIG. 16, the second patrol controller portion 50B initially obtains the count of the timer 24 (step S30), and determines whether or not a predetermined time elapses (step S31).

When the count of the timer 24 does not indicate the predetermined time has elapsed (NO in the step S31), the second patrol controller portion 50B goes back to the step S30, and continues the monitoring of the count of the timer 24.

When the count of the timer 24 indicates the predetermined time has elapsed (YES in the step S31), the second patrol controller portion 50B activates the command issue portion 51, the NAND interface circuit 26 and the NAND-type flash memory 10 from the inactive state to the active state to execute the dummy read to which the predetermined patrol processing rate is applied. For example, this dummy read is similar to the dummy read in the step S13 described in the first embodiment with reference to FIG. 7.

When the dummy read in the step S13 ends, the second patrol controller portion 50B deactivates the command issue portion 51, the NAND interface circuit 26 and the NAND-type flash memory 10 to transition from the active state to the inactive state, and the memory system 1 returns from the partially-active low power consumption mode to the inactive low power consumption mode. That is, the second patrol controller portion 50B goes back to the step S30, and repeatedly executes the above-mentioned operation.

Additionally, for example, the predetermined time in the step S31 is set so that the dummy read to the patrol target block is completed in the patrol period. Also by using this method, in the memory system 1, it is possible to perform the dummy read in the patrol period in the low power consumption mode as shown in FIG. 15.

[2-3] Effect of Second Embodiment

According to the memory system 1 of the above-mentioned second embodiment, it is possible to inhibit drop of an operation speed when the system returns from the low power consumption mode. Hereinafter, description will be made as to a detailed effect of the memory system 1 according to the second embodiment.

The memory system 1 occasionally transitions to the low power consumption mode, for example, when there are no commands from the host apparatus 2 for a long time, or when a power mode switch command from the host apparatus 2 is received. In the low power consumption mode, the modules to which power is to be supplied are limited to suppress power consumption, and hence, for example, the patrol operation described in the first embodiment occasionally stops.

To solve such a problem, in the memory system 1 according to the second embodiment, the dummy read is periodically executed also in the low power consumption mode. Specifically, for example, the second patrol controller portion 50B and the timer 24 in the memory controller 20 operate even in the low power consumption mode. In the low power consumption mode, the second patrol controller portion 50B detects, for example, that the number of the patrolled blocks BLKs is smaller than a predetermined value in the patrol period or that the predetermined time has elapsed on the basis of the count of the timer 24. Then, the patrol controller portion 50B temporarily wakes up the predetermined modules of the memory system 1 from the inactive state to the active state, and instructs the NAND-type flash memory 10 to execute the dummy read.

Consequently, in the memory system 1 according to the second embodiment, it is possible to inhibit the transition of the memory cell transistor MT of the patrol target block to the first state in the low power consumption mode. Therefore, in the memory system 1 according to the second embodiment, it is possible to inhibit occurrence of retry read in the read operation when the system wakes up from the low power consumption mode, and hence, it is possible to inhibit the drop of the operation speed.

[3] Third Embodiment

In a memory system 1 according to a third embodiment, a length of a patrol period is changed on the basis of a temperature state of the memory system 1. Hereinafter, description will be made as to differences of the memory system 1 according to the third embodiment from the first and second embodiments.

[3-1] Constitution

Figure 17:
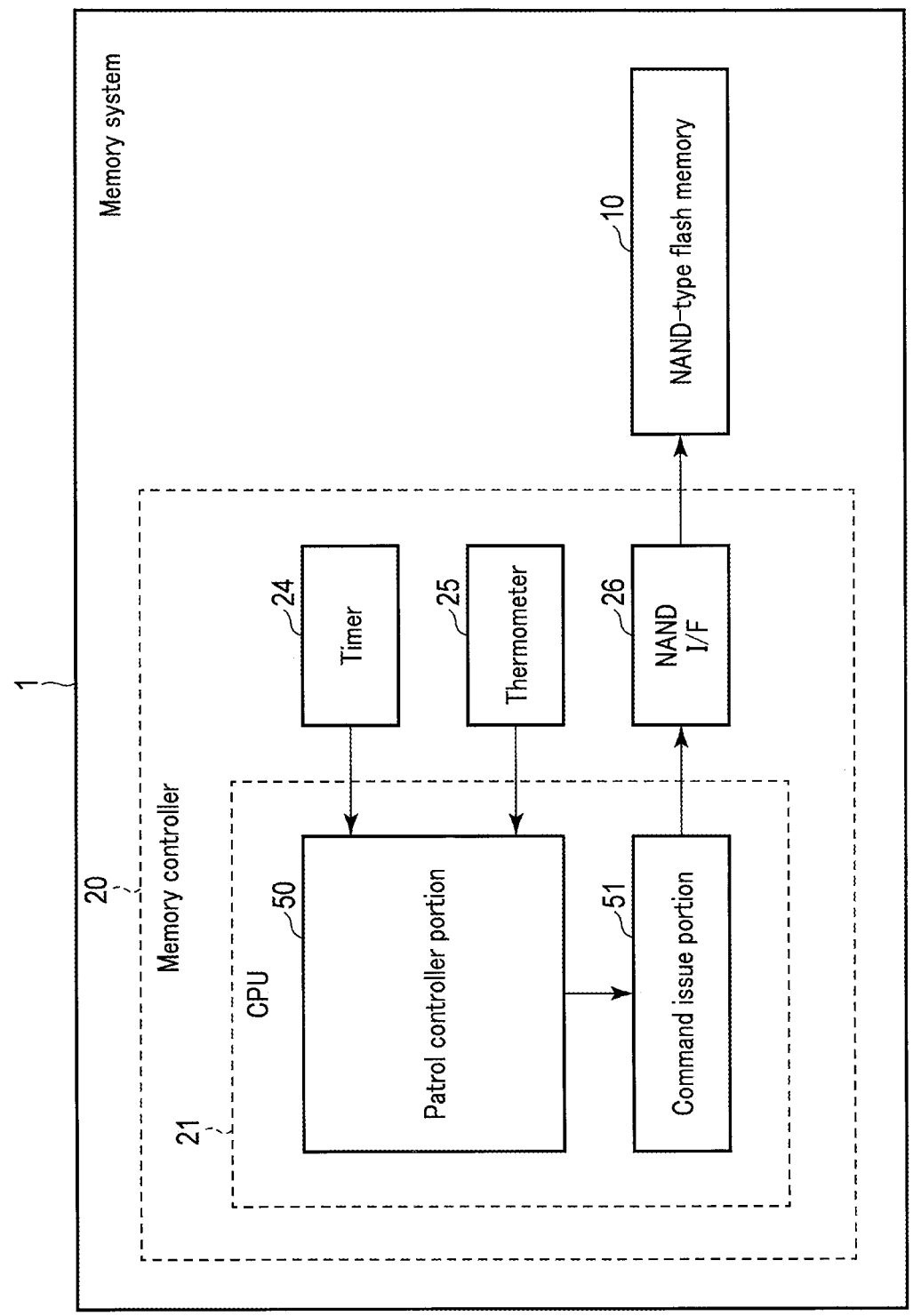
FIG. 17 is a block diagram showing a detailed example constitution of a processor contained in a memory controller according to a third embodiment.

FIG. 17 shows a detailed example constitution of a processor 21 in the case of changing the patrol period on the basis of the temperature state. As shown in FIG. 17, in the third embodiment, the processor 21 inputs information of a thermometer 25 into a patrol controller portion 50 described in the first embodiment with reference to FIG. 6. Then, the patrol controller portion 50 in the third embodiment changes the patrol period on the basis of temperature information from the thermometer 25. The rest of constitution of the memory system 1 according to the third embodiment is similar to the constitution of the memory system 1 according to the first embodiment, and hence, description is omitted.

[3-2] Operation

Figure 18:
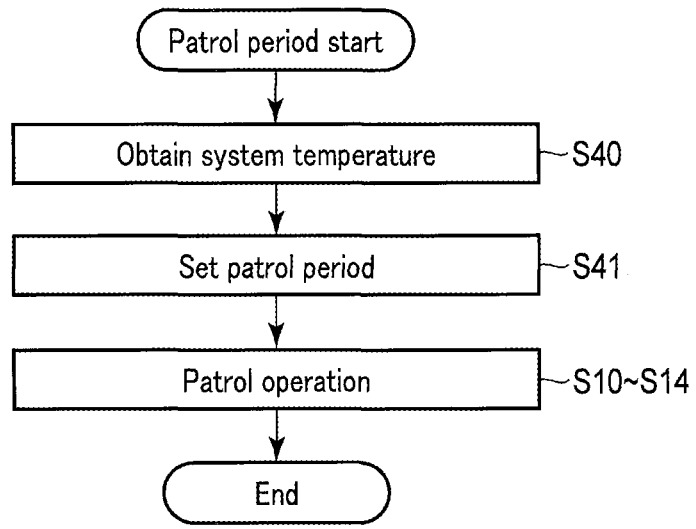
FIG. 18 is a flow chart showing an example of a patrol operation in a memory system according to the third embodiment.

FIG. 18 is a flow chart showing an example of a patrol operation in the memory system 1 according to the third embodiment, and shows an operation example of the memory system 1 based on the temperature state.

As shown in FIG. 18, when the patrol period starts, the patrol controller portion 50 initially acquires the temperature information from the thermometer 25 to obtain a system temperature of the memory system 1 (step S40). Next, the patrol controller portion 50 calculates a system temperature on the basis of, for example, the acquired temperature information, and sets the length of the patrol period on the basis of the calculated system temperature (step S41). Specifically, for example, when the system temperature is equal to or higher than a predetermined temperature, the patrol period is set to be longer than an initial value, and when the system temperature is higher than the predetermined temperature, the patrol period is set to be shorter than the initial value.

It is to be noted that a method in which the patrol controller portion 50 sets the length of the patrol period is not limited to this example. In the method of setting the patrol period, the length of patrol period may be determined on the basis of the acquired temperature information, there may be referred to a table in which a range of the system temperature is associated with the length of the patrol period, or the length of the patrol period may be calculated from a value of the system temperature by using a predetermined formula.

Then, for example, the patrol controller portion 50 executes the patrol operation of the steps S10 through S14 described in the first embodiment with reference to FIG. 7, in the set patrol period. When the patrol period ends and the next patrol period begins, the patrol controller portion 50 goes back to the step S40, and repeatedly executes the above-mentioned operation. It is to be noted that the patrol controller portion 50 may further measure a temperature in the middle of the patrol period and update the patrol period.

Figure 19:
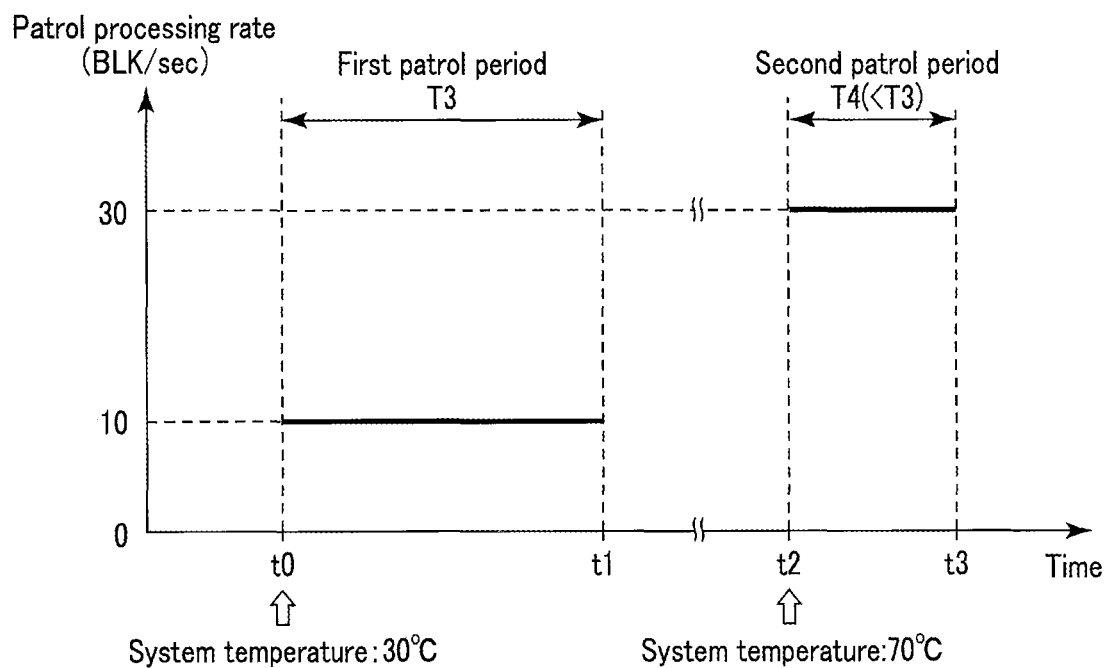
FIG. 19 is a diagram showing an example of transition of a patrol processing rate in a patrol period of the memory system according to the third embodiment.

FIG. 19 shows an example of the patrol operation based on the above-mentioned temperature state. FIG. 19 shows an example of transition of a patrol processing rate in the patrol operation based on the temperature state, the ordinate indicates the patrol processing rate, and the abscissa indicates time. Furthermore, FIG. 19 shows two different patrol periods (a first patrol period and a second patrol period), and a patrol processing rate in other patrol periods is omitted.

As shown in FIG. 19, when the system temperature of the memory system 1 is 30° C. at time t0, the patrol controller portion 50 sets a first patrol period T3 on the basis of this value of the system temperature. It is to be noted that in the present example, a period from the time t0 to t1 corresponds to the patrol period T3. Then, the patrol controller portion 50 sets the patrol processing rate to, for example, 10 (BLKs/sec) on the basis of the length of the first patrol period T3, and executes the patrol operation.

When the temperature of the memory system 1 is 70° C. at time t2, the patrol controller portion 50 sets a second patrol period T4 on the basis of this value of the system temperature. It is to be noted that in the present example, a period from the time t2 to t3 corresponds to the patrol period T4, and the period T4 is set to be shorter than the period T3. Then, the patrol controller portion 50 sets the patrol processing rate to, for example, 30 (BLKs/sec) on the basis of the length of the patrol period T4, and executes the patrol operation. The period T4 corresponds to the second patrol period and indicates a time from t2 to t3.

As described above, in the present example, the system temperature at the time t2 is higher than the system temperature at the time t0, and hence, for example, the second patrol period T4 is set to be shorter than the first patrol period T3. Furthermore, the second patrol period T4 is shorter than the first patrol period T3, and hence, for example, the patrol processing rate in the second patrol period is set to be higher than the patrol processing rate in the first patrol period.

[3-3] Effect of Third Embodiment

According to the memory system 1 of the above-mentioned third embodiment, it is possible to inhibit drop of an operation speed due to an influence of the change of the system temperature. Hereinafter, description will be made as to a detailed effect of the memory system 1 according to the third embodiment.

A time necessary for a threshold voltage of a memory cell transistor MT to transition from a second state to a first state occasionally changes on the basis of the temperature state. For example, it is considered that when the system temperature of the memory system 1 is high, the time necessary for the memory cell transistor MT to transition from the second state to the first state shortens, and when the system temperature is low, the time necessary for the memory cell transistor MT to transition from the second state to the first state lengthens.

To solve this problem, in the memory system 1 according to the third embodiment, the length of each patrol period is optimized on the basis of the temperature state of the memory system 1. Specifically, for example, the patrol controller portion 50 of the processor 21 initially acquires the temperature information from the thermometer 25 contained in the memory controller 20. This temperature information indirectly indicates the system temperature of the whole memory system 1 and the temperature of the memory cell transistor MT in a NAND-type flash memory 10. Then, the patrol controller portion 50 sets the length of each patrol period on the basis of the temperature information, and optimizes the length of the patrol period on the basis of the temperature state.

For example, when the temperature of the memory system 1 is high and the time necessary for the memory cell transistor MT to transition from the second state to the first state shortens, the patrol controller portion 50 sets the short patrol period on the basis of this situation. On the other hand, when the temperature of the memory system 1 is low and the time necessary for the memory cell transistor MT to transition from the second state to the first state lengthens, the patrol controller portion 50 sets the long patrol period on the basis of this situation. Then, the patrol controller portion 50 determines the patrol processing rate in the set patrol period, and executes dummy read.

Consequently, in the memory system 1 according to the third embodiment, it is possible to avoid a situation where the dummy read is executed to the memory cell transistor MT more than necessary or a situation where a read operation instructed by a host apparatus 2 is executed when the memory cell transistor MT has transitioned from the second state to the first state. Therefore, in the memory system 1 according to the third embodiment, it is possible to inhibit the drop of the operation speed due to the influence of the change of the system temperature.

It is to be noted that in the memory system 1 according to the third embodiment, the thermometer may be contained in the NAND-type flash memory 10. In this case, according to the memory system 1, it is possible to set the length of each patrol period on the basis of the temperature information measured with the thermometer contained in the NAND-type flash memory 10, and it is possible to optimize the length of the patrol period on the basis of the temperature state.

[4] Fourth Embodiment

In a memory system 1 according to a fourth embodiment, a processing order for dummy read of patrol target blocks is determined on the basis of a priority. Hereinafter, description will be made as to differences of the memory system 1 according to the fourth embodiment from the first through third embodiments.

[4-1] Constitution

FIG. 20 shows a detailed example constitution of a DRAM 3 and a processor 21 in a case where the processing order for dummy read of the patrol target blocks is determined on the basis of the priority. As shown in FIG. 20, in the fourth embodiment, the DRAM 3 stores an attribute table 60, and the processor 21 further functions as a priority decision portion 52.

The attribute table 60 contains information associated with each block BLK, and the processor 21 updates the attribute table 60 on the basis of various operations of the memory system 1. Examples of the information included in the attribute table 60 include a block state, a write mode, the number of write/erase cycles, the number of write times, last write time, last access time, and the number of read errors. FIG. 21 shows an example of the attribute table 60 including these pieces of information.

As shown in FIG. 21, there are blocks BLKs in which attributes of the data being stored are different, and blocks BLK to which different write methods are applied. Specifically, in the attribute table 60, the attribute of the information to be stored, e.g., a free block, an active block (storing user data) or an active block (storing debug information) attribute is recorded as the block state. Furthermore, in the attribute table 60, for example, MLC, SLC or the like is recorded as the write mode to be applied to the block BLK. In the attribute table 60, for example, information of hours, minutes and seconds is recorded as the last write time or the last access time, but the information is not limited thereto, and the information of the last write time and last access time recorded in the attribute table 60 may include information of date. It is to be noted that the information included in the attribute table 60 is not limited to this example, and may include any information concerned with the block BLK.

The priority decision portion 52 determines the priority of dummy read in the patrol period with reference to the attribute table 60 stored in the DRAM 3. The priority is set to three levels, e.g., high, medium and low levels. It is to be noted that the setting of the priority is not limited to the three levels, and the priority may be set to any number of levels. Hereinafter, description will be made as to an example of a setting criterion of the priority.

In a case where the priority is set on the basis of the attribute of the block BLK, for example, the priority decision portion 52 lowers the priority of a block BLK which is not to be a target of host read.

In a case where the priority is set on the basis of a reliability of the block BLK, the priority decision portion 52 lowers the priority of the block having a large reliability margin (e.g., a block to which the SLC mode is applied, a block protected with strong error correction, a block in which the number of the write/erase cycles is small, or the like), and the portion raises the priority of an exhausted block (e.g., a block in which the number of the write/erase cycles is large, a block in which read disturb and/or data retention stress is large, or the like).

In a case where the priority of a region is set on the basis of an access profile, on the basis of the number of times of access to the region out of the number of times of access to the entire space of the memory system 1 in terms of the number of commands and/or the data amount as a criterion, the priority decision portion 52 lowers the priority of a block having a low access frequency, and raises a priority of a block of a high access frequency or a block accessed most recently.

In a case where the priority is set on the basis of a profile of time viewpoint, by using a time interval between the access to the region and the next access as a criterion, the priority decision portion 52 lowers a priority of a block including a logical block address at which an access interval is short (e.g., in the order of seconds) and a priority of a block including a logical block address at which an access interval is long (e.g., in the order of hours), and raises a priority of a block including a logical block address at which an access interval is medium (e.g., in the order of minutes). For example, in the block having the short access interval, a memory cell transistor MT can be maintained in a second state by the host read, and hence, its priority may be lowered. In the block having the long access interval, the access frequency is low, and, for example, importance of stored information is low, and hence, its priority may be lowered. In the block having the medium access interval, it is difficult to maintain the transistor in the second state by the host read, there is the high possibility that the block is accessed where the transistor is in a first state, and hence, its priority may be raised.

In a case where the priority is set on the basis of a profile in a reliability viewpoint, for example, the priority decision portion 52 raises the priority of a block having a high error rate as in a block in which the number of times of occurrence of retry read is large.

In the case of setting the priority on the basis of elapse of time, the priority decision portion 52 raises the priority of a block in which a certain time or more elapses since when a write operation to the block is executed or time when the dummy read is last executed to the block.

It is to be noted that the priority decision portion 52 may determine the priority on the basis of one of the above-mentioned pieces of the information included in the attribute table 60 or a combination of several pieces of the information. Furthermore, the priority decision portion 52 may determine the priority on the basis of the information of the attribute table 60 and count of a timer 24. The rest of constitution of the memory system 1 according to the fourth embodiment is similar to the constitution of the memory system 1 according to the first embodiment, and hence, description is omitted.

Additionally, there has been described above the example where the attribute table 60 is stored in the DRAM 3, but the present invention is not limited to this example. For example, the attribute table 60 may be stored in an internal memory 22 of the memory controller 20. Alternatively, the attribute table 60 may be stored in the NAND-type flash memory 10, and may be read out from the NAND-type flash memory 10 into the DRAM 3 or the internal memory 22.

[4-2] Operation

Figure 22:
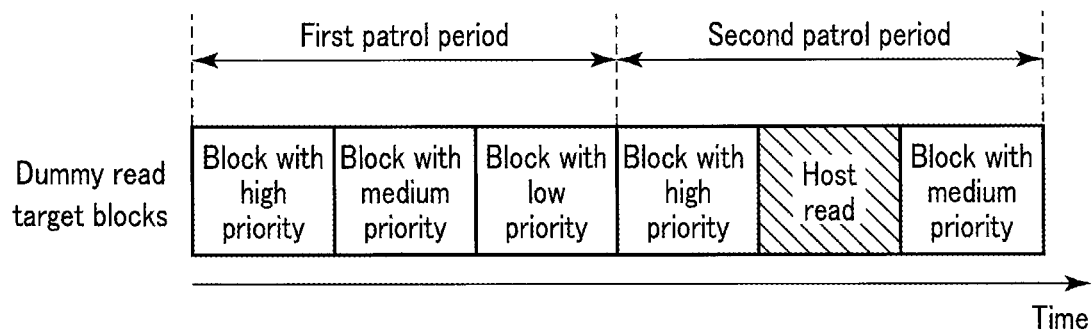
FIG. 22 is a diagram showing an example of a processing order for dummy read based on a priority in a patrol operation of each of a first patrol period and a second patrol period of the memory system according to the fourth embodiment.

FIG. 22 shows an example of a patrol operation based on the priority in the fourth embodiment, and shows the priority of the patrol target block for the dummy read along a time axis. Furthermore, FIG. 22 shows a first patrol period, and a second patrol period which follows the first patrol period.

As shown in FIG. 22, in the first patrol period, a patrol controller portion 50 executes the dummy read on the basis of the priority of the patrol target block which is determined by the priority decision portion 52. Specifically, in the first patrol period, the patrol controller portion 50 executes the dummy read to the patrol target blocks in order of priority from higher to lower.

In the following second patrol period, the patrol controller portion 50 executes the dummy read to the patrol target blocks in a priority order similar to that of the first patrol period. In the second patrol period of the present example, an operation (e.g., the host read) based on a command from a host apparatus 2 is executed after the dummy read to the patrol target block having the high priority is executed. In this way, when a remaining time of the patrol period shortens due to the operation based on the command from the host apparatus 2 in the patrol period, the patrol period occasionally ends before the dummy read to the patrol target block having the low priority is executed.

Additionally, there has been described above the example where the dummy read to the patrol target block of the low priority is not executed in the second patrol period, but the present invention is not limited to this example. For example, the patrol controller portion 50 may operate to complete the dummy read to all the patrol target blocks in the patrol period, on the basis of the count of the timer 24 and the remaining time of the patrol period. In this case, when the remaining time of the patrol period shortens, the patrol controller portion 50 performs interruption processing to the operation based on the command from the host apparatus 2, and preferentially executes the dummy read based on the patrol operation.

Figure 23:
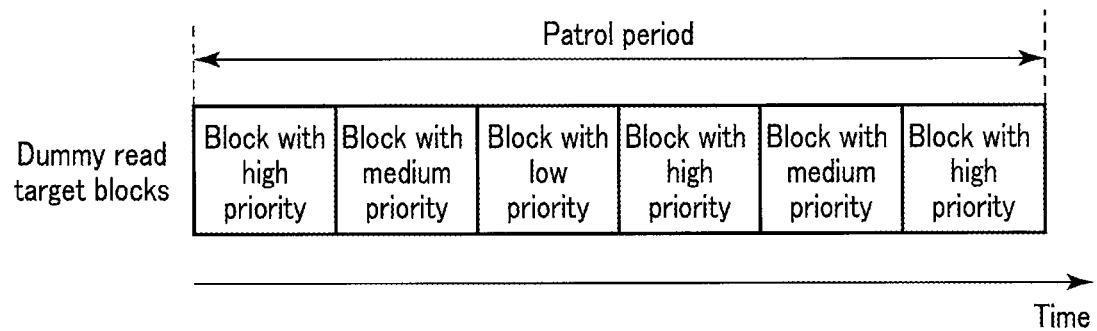
FIG. 23 is a diagram showing an example of a processing order for dummy read based on a priority in a patrol operation of a patrol period of the memory system according to the fourth embodiment.

Furthermore, there has been described above the example where the dummy read is executed to each patrol target block once in the patrol period, but the present invention is not limited to this example. For example, the number of times of dummy read to be executed in each patrol period may be changed on the basis of the priority. Description is made as to the present example with reference to FIG. 23. FIG. 23 shows a modified example of the patrol operation based on the priority in the fourth embodiment.

As shown in FIG. 23, the patrol controller portion 50 executes the dummy read to the block BLK of a high priority plural times in the patrol period on the basis of the priority of the patrol target block which is determined by the priority decision portion 52. Specifically, for example, the patrol controller portion 50 executes the dummy read to the patrol target block of the high priority three times, executes the dummy read to the patrol target block of the medium priority twice, and executes the dummy read to the patrol target block of the low priority once in the patrol period. Then, for example, the patrol controller portion 50 executes the dummy read in the order of the high priority, the medium priority, the low priority, the high priority, the medium priority and the high priority in the patrol period. In this way, the patrol controller portion 50 initially executes the dummy read to the patrol target blocks of the respective priorities in the patrol period, and executes the initial dummy read to the patrol target block of the medium priority or the low priority in the first half of the patrol period.

It is to be noted that in a case where the patrol controller portion 50 executes the dummy read to the same block BLK plural times in the patrol period on the basis of the priority, the processing order for dummy read is not limited to the above-mentioned order. In this case, the patrol controller portion 50 may employ any order as the processing order for dummy read.

Furthermore, there has been described above the example where in the patrol period, the patrol controller portion 50 executes the dummy read to the patrol target block having the high priority plural times, and executes the dummy read to the patrol target block having the low priority once, but the present invention is not limited to this example. For example, the number of the times of the dummy read to the patrol target block with each priority may be set to any number, and the dummy read may be executed to the patrol target block of the low priority plural times.

[4-3] Effect of Fourth Embodiment

According to the memory system 1 of the above-mentioned fourth embodiment, it is possible to preferentially execute the dummy read to the block BLK of high importance. Hereinafter, description will be made as to a detailed effect of the memory system 1 according to the fourth embodiment.

For example, the patrol target blocks include the block BLK to store user data, and the block BLK to store the debug information or the like for management of the memory system 1 by the memory controller 20, and even two regions both to store user data occasionally have different access frequencies depending on a type of user data to be stored. Furthermore, in the memory cell transistor MT, there is the tendency that as the bit data being stored in one memory cell transistor MT increases, possibility of occurrence of the read error increases in the first state of the memory cell transistor MT.

In other words, according to the memory system 1, the patrol target blocks occasionally have different importance degrees and effects in the execution of the dummy read. For example, the dummy read in the block BLK of the high access frequency is more important than the dummy read in the block BLK of the low access frequency. Furthermore, the dummy read in the block BLK to which the MLC mode is applied as the write mode has a larger effect of inhibiting the occurrence of the read error than the dummy read in the block BLK to which the SLC mode is applied.

Consequently, in the memory system 1 according to the fourth embodiment, the priority of the dummy read to the patrol target block is set on the basis of the importance and effect of the dummy read. Specifically, the priority decision portion 52 determines the priority to each patrol target block with reference to the attribute table 60 including various pieces of information of the block BLK. Then, the patrol controller portion 50 executes the patrol operation on the basis of the priority determined by the priority decision portion 52. That is, the patrol controller portion 50 preferentially executes the dummy read to the block BLK in which the importance and effect of the dummy read are high.

In consequence, according to the memory system 1 of the fourth embodiment, in each patrol period, the memory cell transistor MT in the block BLK in which the importance and effect of the dummy read are high can be maintained in the second state. That is, in the memory system 1 according to the fourth embodiment, it is possible to minimize the influence even in a case the dummy read to all the patrol target blocks is not completed in the patrol period. Therefore, in the memory system 1 according to the fourth embodiment, it is possible to minimize drop of an operation speed of the memory system 1.

It is to be noted that in the memory system 1 according to the fourth embodiment, the dummy read may be executed to the same block BLK plural times in each patrol period on the basis of the priority determined by the priority decision portion 52. Consequently, in the memory system 1 according to the fourth embodiment, in a case where the blocks BLKs are different from each other in the time necessary for the memory cell transistor MT to transition from the second state to the first state, the dummy read may be executed to each patrol target block at the most suitable interval.

Furthermore, in the memory system 1 according to the fourth embodiment, the priority may be set on the basis of the structure of the NAND-type flash memory 10. In this case, the priority decision portion 52 raises the priority of the block which is easily transitions from the first state to the second state due to its physical structure, e.g., the block which is close to a chip end, or the like.

Additionally, in the memory system 1 according to the fourth embodiment, the priority may be set on the basis of hint information acquired from the host apparatus 2. In this case, the priority decision portion 52 raises the priorities of the block BLK including a logical block address which is frequently accessed, and the block BLK including a logical block address into which important data is stored. Furthermore, the priority decision portion 52 may lower the priority of the logical block address which is not included in the hint information. The present invention is not limited to this example, and the priority decision portion 52 may lower the priority of the block BLK included in namespace which is not used, with reference to information for managing the logical address space as multiple subspaces (e.g., namespaces).

In addition, according to the memory system 1 of the fourth embodiment, a block of an extremely low priority may be excluded from the patrol target blocks. In this case, for example, the patrol controller portion 50 may provide a predetermined threshold to the priority and exclude, from the patrol target blocks, the patrol target block having the priority which is lower than this predetermined threshold.

[5] Fifth Embodiment

A fifth embodiment relates to a managing method using flags in a patrol period, in a case where blocks BLKs share a control signal of a block decoder. Hereinafter, description will be made as to differences of a memory system 1 according to a fifth embodiment from the first through fourth embodiments.

[5-1] Constitution

Figure 24:
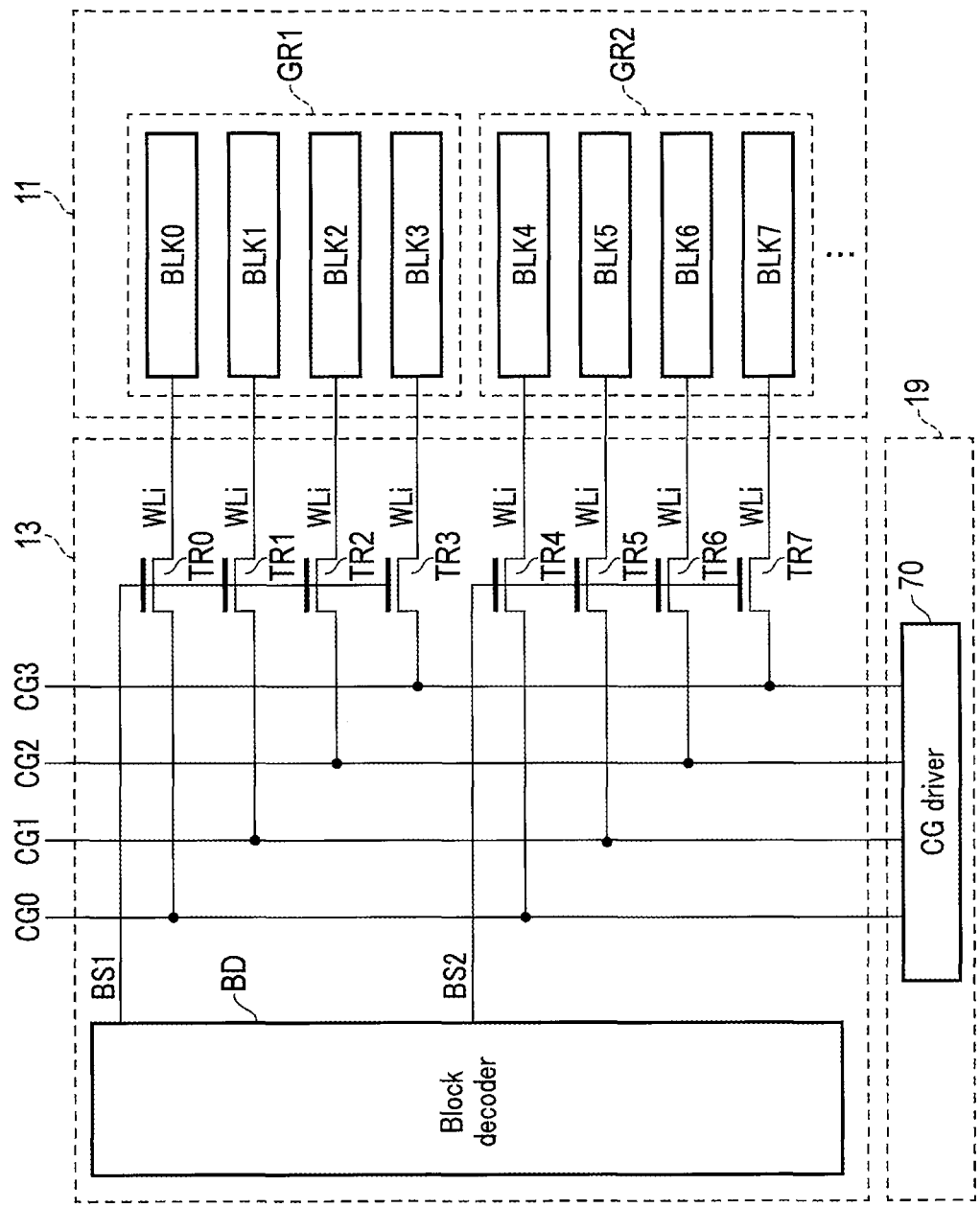
FIG. 24 is a circuit diagram showing a detailed example constitution of a row decoder module and a voltage generator contained in a NAND-type flash memory according to a fifth embodiment.

FIG. 24 shows detailed example constitution of a memory cell array 11, a row decoder module 13 and a voltage generator 19 in the fifth embodiment, and shows a constitution corresponding to one word line WLi (i is an integer of 0 or more and 7 or less) contained in each block BLK and provided in the same layer. As shown in FIG. 24, in the fifth embodiment, the memory cell array 11 includes memory block groups GRs, the row decoder module 13 includes transistors TRs and a block decoder BD, and the voltage generator 19 includes a CG driver 70.

Each memory block group GR includes, for example, four blocks BLKs. For example, the memory block groups GRs include a first memory block group GR1 and a second memory block group GR2, the first memory block group GR1 includes blocks BLK0 through BLK3, and the second memory block group GR2 includes blocks BLK4 through BLK7. It is to be noted that the number of the blocks BLKs included in each memory block group GR is not limited to this example, and may be designed to any number.

The transistors TRs are connected to different blocks BLKs, respectively. For example, the transistors TRs include transistors TR0 through TR7. One end of each of the transistors TR0 through TR7 is connected to the word line WLi of each of the blocks BLK0 through BLK7. The other ends of the transistors TR0 through TR3 are connected to signal lines CG0 through CG3, respectively, and a control signal BS1 is input into a gate of each of the transistors TR0 through TR3. The other ends of the transistors TR4 through TR7 are connected to the signal lines CG0 through CG3, respectively, and a control signal BS2 is input into a gate of each of the transistors TR4 through TR7.

The block decoder BD outputs the control signals BS1 and BS2 on the basis of address information stored in an address register 15B. The control signals BS1 and BS2 correspond to the memory block groups GR1 and GR2, respectively. That is, during various operations, the block decoder BD adjusts, to an "H"-level, the control signal BS corresponding to the memory block group GR including the block BLK to be selected, and adjusts the control signal BS corresponding to the other memory block group GR to an "L"-level. It is to be noted that FIG. 24 shows the control signals BS1 and BS2, but the block decoder BD may output a control signal BS corresponding to another memory block group GR.

The CG driver 70 may generate a voltage to be supplied to signal lines CG0 through CG3 during various operations. Furthermore, the CG driver 70 may generate different voltages for the respective signal lines CGs. During various operations, for example, the CG driver 70 applies any type of operation voltage (e.g., a read voltage) to the signal line CG corresponding to the selected block BLK, and applies a ground voltage VSS to the signal line CG corresponding to the non-selected block BLK.

It is to be noted that the constitution concerned with one word line WLi contained in each block BLK has been described above, but another wire contained in each block BLK has a constitution similar to the above constitution. For example, the row decoder module 13 includes transistors TR0, and one end of each of the different transistors TR0 is connected to each of word lines WL0 through WL7 contained in a block BLK0. Then, the control signal BS1 is input into gates of these transistors TR0, and the other ends of the transistors TR0 are connected to different signal lines CG0, respectively. The rest of constitution of the memory system 1 according to the fifth embodiment is similar to the constitution of the memory system 1 according to the first embodiment, and hence, description is omitted.

[5-2] Operation

FIG. 25 is a flow chart showing an example of a patrol operation in the memory system 1 according to the fifth embodiment. The flow chart is different from the flow chart described in the first embodiment with reference to FIG. 7 in that the processing of the step S12 is omitted and processing of steps S50 and S51 is inserted after the processing of step S11. It is to be noted that in the present operation, a patrol controller portion 50 manages a PATROLLED flag. The PATROLLED flag is given to each block, and is a flag indicating whether or not dummy read has already been executed (or, the dummy read operation is required). The PATROLLED flag is held, for example, in an internal memory 22, and in the patrol period, a block BLK to which "0 (a reset state)" is given indicates the block before the dummy read, and a block BLK to which "1 (a set state)" is given indicates the block after the dummy read or indicates that the dummy read is not required.

In the step S11, a processor 21 executes an operation based on a command from a host apparatus 2. For example, the processor 21 executes an erase operation, when receiving a command to execute garbage collection from the host apparatus 2 in step S10.

Next, in the step S11, the processor 21 determines whether or not the erase operation is executed (the step S50). When the erase operation is not executed (NO in the step S50), the processor 21 proceeds to step S13. The patrol controller portion 50 sets the PATROLLED flag of the block BLK subjected to the dummy read to "1", when the dummy read is executed in the step S13. Furthermore, when the erase operation is executed in the step S11 (YES in the step S50), the patrol controller portion 50 updates the PATROLLED flag in the patrol period (the step S51).

Specifically, the patrol controller portion 50 resets, to "0", the PATROLLED flag of the block other than the block BLK that is an erase target in a group of blocks BLKs included in the memory block group GR including the block BLK that is the erase target in the immediately preceding step S11. It is to be noted that when the blocks BLKs are erased blocks BLKs and do not hold any valid data, the PATROLLED flag may be maintained at "1".

The block BLK in which the PATROLLED flag is reset in the step S51 becomes a target for the dummy read again, even when the dummy read is executed to the block in the patrol period. Then, the block BLK in which the PATROLLED flag is reset is selected as the target for the dummy read, for example, in the next step S13. The present invention is not limited to this example, and the patrol controller portion 50 may execute the dummy read to the block BLK in which the PATROLLED flag is reset as soon as possible after the PATROLLED flag is reset.

It is to be noted that there has been described above the example where the processor 21 executes the erase operation on the basis of the command to execute the garbage collection from the host apparatus 2, but the present invention is not limited to this example. For example, even when the processor 21 executes an erase operation based on a garbage collection operation irrespective of the command from the host apparatus 2, the processor may proceed to the operation of the step S51 by determining, in the step S50, whether or not the erase operation is executed. Operations in the rest of steps shown in FIG. 25 is similar to the operation described in the first embodiment, and hence, description is omitted.

FIG. 26 shows an example of the patrol operation described above. FIG. 26 shows the example of the patrol operation to be applied to the constitution of the memory cell array 11 in the fifth embodiment, and shows states of the PATROLLED flags before and after the erase operation in the first memory block group GR1 and the second memory block group GR2.

As shown in FIG. 26, before the erase operation, the PATROLLED flags of the blocks BLK0 and BLK1 of the memory block group GR1 are "1", and the PATROLLED flags of the blocks BLK2 and BLK3 are "0". Furthermore, the PATROLLED flags of the blocks BLK4 to BLK7 of the memory block group GR2 are "1". Then, in the present example, the erase operation to the block BLK2 is executed in this state.

After the erase operation, "1" is initially set to the PATROLLED flag of the block BLK2 of the erase target. This is because there is no data to be targeted for reading in the block BLK2 after the erase operation. Then, the PATROLLED flags of the other blocks BLK0 and BLK1 in the memory block group GR including the block BLK2 of the erase target are reset to "0". It is to be noted that when the PATROLLED flag indicates "0" in the memory block group, the PATROLLED flag is still maintained at "0". Furthermore, as for the blocks BLKs included in other memory group GR, the PATROLLED flag is not updated.

Figure 28:
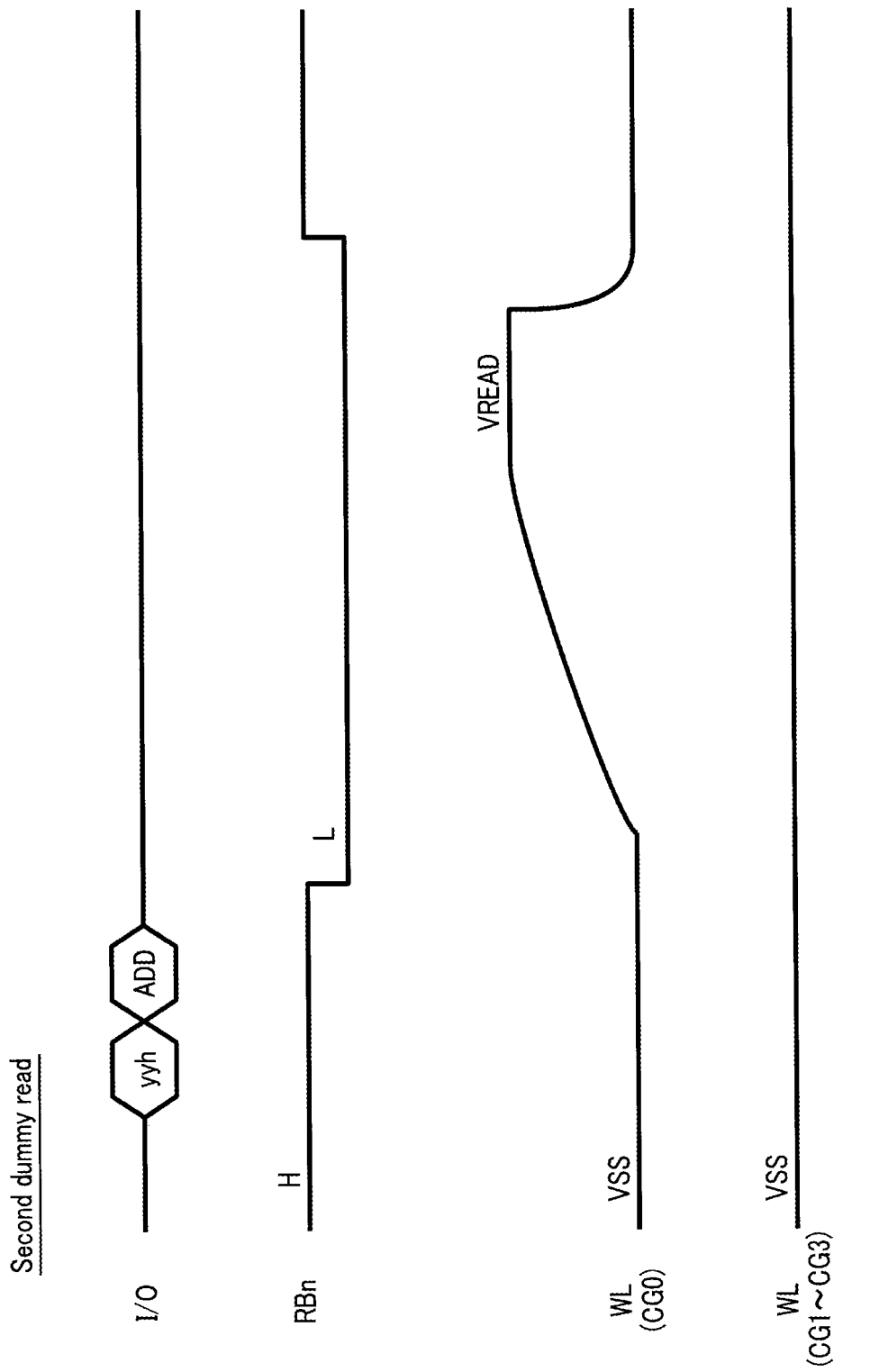
FIG. 28 is a diagram showing an example of each of a command sequence and a waveform of a second dummy read in the memory system according to the fifth embodiment.

Next, description will be made as to a waveform when a first dummy read and a second dummy read are executed in a NAND-type flash memory 10 of the fifth embodiment, with reference to FIG. 27 and FIG. 28. Each of FIG. 27 and FIG. 28 shows an example of each of a command sequence and a waveform in each of the first dummy read and the second dummy read. The first dummy read and the second dummy read are different from those described in the first embodiment with reference to FIG. 9 and FIG. 10, in waveform of the word line WL corresponding to each signal line CG.

For example, when the block BLK0 corresponding to the signal line CG0 is selected in the first dummy read shown in FIG. 27, a waveform of the word line WL connected to each signal line CG0 is similar to the waveform of the word line WL in FIG. 9. On the other hand, for example, the word line WL connected to each of the signal lines CG1 to CG3 corresponding to the non-selected block BLK is maintained at a ground voltage VSS in the first dummy read. The rest of operation of the first dummy read in the fifth embodiment is similar to the operation of the first dummy read described in the first embodiment with reference to FIG. 9, and hence, description is omitted.

For example, when the block BLK0 corresponding to the signal line CG0 is selected in the second dummy read shown in FIG. 28, a waveform of the word line WL connected to each signal line CG0 is similar to the waveform of the word line WL in FIG. 10. On the other hand, for example, the word line WL connected to each of the signal lines CG1 to CG3 corresponding to the non-selected block BLK is maintained at the ground voltage VSS in the second dummy read. The rest of operation of the second dummy read in the fifth embodiment is similar to the operation of the second dummy read described in the first embodiment with reference to FIG. 10, and hence, description is omitted.

It is to be noted that there has been described above the example where the PATROLLED flag is updated on the basis of the erase operation to the block BLK in the memory block group GR, but the present invention is not limited to this example. For example, the processor 21 may set "1" to the PATROLLED flag in the block BLK in which a read operation or a write operation is executed, when the read operation or the write operation is executed on the basis of the command from the host apparatus 2. This is because an effect similar to the effect of the dummy read can be expected in the read operation, and a verifying read operation in the write operation.

Figure 29:
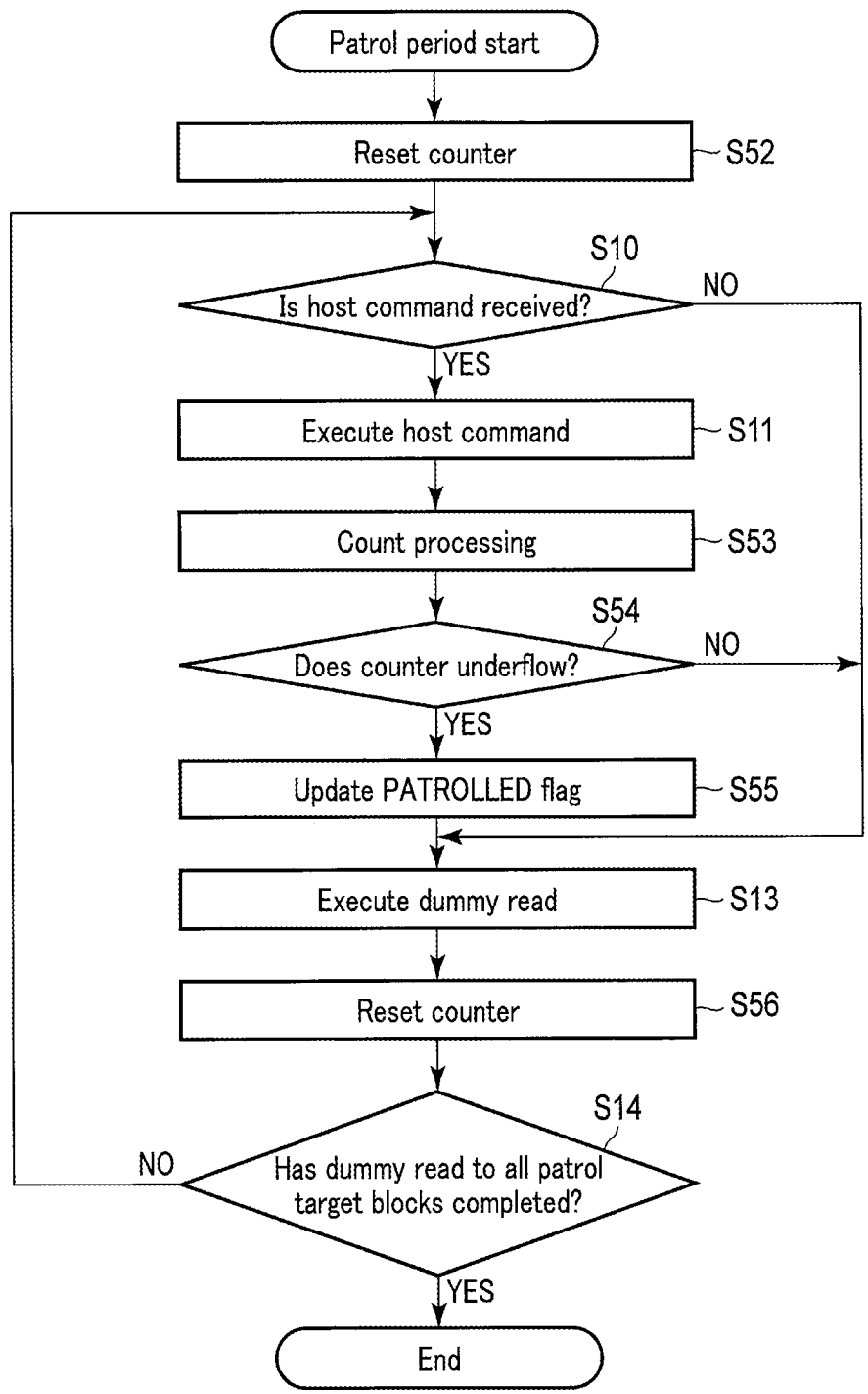
FIG. 29 is a flow chart showing an example of a patrol operation in a memory system according to a modified example of the fifth embodiment.

Furthermore, for example, the processor 21 may update the PATROLLED flag in the memory block group GR on the basis of the number of times of the erase operation, the read operation and the write operation included in the memory block group GR. Description will be made as to the present example with reference to FIG. 29. FIG. 29 is a flow chart showing an example of an operation in a memory system 1 according to a modified example of the fifth embodiment. The flow chart is different from the flow chart described in the first embodiment with reference to FIG. 7 in that the processing of the step S12 is omitted, processing of step S52 is inserted before the processing of the step S10, and processing of steps S53 through S56 is inserted after the processing of the step S11.

As shown in FIG. 29, when the patrol period starts, the patrol controller portion 50 initially resets a counter to a specified value (the step S52). This counter is associated with each block BLK, and held, for example, in the internal memory 22. Furthermore, the specified value of the counter may be set to any value. Hereinafter, description will be made as to an example where the specified value of the counter is 1000.

After the step S52, the processor 21 executes the processing of the steps S10 and S11. Then, after the step S11, the patrol controller portion 50 executes count processing (the step S53). Specifically, when the read operation, the write operation or the erase operation is executed in the processing of the step S11, the patrol controller portion 50 initially resets the counter with the selected block BLK to the specified value and sets the PATROLLED flag of the selected block BLK to "1". The reason why the counter is reset to the specified value is similar to the reason why the PATROLLED flag is set to "1". Specifically, an effect similar to the effect of the dummy read can be expected in each of the read operation and the verifying read operation in the write operation, and there is no data to be targeted for reading after the erase operation.

Then, in a memory block group GR of the selected block BLK, the patrol controller portion 50 performs decreasing the counters associated with the rest of the blocks BLKs in the memory block group GR (hereinafter referred to as the block(s) in the common group) on the basis of the operation executed in the selected block BLK in the step S11.

For example, when one erase operation (in a block BLK unit) is executed in the selected block BLK, the patrol controller portion 50 subtracts 1000 from a value of the counter with the block BLK of the common group. When one write operation (in a word line WL unit) is executed in the selected block BLK, the patrol controller portion 50 subtracts 10 from the value of the counter with the block BLK of the common group. When one read operation is executed, the patrol controller portion 50 subtracts 1 from the value of the counter with the block BLK of the common group. It is to be noted that the value to be subtracted from the value of the counter by the patrol controller portion 50 on the basis of various operations is merely an example, and any value may be set.

Next, the patrol controller portion 50 determines whether there is the block BLK with which the counter underflows (the step S54). When there is no block BLK with which the counter underflows (NO in the step S54), the patrol controller portion 50 proceeds to processing of step S13. When there is a block BLK with which the counter underflows (YES in the step S54), the patrol controller portion 50 resets, to "0", the PATROLLED flag of the block BLK with which the counter underflows (the step S55), and sets the block as the target for the dummy read again.

Then, when the dummy read is executed in the step S13, the patrol controller portion 50 resets, to the specified value, the counter with the block BLK subjected to the dummy read, and sets the PATROLLED flag to "1" (the step S56). It is to be noted that, for example, the block BLK in which the PATROLLED flag is reset is the target for the dummy read in the step S13 to be executed next. Operations in the rest of the steps shown in FIG. 29 is similar to the operation described in the first embodiment, and hence, description is omitted.

Additionally, there has been described above the example where, when the write operation is executed in the processing of the step S11, the patrol controller portion 50 resets the counter with the selected block BLK to the specified value and sets the PATROLLED flag of the selected block BLK to "1" in the step S53, but the present invention is not limited to this example. For example, the write operation executed in the processing of the step S11 is occasionally a write operation performed without executing a verifying operation after a program pulse is last applied. In this case, for example, the patrol controller portion 50 may set the counter with the block to underflow to 0 or less, and reset the PATROLLED flag to "0". This is because a memory cell transistor MT in the block BLK is in a first state, when the write operation ends in a state where the program pulse is last applied.

[5-3] Effect of Fifth Embodiment

According to the memory system 1 of the above-mentioned fifth embodiment, it is possible to inhibit drop of an operation speed. Hereinafter, description will be made as to a detailed effect of the memory system 1 according to the fifth embodiment.

For example, in a case where the NAND-type flash memory 10 has such a constitution as shown in FIG. 24 and the read operation, the write operation, the erase operation or the like is executed to a certain block BLK in the memory block group GR, a threshold voltage of the memory cell transistor MT included in each block BLK of the group GR occasionally fluctuates. This fluctuation of the threshold voltage is caused by a change of the state of the memory cell transistor MT due to the voltage applied to the memory cell transistor MT in the same manner as in the creep up phenomenon described in the first embodiment.

To solve such a problem, in the memory system 1 according to the fifth embodiment, the patrol controller portion 50 resets the PATROLLED flag of the block BLK included in the memory block group GR, when the erase operation is executed in the certain block BLK of the memory block group GR. That is, the patrol controller portion 50 also resets the PATROLLED flag of the block BLK subjected to the dummy read, to set the block as the target for the dummy read in the patrol period again.

Consequently, in the memory system 1 according to the fifth embodiment, the memory cell transistor MT changed from a second state by the erase operation can transition to the second state again. Therefore, in the memory system 1 according to the fifth embodiment, it is possible to suppress read errors due to the fluctuation of the threshold voltage which is caused by the erase operation, and hence, it is possible to inhibit the drop of the operation speed of the memory system 1.

[6] Sixth Embodiment

In a memory system 1 according to a sixth embodiment, the number of blocks to be selected during a second dummy read is set on the basis of power consumption information received from a host apparatus 2. Hereinafter, description will be made as to differences of the memory system 1 according to the sixth embodiment from the first through fifth embodiments.

[6-1] Constitution

FIG. 30 shows detailed example constitution of the host apparatus 2 and a processor 21 in a case where the number of the blocks to be selected during the second dummy read is set on the basis of the power consumption information. As shown in FIG. 30, in the sixth embodiment, the host apparatus 2 stores power consumption information 61, and the processor 21 further functions as a partition setting portion 53.

The power consumption information 61 is information obtained by estimating power consumption of the memory system 1, and is set beforehand, for example, on the basis of a combination of the host apparatus 2 and the memory system 1, a performance of the memory system 1, a standard of a host interface circuit 23, or the like. Then, the power consumption information 61 is transmitted to the memory system 1, for example, at a startup time of the memory system 1.

The partition setting portion 53 sets block partition (or block grouping) on the basis of the power consumption information 61 received via the host interface circuit 23. Specifically, the partition setting portion 53 changes the number of the partitions obtained by dividing a memory cell array 11 of a NAND-type flash memory 10, on the basis of the power consumption information 61, and assigns a partition ID to a physical block address of each block BLK. FIG. 31 shows an example where the memory cell array 11 includes 1024 blocks BLKs and the 1024 blocks are divided into 16 partitions. FIG. 31 is a table showing an example of a relation between partition IDs and physical block addresses in the memory system 1.

In a case where 1024 blocks BLKs are divided into 16 partitions, the number of the blocks BLKs contained in one partition is 64, and hence, as shown in FIG. 31, a partition ID "1" is assigned to physical block addresses "0" through "63", and a partition ID "2" is assigned to physical block addresses "64" through "127". Afterward, the partition IDs are also similarly assigned to the physical block addresses.

[6-2] Operation

Figures 32, 33:
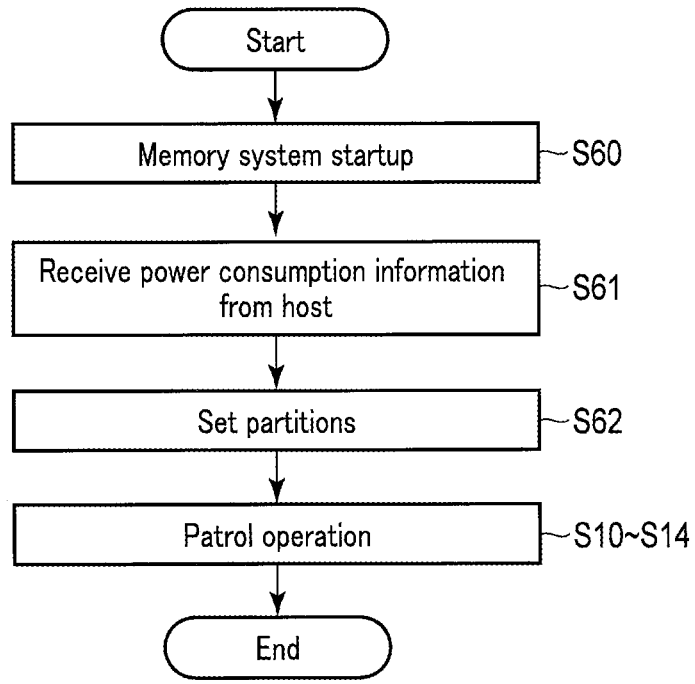
FIG. 32 is a flow chart showing an example of a patrol operation in the memory system according to the sixth embodiment.
FIG. 33 is a table showing a relation between an installation example of partitions and power consumption during a second dummy read in the memory system according to the sixth embodiment.

FIG. 32 is a flow chart showing an example of a patrol operation in the memory system 1 according to the sixth embodiment, and shows an operation example of the memory system 1 in the case of setting the partitions based on the power consumption information 61.

As shown in FIG. 32, the memory system 1 starts up on the basis of an operation by the host apparatus 2, an operation by a user, or the like (step S60). At the startup time of the memory system 1, the host apparatus 2 transmits the power consumption information 61 to the memory system 1, and the memory system 1 receives the power consumption information 61 (step S61). Specifically, the power consumption information 61 transmitted by the host apparatus 2 is stored, for example, in an internal memory 22 via the host interface circuit 23. It is to be noted that a storage area in which the power consumption information 61 is stored is not limited to this example, and may be, for example, the DRAM 3.

Next, the partition setting portion 53 sets the partitions on the basis of the received power consumption information 61 (step S62). FIG. 33 shows examples of the setting of the partitions and a relation between the number of selected blocks and the power consumption when the second dummy read is executed.

As shown in FIG. 33, for example, in a case where the partition setting portion 53 divides 1024 blocks BLKs into 128, 64, 32, or 16 partitions, the number of the selected blocks during the second dummy read is 8, 16, 32, or 64, respectively. In the second dummy read, as the number of the blocks BLKs to be selected increases, a charging time of the word line WL lengthens. Therefore, the power consumption increases. To solve such a problem, the partition setting portion 53 selects the small number of the partitions to increase the number of the blocks to be simultaneously selected (i.e., activated at once), with reference to the power consumption information 61 and the information shown in FIG. 33 in the step S62, in a case where the memory system 1 allows a large power consumption. On the other hand, in a case where the memory system 1 only allows only a small power consumption, the partition setting portion 53 selects the large number of the partitions to decrease the number of the blocks to be simultaneously selected. That is, the partition setting portion 53 sets the partitions so that the power consumption in the case of selecting the number of blocks BLKs in a unit of partition during the second dummy read falls in budget of the power consumption in the memory system 1. A table including information concerning the partitions set at this time may be stored in the internal memory 22 or the DRAM 3.

Next, for example, a patrol controller portion 50 executes the patrol operation of the steps S10 through S14 described in the first embodiment with reference to FIG. 7. Then, a patrol controller portion 50 designates the set partitions, when the second dummy read is executed in the step S13. Then, a sequencer 17 of the NAND-type flash memory 10 selects the partition, to execute the second dummy read to the block BLK included in the partition. That is, the sequencer 17 executes the second dummy read in the unit of partition.

It is to be noted that there has been described above the example where the processing of the steps S10 through S14 is executed after the processing of the step 62, but the present invention is not limited to this example. For example, after the processing of the step S62, any operation described in the first through fifth embodiments is applicable.

[6-3] Effect of Sixth Embodiment

As described above, in the memory system 1 according to the sixth embodiment, the partitions are set on the basis of a usable power consumption of the memory system 1, and the second dummy read is executed in the unit of partition during the patrol operation.

Consequently, in the memory system 1 according to the sixth embodiment, it is possible to execute the second dummy read to the number of the selected blocks which is most suitable for the budget of the power consumption of the memory system 1. Furthermore, in the memory system 1 according to the sixth embodiment, the patrol operation can be executed without exceeding the budget of the power consumption, and hence, a stable operation can be performed.

Furthermore, in the memory system 1 according to the sixth embodiment, it is possible to execute the second dummy read to the blocks BLK of all patrol targets at the startup time of the memory system 1. Consequently, in the memory system 1 according to the sixth embodiment, it is possible to cause a memory cell transistor MT to transition from a first state to a second state in early stages after the startup of the memory system 1. Therefore, in the memory system 1 according to the sixth embodiment, it is possible to suppress deterioration of latency during a read operation after the startup of the memory system 1, and it is possible to inhibit drop of an operation speed.

[7] Seventh Embodiment

A memory system 1 according to a seventh embodiment is different from the memory system 1 according to the sixth embodiment in that a processing order for a dummy read operation (may be simply referred to as a dummy read order) is set on the basis of priority information received from a host apparatus 2. Hereinafter, description will be made as to differences of the memory system 1 according to the seventh embodiment from the first through sixth embodiments.

[7-1] Constitution

FIG. 34 shows detailed example constitution of the host apparatus 2 and the memory system 1 in a seventh embodiment. As shown in FIG. 34, according to the seventh embodiment, the host apparatus 2 further stores priority information 62, and a priority decision portion 52 described in the fourth embodiment with reference to FIG. 20 further has a different function.

The priority information 62 includes information of a logical block address LBA corresponding to a block BLK to which a dummy read is to be preferentially executed, in an initial patrol operation after startup of the memory system 1. Then, the priority information 62 is transmitted from the host apparatus 2 to the memory system 1, for example, at a startup time of the memory system 1. It is to be noted that the host apparatus 2 may store multiple pieces of priority information 62, and transmit the multiple pieces of priority information to the memory system 1. In a case where the multiple pieces of priority information 62 are transmitted to the memory system 1, a priority order of each piece of priority information 62 may beforehand be determined, or the priority decision portion 52 may determine the priority order of each of the multiple pieces of priority information 62 on the basis of the order of the multiple pieces of information transmitted to the memory system 1.

The priority decision portion 52 determines a patrol priority on the basis of the priority information 62 received via a host interface circuit 23. This patrol priority is for use in the decision of a processing order for the dummy read in the initial patrol operation after the startup of the memory system 1. Then, a patrol controller portion 50 executes the initial patrol operation in the processing order for the dummy read based on the priority determined by the priority decision portion 52. The rest of constitution of the memory system 1 according to the seventh embodiment is similar to the constitution of the memory system 1 according to the sixth embodiment, and hence, description is omitted.

[7-2] Operation

Figures 35, 36:
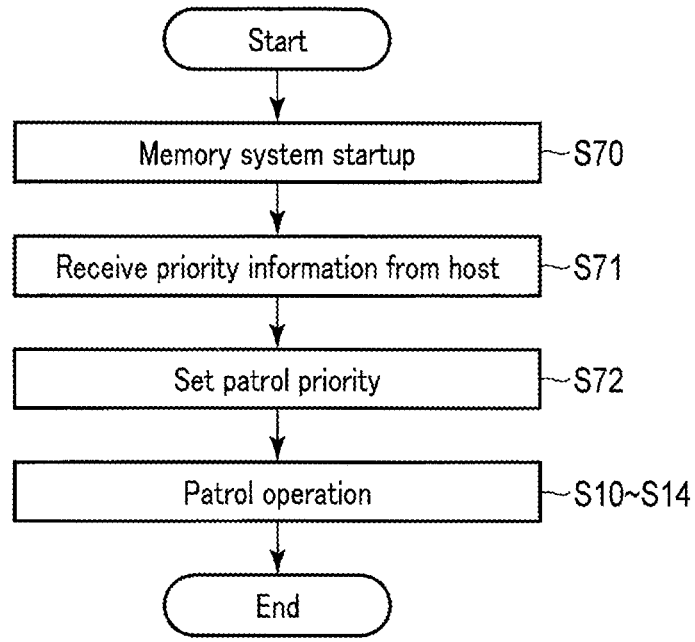
FIG. 35 is a flow chart showing an example of a patrol operation in the memory system according to the seventh embodiment.
FIG. 36 is a table showing an example of first priority information in the memory system according to the seventh embodiment.

FIG. 35 is a flow chart showing an example of the patrol operation in the memory system 1 according to the seventh embodiment, and shows an operation example of the memory system 1 in a case where the processing order for the dummy read is determined on the basis of the priority information 62 in the patrol operation.

As shown in FIG. 35, the memory system 1 starts up on the basis of an operation by the host apparatus 2, an operation by a user, or the like (step S70). At the startup time of the memory system 1, the host apparatus 2 transmits the priority information 62 to the memory system 1, and the memory system 1 receives the priority information 62 (step S71). For example, the priority information 62 transmitted by the host apparatus 2 is stored in an internal memory 22 via the host interface circuit 23. It is to be noted that a storage area in which the priority information 62 is stored is not limited to this example. The DRAM 3 may store the priority information 62.

Next, the priority decision portion 52 determines the patrol priority on the basis of the received priority information 62 (step S72). Then, for example, the patrol controller portion 50 executes the patrol operation of the steps S10 through S14 described in the first embodiment with reference to FIG. 7 in the processing order for the dummy read based on the patrol priority.

Here, description will be made as to an operation example where the memory system 1 receives first priority information and second priority information in the step S71, with reference to FIG. 36 through FIG. 39. FIG. 36 and FIG. 37 show examples of information based on the first priority information and the second priority information, respectively, and FIG. 38 and FIG. 39 show examples of methods of setting the patrol priorities based on the first priority information and the second priority information, respectively.

In the present example, different logical block addresses LBAs are designated in the first priority information and the second priority information, respectively, and a priority order of the first priority information is set to be higher than a priority order of the second priority information. Furthermore, in the present embodiment, there is a described example where the partition setting portion 53 described in the sixth embodiment divides 1024 blocks BLKs into 16 partitions. In this case, for example, physical block addresses PBAs corresponding to a partition ID "1" are "0 through 63", and physical block addresses PBAs corresponding to a partition ID "2" are "64 through 127". Afterward, the partitions are similarly set, and physical block addresses PBAs corresponding to a partition ID "16" are "960 through 1023".

As shown in FIG. 36 and FIG. 37, the priority decision portion 52 associates the physical block address PBA with the logical block address LBA designated by the first priority information and the second priority information, and further associates the partition IDs corresponding to the physical block addresses PBAs. For example, a look up table (LUT) is used in associating the logical block address LBA with the physical block address PBA.

As shown in FIG. 36, the first priority information designates logical block addresses LBAs "11" through "20". For example, the logical block addresses LBAs "11" and "12" are associated with physical block addresses PBAs "1012" and "1013", respectively, and hence, the addresses correspond to partition ID "16". The logical block addresses LBAs "13" and "14" are associated with physical block addresses PBAs "64" and "65", respectively, and hence, the addresses correspond to partition ID "2". Afterward, the priority decision portion 52 similarly associates the logical block address LBA and the physical block address PBA with the partition ID on the basis of the first priority information.

As shown in FIG. 37, the second priority information designates logical block addresses LBAs "100" through "109". For example, the logical block addresses LBAs "100" through "104" are associated with physical block addresses PBAs "200" through "204", respectively, and hence, the addresses correspond to partition ID "4". Afterward, the priority decision portion 52 similarly associates the logical block address LBA and the physical block address PBA with the partition ID on the basis of the second priority information.

Then, the priority decision portion 52 initially determines the processing order for the dummy read operation on the basis of the first priority information. Specifically, as shown in FIG. 38, the priority decision portion 52 calculates the patrol priority for each partition. The patrol priority indicates the number of the physical block addresses PBAs corresponding to the logical block addresses LBAs designated by the priority information, in each partition. For example, it is indicated that the partition with patrol priority value "0" does not include the physical block address PBA corresponding to the logical block address LBA designated by the priority information, and the partition is excluded from patrol operation targets. On the other hand, it is indicated that the partition with a patrol priority value larger than "0" includes the physical block address corresponding to the logical block address LBA designated by the priority information, and the partition is the patrol operation target.

As shown in FIG. 38, for example, the partition ID "1" includes two physical block addresses PBAs corresponding to the logical block addresses LBAs designated by the first priority information shown in FIG. 36. At this time, the priority decision portion 52 determines that the patrol priority of the partition ID "1" is "2". The partition ID "2" includes four physical block addresses PBAs corresponding to the logical block addresses LBAs designated by the first priority information, and hence, the priority decision portion 52 determines that the patrol priority of the partition ID "2" is "4". Afterward, the priority decision portion 52 similarly calculates patrol priority values corresponding to other partitions.

Next, the patrol controller portion 50 executes the patrol operation on the basis of the first priority information. Specifically, the patrol controller portion 50 executes the second dummy read to the partition with the patrol priority value larger than "0" in a unit of partition. Then, the patrol controller portion 50 updates a PATROLLED flag of the partition subjected to the second dummy read from "0" (before the dummy read) to "1" (after the dummy read). It is to be noted that the patrol controller portion 50 may determine the order of the execution of the second dummy read based on the first priority information, on the basis of a value of the patrol priority. For example, the patrol controller portion 50 executes the second dummy read to the partitions in order of patrol priority from higher to lower (e.g., from smaller patrol priority value to larger patrol priority value).

Next, the priority decision portion 52 determines the processing order for the dummy read operation on the basis of the second priority information. As shown in FIG. 39, for example, partition ID "2" includes three physical block addresses PBAs corresponding to the logical block addresses LBAs designated by the second priority information shown in FIG. 37, and hence, the priority decision portion 52 determines that the patrol priority of the partition ID "2" is "3". Partition ID "4" includes five physical block addresses PBAs corresponding to the logical block addresses LBAs designated by the second priority information, and hence, the priority decision portion 52 determines that the patrol priority of the partition ID "4" is "5". Afterward, the priority decision portion 52 similarly calculates patrol priority values corresponding to other partitions.

Then, the patrol controller portion 50 executes the patrol operation on the basis of the second priority information. Specifically, the patrol controller portion 50 executes the second dummy read to the partition with the patrol priority value larger than "0" and the PATROLLED flag of "0" in the unit of partition. Then, the patrol controller portion 50 updates the PATROLLED flag of the partition subjected to the second dummy read from "0" (before the dummy read) to "1" (after the dummy read).

It is to be noted that the patrol controller portion 50 may execute the second dummy read to the partitions In order of patrol priority from higher to lower, in the patrol operation based on the priority information. In this case, the patrol controller portion 50 executes the second dummy read on partitions in the order of patrol priority associated with each partition from higher to lower (e.g., in the order of patrol priority value from larger to smaller).

Furthermore, there has been described above the example where the processing order for the dummy read operation is determined on the basis of the second priority information, after the patrol operation based on the first priority information is executed, but the present invention is not limited to this example. For example, the priority decision portion 52 initially calculates the priority of each partition on the basis of the first priority information and the second priority information. Then, the patrol controller portion 50 may execute the second dummy read on the basis of the priority determined by the priority decision portion 52.

Furthermore, the patrol controller portion 50 may change a dummy read process on the basis of the patrol priority as shown in FIG. 40. FIG. 40 shows an example of a method of selecting the dummy read process based on the first priority information, and shows an example where the first dummy read is executed when the patrol priority value is less than "3" and the second dummy read is executed when the patrol priority value is not less than "3".

As shown in FIG. 40, in the patrol operation based on the first priority information, the patrol controller portion 50 executes the first dummy read to the block BLK corresponding to the partition ID "1" in which the patrol priority is "2". This first dummy read may continuously be executed until the dummy read to all the blocks BLKs included in the partition is completed, or the first dummy read may be executed only to the block BLK corresponding to the physical block address PBA which corresponds to the logical block address LBA designated by the first priority information. Furthermore, the patrol controller portion 50 executes the second dummy read to the block BLK corresponding to the partition ID "2" in which the patrol priority is "4". For this second dummy read, for example, all the blocks BLKs included in the partition are selected, to execute the second dummy read to the selected blocks. Then, for example, an order similar to the order described with reference through FIG. 36 to FIG. 39 is applied as the processing order for the dummy read operation in the present example.

In the operation of the memory system 1 according to the above-mentioned seventh embodiment, there has been described the example where the priority of the patrol operation is determined on the basis of the priority information received from the host apparatus 2, but the present invention is not limited to this example. For example, the priority decision portion 52 may determine the priority for the patrol operation on the basis of an access pattern in the previous (e.g., last) startup of the memory system 1.

Specifically, a processor 21 initially captures the access pattern after a startup of the memory system 1, and stores data of this access pattern, for example, in a NAND-type flash memory 10. Then, at the next startup time of the memory system 1, the processor 21 reads the data of the access pattern from the NAND-type flash memory 10. Then, for example, in the processing of the step S72 described with reference to FIG. 35, the priority decision portion 52 updates the patrol priority of each partition on the basis of read information of the access pattern. The rest of operation is similar to the operation described with reference to FIG. 35, and hence, description is omitted.

It is to be noted that there has been described above the example where the processing of the steps S10 through S14 is executed after the processing of the step S72, but the present invention is not limited to this example. For example, any operation described in the first through fifth embodiments is applicable after the processing of the step S72. Alternatively, the operation described in the seventh embodiment may be combined with the operation described in the sixth embodiment. In this case, the processing of the step S62 described in the sixth embodiment with reference to FIG. 32 is inserted, for example, before or after the step S72.

Furthermore, there has been described above the example where the logical block address LBA corresponds to the physical block address PBA on a one-to-one basis, but the present invention is not limited to this example. For example, one physical block address PBA may correspond to multiple logical block addresses LBAs. Also in this case, the priority decision portion 52 may calculate the patrol priority value on the basis of the number of the physical block addresses PBAs which correspond to the logical block addresses LBAs designated by the priority information and which are included in each partition.

Additionally, there has been described above the example where the priority decision portion 52 determines the priority of the patrol operation on the basis of the number of the physical block addresses PBAs corresponding to the logical block addresses LBAs designated by the priority information 62, but the present invention is not limited to this example. For example, the priority decision portion 52 may determine the priority of the patrol operation on the basis of the number of the logical block addresses LBAs designated by the priority information 62.

It is to be noted that a timing for the host apparatus 2 to transmit the priority information 62 is not limited to a timing of the startup of the memory system 1, but may be a timing of a normal operation. "The timing of a normal operation of the memory system 1" corresponds to an operation state of the memory system 1, for example, after the startup operation of the memory system 1 has been completed. In other words, "the timing of a normal operation" corresponds to a period when the memory system 1 can execute an operation based on a command from the host apparatus after the memory system 1 has started up. When the priority information 62 is received during the normal operation, the memory system 1 refers to this priority information 62, for example, at the next startup. Alternatively, the memory system 1 may set the patrol priority for the next startup, when receiving the priority information 62 during the normal operation. In this case, at the next startup, the memory system 1 refers to the patrol priority set beforehand during the previous (e.g., last) operation in terms of power cycle.

[7-3] Effect of Seventh Embodiment

According to the memory system 1 of the above-mentioned seventh embodiment, it is possible to execute the dummy read in order of importance from higher to lower after the startup of the memory system 1. Hereinafter, description will be made as to a detailed effect of the memory system 1 according to the seventh embodiment.

For example, the data stored in the memory system 1 includes management data of the memory system 1, and user data. The management data is invisible from the host apparatus 2, and includes, for example, the LUT. The user data is accessible by the host apparatus 2, and includes, for example, a boot record, an OS (operating system) image, application data, and archive data. For example, the management data of the memory system 1 is accessed internally earlier than the user data, during startup processing of the memory system 1 and the host apparatus 2. Furthermore, the boot sector and OS image of the user data are accessed earlier than the application data or the archive data. In this way, the data accessed in such an early stage has a high importance, and it is preferable to cause the memory cell transistor MT of the block BLK including the data to transition to the second state as soon as possible.

Thus, in the memory system 1 according to the seventh embodiment, the patrol operation after the startup of the memory system 1 is executed on the basis of the priority information 62 received from the host apparatus 2. Specifically, the host apparatus 2 transmits, to the memory system 1, the priority information 62 in which the blocks BLKs required to be accessed in the early stage are designated. For example, the priority information 62 includes the information of the logical block address LBA corresponding to the block BLK in which the boot record and OS image of a comparatively high importance are stored. Then, the memory system 1 updates the patrol priority of each partition on the basis of the received priority information 62, and executes the dummy read partitions in order of priority associated with each partition from higher to lower in an initial patrol operation after the startup.

Consequently, in the memory system 1 according to the seventh embodiment, the memory cell transistor MT of the partition including the block BLK of high importance can be transitioned to the second state early during the startup processing of the memory system 1. Therefore, in the memory system 1 according to the seventh embodiment, it is possible to inhibit deterioration of latency during the read operation after the startup of the memory system 1, and it is possible to inhibit drop of an operation speed.

It is to be noted that in the seventh embodiment, there has been described above the example where the priority information 62 designates the block BLK in which the patrol priority is to be raised, by using the logical block address LBA, but the present invention is not limited to this example. For example, the priority information 62 may designate the logical block address LBA to raise the patrol priority, by using namespace IDs. For example, in a case where the namespace ID which corresponds to a namespace including the OS image is designated by the priority information 62, the patrol operation in the memory system 1 is executed for the block BLK corresponding to the namespace including the OS image after the startup, prior to the block BLK corresponding to the namespace storing the archive data.

It is to be noted that in the memory system 1 according to the seventh embodiment, it is possible to update the patrol priority on the basis of the namespace ID designated by the host apparatus 2. For example, the host apparatus 2 selects and properly uses the data (the OS image, the archive data or the like) to be stored in each namespace. Then, the host apparatus 2 instructs the memory system 1 on the namespace to which a higher priority is to be set for the memory system 1 (e.g., the namespace in which the OS image is stored) by using the namespace ID. Consequently, in the memory system 1, it is possible to update the patrol priority to the partition (the physical block address PBA) in each namespace by using the logical block address LBA which belongs to the namespace.

[8] Modified Examples

A memory system (For example, 1, FIG. 1) of the embodiment includes a semiconductor memory (For example, 10, FIG. 1) and a controller (For example, 20, FIG. 1). The semiconductor memory includes blocks each containing memory cells. The controller is configured to instruct the semiconductor memory to execute a first operation (For example, a first dummy read, FIG. 9) and a second operation (For example, a second dummy read, FIG. 10). In the first operation and the second operation, the semiconductor memory selects at least one of the blocks, and applies at least one voltage to all memory cells contained in said selected blocks. A number of blocks to which said voltage is applied per unit time in the second operation is larger than that in the first operation. In consequence, there can be provided the memory system capable of inhibiting drop of an operation speed.

It is to be noted that in the above embodiments, there has been described the example where the memory controller 20 executes the patrol operation to a NAND-type flash memory 10, but the present invention is not limited to this example. For example, in a case where the memory system 1 comprises the NAND-type flash memory 10, the memory controller 20 may execute the patrol operation to each of the NAND-type flash memory 10. Alternatively, the memory controller 20 may execute the patrol operation to the NAND-type flash memory 10 in sequential, or may execute the patrol operations in parallel in the NAND-type flash memory chips 10.

It is to be noted that any combination of various operations described in the above embodiments may be executed. For example, a combination of the patrol operation described in the first embodiment and the patrol operation described in the third embodiment may be executed. In this case, the memory system 1 sets a patrol period on the basis of temperature information, and suitably changes a patrol processing rate in each patrol period to execute the dummy read.

It is to be noted that in the above embodiment, the voltage to be applied to the word line WL of the selected block BLK in the second dummy read may be different from the read pass voltage VREAD for use in a write mode applied to the block BLK. In a case where a creep up phenomenon having about the same degree as in a normal read operation is caused by the second dummy read, for example, the row decoder module 13 may apply, to the word line WL, a voltage in a range of VREAD in the SLC mode to VREAD in the TLC mode. In a case where read disturb caused by the application of the voltage in the second dummy read is to be decreased, for example, the row decoder module 13 may apply a voltage lower than VREAD in the SLC mode to the word line WL as long as the effect of the dummy read is not lost. Consequently, it is possible to suitably change the setting of the voltage applied to the word line WL of the selected block BLK in the second dummy read.

It is to be noted that in the sixth embodiment, there has been described the example where the second dummy read to the blocks BLKs of all the patrol target blocks is executed at the startup time of the memory system 1, but the present invention is not limited to this example. For example, the patrol controller portion 50 may execute the first dummy read to the blocks BLKs of all the patrol target blocks at the startup time of the memory system 1. Also in this case, in the memory system 1, it is possible to inhibit the deterioration of the latency during the read operation after the startup of the memory system 1, and it is possible to inhibit the drop of the operation speed. Furthermore, in the sixth embodiment, there has been described the example where the first or second dummy read is executed to the block BLK of the patrol target, but the present invention is not limited to this example. For example, during the startup processing of the memory system 1, the patrol controller portion 50 may execute the first or second dummy read to all the blocks BLKs.

It is to be noted that in the above description, "the blocks BLKs of all the patrol targets" may be all the patrol target blocks BLKs in the memory system 1, all the blocks BLKs in which an address conversion table to convert a logical address and a physical address is stored, or all the blocks BLKs including at least one piece of valid user data. Alternatively, for example, the block BLK of a high importance at the startup time of the memory system 1 may be set to the patrol target block BLK at the startup time of the memory system 1. In this way, for example, the patrol target block BLK at the startup time of the memory system 1 may suitably be changed.

It is to be noted that in the present description, "valid user data" means data stored in a block BLK corresponding to a physical block address associated with a logical block address, i.e., the physical block address PBA referred to by the address conversion table to convert from the logical block address to the physical block address.

It is to be noted that in the seventh embodiment, there has been described the example where the memory system 1 updates the patrol priority on the basis of the priority information 62 received from the host apparatus 2, but the present invention is not limited to this example. For example, the memory system 1 may update the patrol priority at a startup time, irrespective of the command from the host apparatus 2. Hereinafter, description will be made as to an operation of a memory system 1 in the present modified example.

For example, in the memory system 1, it is possible to update the patrol priority on the basis of the access pattern after the previous (e.g., last) startup. In this case, for example, in the memory system 1, information concerning the access pattern from the host apparatus 2 in a predetermined period after the startup is stored in the NAND-type flash memory 10. Then, at the next startup, in the memory system 1, the information concerning this access pattern is read from the NAND-type flash memory 10, and, for example, the patrol priority of the block BLK accessed early after the previous startup is raised. Alternatively, the memory system 1 may update the patrol priority on the basis of the order of the blocks BLKs accessed by the host apparatus 2.

Furthermore, in the memory system 1, it is possible to update the patrol priority on the basis of a type of data stored in each block BLK. In this case, in the memory system 1, for example, a priority of the patrol operation in the block BLK in which the management data (especially, the address conversion table) is stored is set to be higher than that in the block BLK in which the user data is stored.

The above-mentioned methods of updating the priority of the patrol operation irrespective of the instruction of the host apparatus 2 may be separately executed or may be executed together. Consequently, in the memory system 1 according to the present modified example, for example, it is possible to raise the patrol priority of a hidden block BLK which is required to be accessed internally in an early stage but which cannot be designated with the priority information 62 by the host apparatus 2. Therefore, according to the memory system 1 of the present modified example, it is possible to further inhibit the deterioration of the latency during the read operation after the startup of the memory system 1, and it is possible to further inhibit the drop of the operation speed.

It is to be noted that in the above embodiment, there has been described the example where the read operation of the SLC mode is applied as the first dummy read, but the present invention is not limited to this example. For example, in the first dummy read, a read operation corresponding to an upper page in the MLC mode or a read operation corresponding to a lower page may be applied. In this way, the read operation of any system is applicable to the first dummy read.

It is to be noted that the number of the blocks to be simultaneously selected (i.e., activated) in the second dummy read described in the above embodiment may be changed by setting the NAND-type flash memory 10. FIG. 41 shows an example of a command sequence of a set feature to perform such setting modification. As shown in FIG. 41, the memory controller 20 initially issues a set feature command "EFh", and transmits the command to the NAND-type flash memory 10. The command "EFh" is issued to instruct the NAND-type flash memory 10 to change a parameter. Next, the memory controller 20 issues the address information ADD, and transmits the information to the NAND-type flash memory 10. This address information ADD designates an address corresponding to the parameter to be changed. Next, the memory controller 20 outputs setting data Din to the NAND-type flash memory 10 over several cycles. The data Din output herein is data corresponding to the parameter to be changed. Then, the sequencer 17 controls the sense amplifier module 12, the row decoder module 13, or the like to start the set feature process. When the set feature starts, the parameter setting in the NAND-type flash memory 10 is updated with the specified data. A period denoted with tSet in the drawing is a period in which this set feature process is performed. When the set feature process ends, for example, there is applied setting modification of the number of the blocks to be simultaneously selected in the second dummy read of the NAND-type flash memory 10.

It is to be noted that in the above embodiment, there has been described the example where various operations are executed in software, but the present invention is not limited to this example. For example, a part of processing may be achieved with dedicated hardware, or all of the processing may be achieved with dedicated hardware. For example, in the patrol operation, a circuit which functions as the patrol controller portion 50 may be employed. This also applies to the rest of processing. Such hardware may be contained in the memory controller 20 or externally connected.

It is to be noted that in the above embodiment, the waveform of the word line WL has been described in the first dummy read and the second dummy read, but a waveform of the corresponding signal line CG is also similar to the waveform of the word line WL. That is, the voltage being applied to the word line WL and a period in which the voltage is applied to the word line WL can roughly be known by observing a voltage of the corresponding signal line CG. It is to be noted that an influence of voltage drop by the transistor TR may appear between the voltage of the word line WL and the voltage of the signal line CG.

It is to be noted that in the above embodiment, there has been described the example where the MONOS film is used in each memory cell, but the present invention is not limited to this example. For example, also in the case of using the memory cell in which a floating gate is employed, the read operation and the write operation described in the above embodiment are executed, whereby a similar effect is obtainable.

The block BLK is, for example, an erase unit of data in the three-dimensional semiconductor memory device, but is not limited thereto. Other erase operations are described in U.S. patent application Ser. No. 13/235,389 entitled "Nonvolatile semiconductor memory device" filed on Sep. 18, 2011, and in U.S. patent application Ser. No. 12/694,690 entitled "Non-volatile semiconductor memory device" filed on Jan. 27, 2010. These patent applications are incorporated by reference herein in their entirety.

It is to be noted that in the present description, "connection" indicates electric connection, and does not exclude, for example, connection via another element. Furthermore, in the present description, "cut-off" indicates that the transistor is in an off state, and does not exclude, for example, a state where a micro current such as a leak current of the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a plurality of blocks, each of the plurality of blocks including a plurality of word lines, each of the plurality of word lines connecting a plurality of memory cells; and
a controller configured to:
program a memory cell connected to a word line of a first block in a first mode, the first mode being one of a single-level cell (SLC) mode, a multi-level cell (MLC) mode, a triple-level cell (TLC) mode, and a quadruple-level cell (QLC) mode;
instruct the nonvolatile memory to execute a dummy read operation in a second mode on the first block, the second mode being different from the first mode and being one of the SLC mode, the MLC mode, the TLC mode, and the QLC mode, wherein, in the dummy read operation, a voltage higher than a ground voltage is applied to each word line of the plurality of word lines included in the first block;
instruct the nonvolatile memory to execute the dummy read operation on a first group of blocks within a first period, the first group of blocks including at least the first block; and
change, on the basis of a remaining time of the first period, a rate indicating the number of blocks to be a target of the dummy read operation per unit time.

2. The memory system according to claim 1, wherein, in the dummy read operation, a memory cell transistor connected to a word line to which the voltage higher than the ground voltage is applied turns on.

3. The memory system according to claim 2, wherein, in the dummy read operation, data stored in the memory cell transistor that turns on is not output to the controller.

4. The memory system according to claim 1, wherein the controller is further configured to manage an address conversion table to convert a logical address associated with data stored in the nonvolatile memory into a physical address of the nonvolatile memory, and
the first block stores at least one piece of valid user data or the address conversion table.

5. The memory system according to claim 4, wherein the controller is configured to instruct the nonvolatile memory to execute the dummy read operation on the first block at a startup of the memory system.

6. The memory system according to claim 1, wherein the controller is configured to determine the first period on the basis of temperature of the memory system.

7. The memory system according to claim 1, wherein the controller is configured to:
instruct the nonvolatile memory to perform the dummy read operation after power begins to be supplied to the memory system before data is read out from the first block to the controller, wherein, in the dummy read operation, the nonvolatile memory applies a voltage to a first word line of the first block and does not output, to the controller, data stored in a memory cell connected to the first word line; and
instruct the nonvolatile memory to perform the dummy read operation again within a first period after instructing the nonvolatile memory to perform the dummy read operation.

8. The memory system according to claim 7, wherein, within the first period after the dummy read operation is instructed to the nonvolatile memory, the first word line is in a first state in which a voltage of the first word line while the first block is not selected as an access target is higher than a first voltage.

9. The memory system according to claim 7, wherein the plurality of word lines are stacked in a thickness direction of the nonvolatile memory,
the plurality of memory cells are deployed in three dimensions, and
the first word line is located at the outermost of the first block.

10. A method of controlling a nonvolatile memory including a plurality of blocks, each of the plurality of blocks including a plurality of word lines, each of the plurality of word lines connecting a plurality of memory cells, the method comprising:
programming a memory cell connected to a word line of a first block in a first mode, the first mode being one of a single-level cell (SLC) mode, a multi-level cell (MLC) mode, a triple-level cell (TLC) mode, and a quadruple-level cell (QLC) mode;
instructing the nonvolatile memory to execute a dummy read operation in a second mode on the first block, the second mode being different from the first mode and being one of the SLC mode, the MLC mode, the TLC mode, and the QLC mode, wherein, in the dummy read operation, a voltage higher than a ground voltage is applied to each word line of the plurality of word lines included in the first block;
instructing the nonvolatile memory to execute the dummy read operation on a first group of blocks within a first period, the first group of blocks including at least the first block; and
changing, on the basis of a remaining time of the first period, a rate indicating the number of blocks to be a target of the dummy read operation per unit time.

11. The method of claim 10, wherein a memory cell transistor connected to a word line to which the voltage higher than the ground voltage is applied turns on in the dummy read operation.

12. The method of claim 11, wherein data stored in the memory cell transistor that turns on is not output from the nonvolatile memory in the dummy read operation.

13. The method of claim 10, further comprising:
managing an address conversion table to convert a logical address associated with data stored in the nonvolatile memory into a physical address of the nonvolatile memory, wherein
the first block stores at least one piece of valid user data or the address conversion table.

14. The method of claim 13, further comprising:
instructing the nonvolatile memory to execute the dummy read operation on the first block at a startup of the memory system.

15. The method of claim 10, further comprising:
determining the first period on the basis of temperature of the memory system.

16. The method of claim 10, further comprising:
instructing the nonvolatile memory to perform the dummy read operation after power begins to be supplied to the nonvolatile memory before data is read out from the first block; and
instructing the nonvolatile memory to perform the dummy read operation again within a first period after instructing the nonvolatile memory to perform the dummy read operation, wherein, in the dummy read operation, the nonvolatile memory applies a voltage to a first word line of the first block and does not output data stored in a memory cell connected to the first word line.

17. The method of claim 16, wherein,
within the first period after the dummy read operation is instructed to the nonvolatile memory, the first word line is in a first state in which a voltage of the first word line while the first block is not selected as an access target is higher than a first voltage.

18. The method of claim 16, wherein
the plurality of word lines are stacked in a thickness direction of the nonvolatile memory,
the plurality of memory cells are deployed in three dimensions, and
the first word line is located at the outermost of the first block.

* * * * *

UNITED STATES PATENT AND TRADEMARK OFFICE
CERTIFICATE OF CORRECTION

| | | |
|---|---|---|
| PATENT NO. | : 11,348,934 B2 | Page 1 of 1 |
| APPLICATION NO. | : 17/182879 | |
| DATED | : May 31, 2022 | |
| INVENTOR(S) | : Takehiko Amaki et al. | |

It is certified that error appears in the above-identified patent and that said Letters Patent is hereby corrected as shown below:

On the Title Page

Item (71), the Applicant's name is incorrect. Item (71) should read:
-- (71) Applicant: Kioxia Corporation, Tokyo (JP) --

Signed and Sealed this
Second Day of August, 2022

Katherine Kelly Vidal
*Director of the United States Patent and Trademark Office*